US008581333B2

(12) United States Patent
Takeuchi

(10) Patent No.: US 8,581,333 B2
(45) Date of Patent: Nov. 12, 2013

(54) SEMICONDUCTOR DEVICE AND METHOD FOR MANUFACTURING THE SAME

(75) Inventor: Kiyoshi Takeuchi, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 438 days.

(21) Appl. No.: 12/922,316

(22) PCT Filed: Mar. 27, 2009

(86) PCT No.: PCT/JP2009/056331
§ 371 (c)(1),
(2), (4) Date: Sep. 13, 2010

(87) PCT Pub. No.: WO2009/128337
PCT Pub. Date: Oct. 22, 2009

(65) Prior Publication Data
US 2011/0018056 A1  Jan. 27, 2011

(30) Foreign Application Priority Data

Apr. 16, 2008   (JP) ................................. 2008-107011

(51) Int. Cl.
*H01L 29/66* (2006.01)
(52) U.S. Cl.
USPC .................. 257/329; 257/331; 257/E29.131; 257/E21.629; 438/268
(58) Field of Classification Search
USPC .................. 257/329, 331, E29.131, E21.629; 438/268
See application file for complete search history.

(56) References Cited

U.S. PATENT DOCUMENTS

| 5,258,635 A | 11/1993 | Nitayama et al. |
| 7,115,476 B1 | 10/2006 | Izumida |
| 2002/0027802 A1 | 3/2002 | Noble |
| 2004/0113207 A1 | 6/2004 | Hsu et al. |
| 2007/0007601 A1 | 1/2007 | Hsu et al. |
| 2011/0024828 A1* | 2/2011 | Takeuchi ...................... 257/329 |

FOREIGN PATENT DOCUMENTS

| JP | 1-79482 A | 3/1989 |
| JP | 2-156664 A | 6/1990 |
| JP | 6-69441 A | 3/1994 |
| JP | 7-99311 A | 4/1995 |
| JP | 8-88328 A | 4/1996 |
| JP | 8-241931 A | 9/1996 |
| JP | 9-232447 A | 9/1997 |
| JP | 10-79482 | 3/1998 |
| JP | 3065577 B | 7/2000 |

(Continued)

OTHER PUBLICATIONS

International Search Report for PCT/JP2009/056331 mailed Jun. 23, 2009.

*Primary Examiner* — Kenneth Parker
*Assistant Examiner* — Jose R Diaz
(74) *Attorney, Agent, or Firm* — McGinn IP Law Group, PLLC

(57) ABSTRACT

A first local wiring includes a convex portion protruding from a base and a protrusion protruding from a side surface of the convex portion. The convex portion of the first local wiring is connected to a lower conductive region of a first transistor while the protrusion is connected to a gate electrode of a second transistor. Moreover, the lower surface of the protrusion of the first local wiring is arranged at a height equal to or lower than the upper surface of the gate electrode of the second transistor.

18 Claims, 41 Drawing Sheets

(56) References Cited

FOREIGN PATENT DOCUMENTS

| | | |
|---|---|---|
| JP | 2002506575 A | 2/2002 |
| JP | 2002158350 A | 5/2002 |
| JP | 2002217315 A | 8/2002 |
| JP | 2003068883 A | 3/2003 |
| JP | 2003142684 A | 5/2003 |
| JP | 2003224211 A | 8/2003 |
| JP | 2004128448 A | 4/2004 |
| JP | 2004193588 A | 7/2004 |
| JP | 2004319808 A | 11/2004 |
| JP | 2004356469 A | 12/2004 |
| JP | 2006310651 A | 11/2006 |
| JP | 2007289933 A | 11/2007 |
| WO | 2009060934 A | 5/2009 |

\* cited by examiner

A-A' cross section

B-B' cross section

C-C' cross section

A-A' cross section

B-B' cross section

C-C' cross section

A-A' cross section

B-B' cross section

C-C' cross section

A-A' cross section

B-B' cross section

C-C' cross section

A-A' cross section

B-B' cross section

C-C' cross section

A-A' cross section

A-A' cross section

A-A' cross section

A-A' cross section

A-A' cross section

A-A' cross section

B-B' cross section

C-C' cross section

A-A' cross section

B-B' cross section

A-A' cross section

B-B' cross section

B-B' cross section

A-A' cross section

SEMICONDUCTOR DEVICE AND METHOD FOR MANUFACTURING THE SAME

FIELD OF THE INVENTION

The invention relate to a semiconductor device including a local wiring having a special structure and a method for manufacturing the same.

DESCRIPTION OF THE RELATED ART

Conventionally, a semiconductor device has been used which includes a plurality of MIS-type field effect transistors (hereinafter, it is also simply referred to as "transistors"). As miniaturization is required for the semiconductor device, a size of the transistor is reduced to improve a degree of integration and a performance at the same time. Recently, as the miniaturization has been rapidly advanced, the miniaturization has been developed to such a level that a film thickness of a gate insulating film of the transistor is 2 nm or less and a gate length thereof is 50 nm or less. Accordingly, the miniaturization method of simply downsizing each part of the transistor encounters difficulties due to increase in leakage current and increase in variation of characteristics. In addition, there is a limit to the miniaturization because a related planar-type transistor in which a channel region is formed close to a surface of a substrate has a great area of occupancy.

Accordingly, as means for solving the problems to miniaturize the semiconductor device, a technology has been examined which uses a so-called vertical transistor including a lower impurity diffusion region, a semiconductor region and an upper impurity diffusion region in order thereof. In the related planar-type transistor, channel current flows in parallel with a surface direction of a substrate. On the other hand, the vertical transistor has the characteristics that the channel current flows in a direction (vertical direction) perpendicular to the surface of the substrate. In addition, the vertical transistor has a merit that an area of occupancy thereof can be reduced, compared to the planar-type transistor.

JP-A Nos. 06-069441, 07-099311, 08-088328, 09-232447, 10-079482 and 2003-224211 disclose a semiconductor device including vertical transistors.

However, even when the vertical transistors are used, there is a limit to miniaturization of areas of occupancy of the lower impurity diffusion region, the semiconductor region and the upper impurity diffusion region because there are limitations on lithography technology, film formation technology and the like. Due to this, in order to further develop the miniaturization in a semiconductor device including a plurality of transistors, it is required to miniaturize areas of occupancy of wirings necessary for electrical connections between the transistors as well as areas of occupancy of the lower impurity diffusion region, the semiconductor region and the upper impurity diffusion region.

SUMMARY

Herein, in a semiconductor device including a related planar-type transistor, a wiring layer made of low-resistance metal such as aluminum and copper is arranged above the transistor. That is, since high temperature treatment is performed in a process of forming a transistor, if a transistor is formed after forming the wiring layer, the low-resistance metal of the wiring layer cannot endure the high temperature during the formation of the transistor and is thus deteriorated. Due to this, it is necessary to form the wiring layer after forming the transistor. In the planar-type transistor, a source, a drain and a gate electrode are electrically connected to the upper wiring layer via contact plugs that extend in a direction perpendicular to a surface of a substrate.

On the other hand, in the vertical transistor, one of the source and the drain is located at a lower side as a lower impurity diffusion region. Due to this, this leads to the problem with regard to how to electrically connect the lower impurity diffusion region and the wiring above the transistor.

Herein, in the vertical transistor, a semiconductor region that becomes a channel region under ON state and an upper impurity diffusion region are formed on the lower impurity diffusion region. Due to this, in the vertical transistor, it is impossible to provide a contact plug just above the lower impurity diffusion region, thereby electrically connecting the lower impurity diffusion region to the upper wiring layer, like the planar-type transistor.

Regarding the above, a method for electrically connecting the lower impurity diffusion region and the wiring layer is shown in FIGS. 1A and 1B. FIG. 1A is a plan view showing a connection portion of a lower impurity diffusion region and a wiring layer and FIG. 1B is a sectional view taken along a line A-A' of FIG. 1A. As illustrated in FIGS. 1A and 1B, a lower impurity diffusion region is extended in a plane direction of a substrate and the extension portion can be electrically connected to an upper wiring layer via contact plugs. When this method is used, it is required an extra area so as to electrically connect the lower impurity diffusion region to the contact plugs. Due to this, an area of occupancy is increased, which is unfavorable to the miniaturization.

Another method for electrically connecting a lower impurity diffusion region and a wiring layer is shown in FIGS. 42A and 42B. FIG. 42A is a plan view showing a connection portion of a lower impurity diffusion region and a wiring layer and FIG. 42B is a sectional view taken along a line A-A' of FIG. 42A. As illustrated in FIGS. 42A and 42B, according to this method, the wiring layer is arranged below a vertical transistor. JP-A Nos. 06-069441, 07-099311, 08-088328, 09-232447 and 10-079482 disclose a semiconductor device in which a wiring layer is arranged below a vertical transistor. According to this method, it is not necessary to extend a lower impurity diffusion region and thus to electrically connect the extended lower impurity diffusion region to the upper wiring layer, which is favorable to the miniaturization.

However, as described above, the wiring layer arranged below the vertical transistor is exposed to high temperatures during the formation process of the vertical transistor. Due to this, it is necessary to use refractory metal or material that can be used in high temperatures such as silicon, as the material for the wiring layer. In addition, when the wiring layer is formed of such the materials, there is the problem that a resistance of the wiring is remarkably increased, compared to the wiring layer of aluminum or copper.

Furthermore, as the method for electrically connecting the lower impurity diffusion region of the vertical transistor and the wiring layer, there is a method for separately forming a substrate comprising a wiring layer and a substrate which includes a vertical transistor and then bonding these substrates to each other. However, according to this method, there is the problem that processing precision is low, so that the high-integration is difficult and the manufacturing process is prolonged.

The invention has been made to solve the above problems. An object of the invention is to provide a miniaturized semiconductor device in which an area of occupancy of wirings electrically connecting vertical transistors is decreased.

According to an exemplary embodiment of the invention, there is provided a semiconductor device comprising at least a first transistor, a second transistor and a first local wiring, wherein each of the first and second transistors comprises:

a pillar made of semiconductor protruding from a surface of a base;

a lower conductive region being one of a source and a drain provided in the base;

an upper conductive region being the other of the source and the drain provided in an upper portion of the pillar;

a gate electrode provided on a side surface of the pillar; and a gate insulating film interposed between the gate electrode and the pillar, wherein the first local wiring comprises:

a convex portion protruding from the surface of the base; and a protrusion protruding from a side surface of the convex portion, wherein the convex portion of the first local wiring is connected to the lower conductive region of the first transistor, the protrusion of the first local wiring is connected to the gate electrode of the second transistor, and a lower surface of the protrusion of the first local wiring is arranged at a height equal to or lower than an upper surface of the gate electrode of the second transistor.

According to another exemplary embodiment of the invention, there is provided a method for manufacturing a semiconductor device including at least a first transistor, a second transistor and a first local wiring, the method comprising:

(1) forming the first and second transistors, each of the first and second transistors comprising:

a pillar made of semiconductor protruding from a surface of a base;

a lower conductive region being one of a source and a drain provided in the base;

an upper conductive region being the other of the source and the drain provided in an upper portion of the pillar;

a gate electrode provided on a side surface of the pillar; and a gate insulating film interposed between the gate electrode and the pillar; and (2) forming a first local wiring comprising:

a convex portion protruding from the surface of the base; and a protrusion protruding from a side surface of the convex portion, wherein the convex portion is connected to the lower conductive region of the first transistor, the protrusion is connected to the gate electrode of the second transistor, and a lower surface of the protrusion is arranged at a height equal to or lower than an upper surface of the gate electrode of the second transistor.

As the semiconductor device is constituted by the vertical transistors, an area of occupancy of the transistors can be reduced. In addition, the lower conductive region of the first transistor and the gate electrode of the second transistor are directly electrically-connected by the first local wiring without using a contact plug and an upper layer wiring. Thereby, it is possible to reduce an area that is required for electrical connection of the vertical transistors. In addition, it is possible to provide a semiconductor device that has a high degree of integration and can be manufactured by a simple manufacturing process.

Furthermore, the lower surface of the protrusion of the first local wiring is arranged at a height equal to or lower than the upper surface of the gate electrode of the second transistor. Due to this, compared to a case where a wiring having a lower surface arranged at a height higher than an upper surface of a gate electrode is used, the high densification can be made. In particular, except a case where the lower conductive region below the gate electrode and the first local wiring should be insulated, it is possible to form the first local wiring in a single lithography process. In addition, since the height of the first local wiring can be lowered, it is possible to suppress an increase in height of the upper wiring due to the first local wiring.

BRIEF DESCRIPTIONS OF THE DRAWINGS

DESCRIPTIONS OF REFERENCE NUMERALS

Figure 1A:
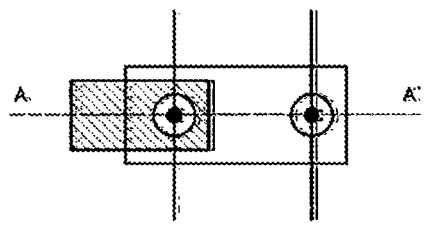
FIG. 1A shows a structure of a related vertical transistor.
Figure 1B:
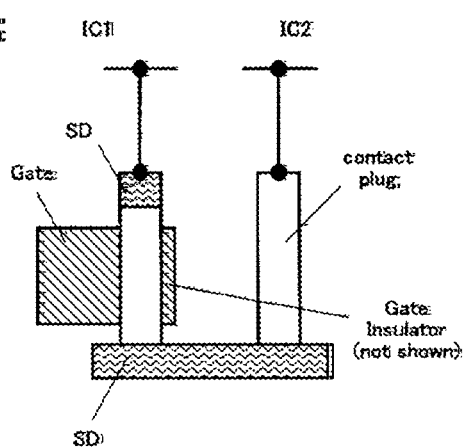
FIG. 1B shows a structure of a related vertical transistor.
Figure 42A:
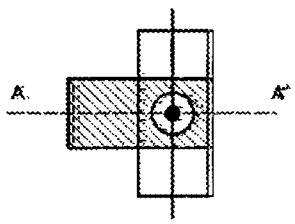
FIG. 42A shows a structure of a related vertical transistor.
Figure 42B:
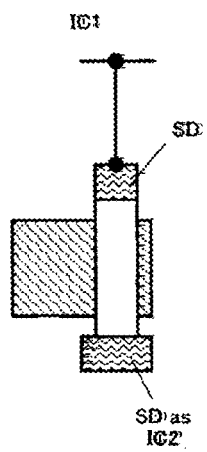
FIG. 42B shows a structure of a related vertical transistor.

Acc-1, Acc-2: access transistor
Drv-1, Drv-2: driver transistor
Load-1, Load-2: load transistor
nSD: N-type source and drain
pSD: P-type source and drain
STI: element isolation insulator
LI: wiring
IC: wiring
BOX: buried insulator
SD1: first connection base
SD2: second connection base
Gate: gate electrode
1: first inverter
2: second inverter
3, 4, 14: lower conductive region, connection base 5: second connection gate electrode
7: first connection gate electrode
6: first local wiring
8: contact plug
9, 13: wiring
11a, 11b: third inverter
12: first transistor
13: second transistor
14: substrate
15: upper surface of gate electrode
17: surface of base
18: pillar
19: convex portion
20: protrusion
21: upper conductive region
22: lower surface of local wiring
23: upper surface of local wiring
27: first conductive type semiconductor region
28: second conductive type semiconductor region
29: silicide layer

DETAILED DESCRIPTION OF THE PREFERRED EMBODIMENTS

A semiconductor device includes a first transistor, a second transistor and a first local wiring. The first and second transistors are a field effect transistor that includes a pillar made of semiconductor protruding from a surface of base, a lower conductive region that is one of a source and a drain provided to the base, an upper conductive region that is the other of a source and a drain provided to an upper portion of the pillar, a gate electrode provided on a side surface of the pillar and a gate insulating film interposed between the gate electrode and the pillar. The first and second transistors are formed on a same plane.

Herein, the "base" indicates a specific region in a substrate, which includes at least a part of the lower conductive region of each transistor. The base may be provided as an independent region for each transistor or as a connection base common to a plurality of transistors.

In addition, the first local wiring directly and electrically connects the lower conductive region of the first transistor and the gate electrode of the second transistor. The first local wiring has a convex portion protruding from the base and a protrusion protruding from a side surface of the convex portion. The convex portion is connected to the lower conductive region of the first transistor and the protrusion is connected to the gate electrode of the second transistor. In addition, a lower surface of the protrusion of the first local wiring is arranged at a height equal to or lower than an upper surface of the gate electrode of the second transistor. That is, the lower surface is positioned at a height between a height of the upper surface of the gate electrode with which the protrusion is in contact and the surface of base.

Herein, the "lower surface of the protrusion" of the first local wiring indicates a surface of the protrusion opposed to the surface of base. In addition, the "upper surface" of the gate electrode to which the first local wiring is connected indicates a surface of the gate electrode, which faces toward the same direction as direction to which the surface of the base faces. That is, the "upper surface" of the gate electrode indicates a surface of the gate electrode which faces toward the direction from the surface of base toward an upper side in which the upper conductive region and the like exists. The lower surface of the protrusion of the first local wiring is positioned at a height equal to the upper surface of the gate electrode to which the first local wiring is connected, or is positioned at a closer height to the surface of the base than upper surface of the gate electrode (in other words, the lower surface of the protrusion of the first local wiring is positioned at a height between the upper surface of the gate electrode to which the first local wiring is connected and the surface of base).

In addition, the first local wiring is different from a wiring structure that is electrically connected via a contact plug and an upper layer wiring, in that (a) it directly and electrically connects the lower conductive region and the gate electrode of the transistor and (b) the protrusion has a lower surface arranged at a height equal to or lower than the upper surface of the gate electrode. Such definition is the same as second and third local wirings that will be described below.

Typically, step portions are formed at boundary portions at which electrical connections of the "first local wiring," the "second local wiring" and the "third local wiring" and the gate electrodes are made. For example, in FIGS. 4A, 5, 6A, 7 to 9, 11A, 19A, 23A, 23B, 24A, 24B, 27, 30A, 30B, 31 and 33, the boundary portions are indicated with portions in which the gate electrodes and the wirings are overlapped (in some drawings, the overlapped portions are indicated with a reference numeral 10).

Upper surfaces of the local wirings may be equal to or different from the upper surfaces of the gate electrodes. In addition, the protrusion of each of the "first local wiring," the second local wiring" and the "third local wiring" may have one lower surface or two or more lower surfaces whose heights are different. Meanwhile, a plurality of upper surfaces of the gate electrode having different heights may exist. When the protrusion includes a plurality of lower surfaces having different heights with each other and the gate electrode includes a plurality of upper surfaces having different heights with each other, the structure that "the lower surface of the protrusion is arranged at a height equal to or lower than the upper surface of the gate electrode" indicates that at least one lower surface of the protrusion is arranged at a height equal to or lower than at least one upper surface of the gate electrode. Preferably, all lower surfaces of the protrusion are arranged at a height equal to or lower than an upper surface of the gate electrode that is positioned nearest to the surface of base (i.e., an upper surface having the shortest distance to the surface of base).

The "lower conductive region" and the "upper conductive region" constitute a source and a drain of each transistor. It may be possible that the lower conductive region is a source and the upper conductive region is a drain. Alternatively, it may be possible that the upper conductive region is a source and the lower conductive region is a drain. In addition, the lower conductive region is a semiconductor or conductive region. Typically, the lower conductive region is comprised of semiconductor having contained impurities therein. In the meantime, the whole lower conductive region may be comprised of metal material (metal material means a material whose resistance is generally increased as temperature is increased). Meanwhile, when the whole lower conductive region of a transistor is comprised of metal, the corresponding transistor becomes a transistor having a so-called metal source and a metal drain. In this case, in order to achieve favorable transistor characteristics, it is necessary to select a material in which a work function of the metal constituting the lower conductive region is near at a lower end of a conduction band of semiconductor in a n-type transistor and at an upper end of a valence band of semiconductor in a p-type transistor.

In the semiconductor device, an area of occupancy of electric connection portions can be reduced, compared to a case where the lower conductive region of the first transistor and the gate electrode of the second transistor are connected by a contact plug and an upper layer wiring. In addition, the lower surface of the first local wiring is positioned at a height between the upper surface of the gate electrode, with which the protrusion is in contact, and the surface of base. Due to this, the high-densification can be made, compared to a case where a wiring having a lower surface higher than an upper surface of a gate electrode is used. In particular, except a case where the lower conductive region below the gate electrode and the first local wiring should be insulated, it is possible to form the first local wiring in a single lithography process. In addition, since the height of the first local wiring can be lowered, it is possible to suppress an increase in height of the upper wiring due to the first local wiring.

FIGS. 35 to 37, 39 and 40 show an exemplary embodiment of a semiconductor device of the invention. In the meantime, FIG. 35A is a plan view of a semiconductor device and FIGS. 35B, 36A, 36B, 37A and 37B are sectional views taken along a line A-A' in a part surrounded by dotted lines of the semiconductor device of FIG. 35A.

Figure 35A:
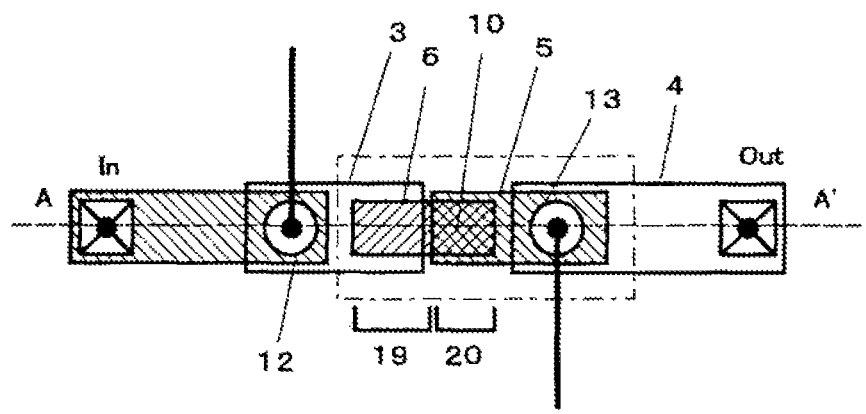
FIG. 35A shows an exemplary embodiment of a semiconductor device of the invention.

As illustrated in FIG. 35A, the semiconductor device includes first transistor 12 and second transistor 13. Lower conductive region 3 of first transistor 12 is electrically connected to gate electrode 5 of second transistor 13 by first local wiring 6.

Figure 35B:
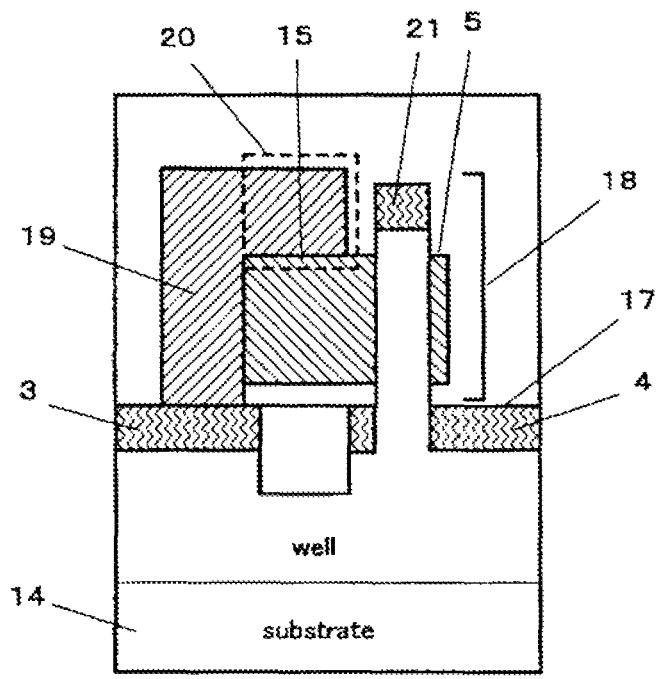
FIG. 35B shows an exemplary embodiment of a semiconductor device of the invention.

In addition, as illustrated in FIG. 35B, the first and second transistors include pillar 18 made of semiconductor protruding from surface of base 17. Gate electrode 5 of second transistor 13 includes upper surface 15 facing the same direction as surface of base 17 of second transistor 13. In addition, first local wiring 6 has convex portion 19 that is in contact with lower conductive region 3 of the first transistor and protrusion 20 (portion surrounded by dotted lines in FIG. 35B) that protrudes from a side surface of convex portion 19 and contacts gate electrode 5 of the second transistor.

In addition, protrusion 20 has a lower surface that is opposed to surface of base 17. In FIG. 35B, the lower surface is in contact with the upper surface of gate electrode 5 and is surface positioned at the same height as the upper surface. In addition, a side surface of gate electrode 5 is in contact with a side surface of convex portion 19. As illustrated in FIG. 35B, the lower surface of protrusion 20 of the first local wiring is arranged at a height equal to or lower than upper surface 15 of gate electrode 5 with which the protrusion is in contact. In other words, the lower surface of protrusion 20 is positioned at a height between a height of upper surface 15 of gate electrode 5 and surface of base 17. The lower surface may be one or plural.

In the followings, another aspect of electrically connecting the first local wiring and the gate electrode of the second transistor is shown in FIGS. 36, 37, 39 and 40. In the following drawings, descriptions of each part will be omitted. FIG. 36A shows a semiconductor device in which a side surface of convex portion 19 of the first local wiring is out of contacted with a side surface of gate electrode 5 and only lower surface 22 of the first local wiring is in contact with upper surface 15 of gate electrode 5. In this semiconductor device, lower surface 22 is surface positioned at the same height as upper surface 15 of gate electrode 5.

Figure 36A:
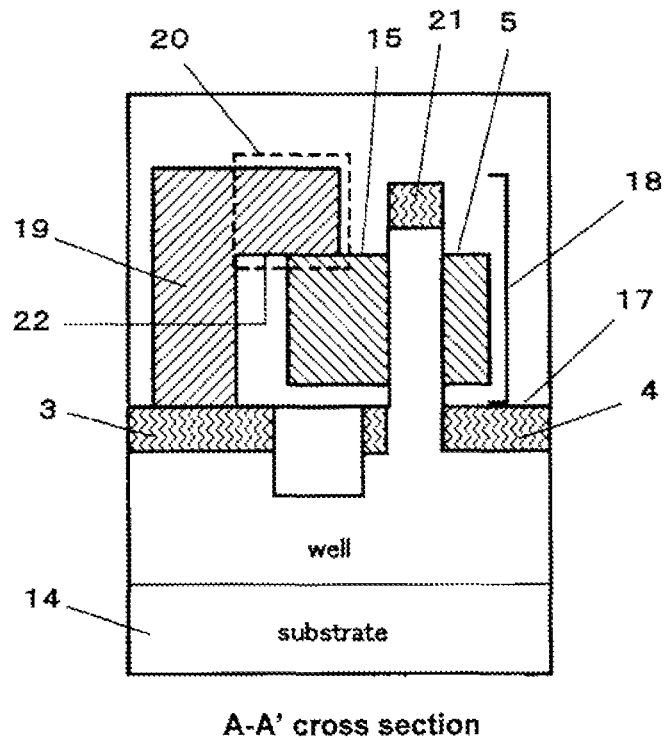
FIG. 36A shows an exemplary embodiment of a semiconductor device of the invention.
Figure 36B:
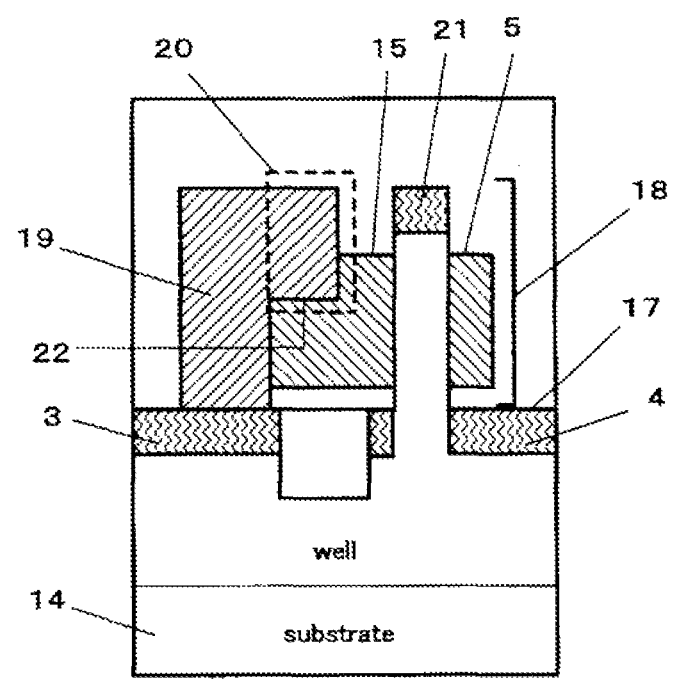
FIG. 36B shows an exemplary embodiment of a semiconductor device of the invention.

FIG. 36B shows a semiconductor device in which a side surface of convex portion 19 and lower surface 22 of protrusion 20 of the first local wiring are in contact with gate electrode 5 but lower surface 22 of protrusion 20 is positioned at a height closer to surface of base 17, which is lower than upper surface 15 of gate electrode 5.

Figure 37A:
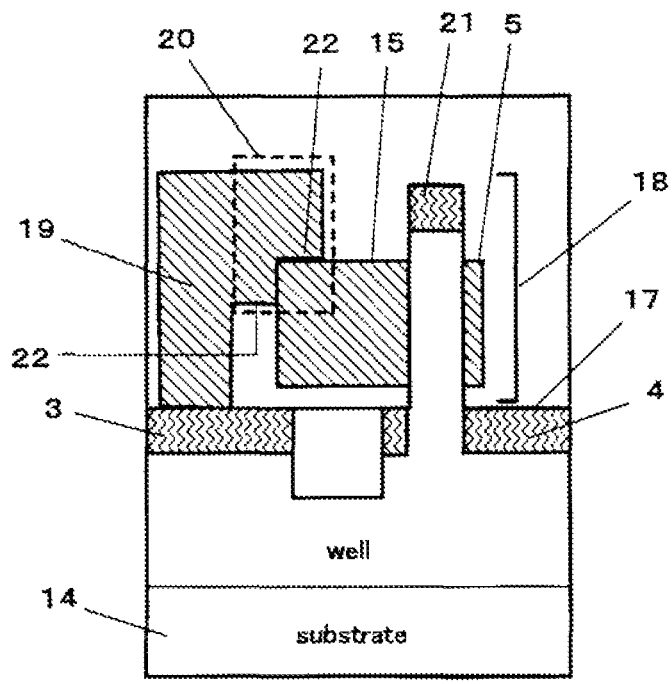
FIG. 37A shows an exemplary embodiment of a semiconductor device of the invention.

FIG. 37A shows a semiconductor device in which protrusion 20 of the first local wiring has two lower surfaces 22 and one lower surface 22 is in contact with upper surface 15 of gate electrode 5. In this semiconductor device, one of lower surfaces 22 is positioned at the same height as upper surface 15 of gate electrode 5. The other of lower surfaces 22 is lower than upper surface 15 of gate electrode 5 and is positioned closer to surface of base 17 than upper surface 15.

Figure 37B:
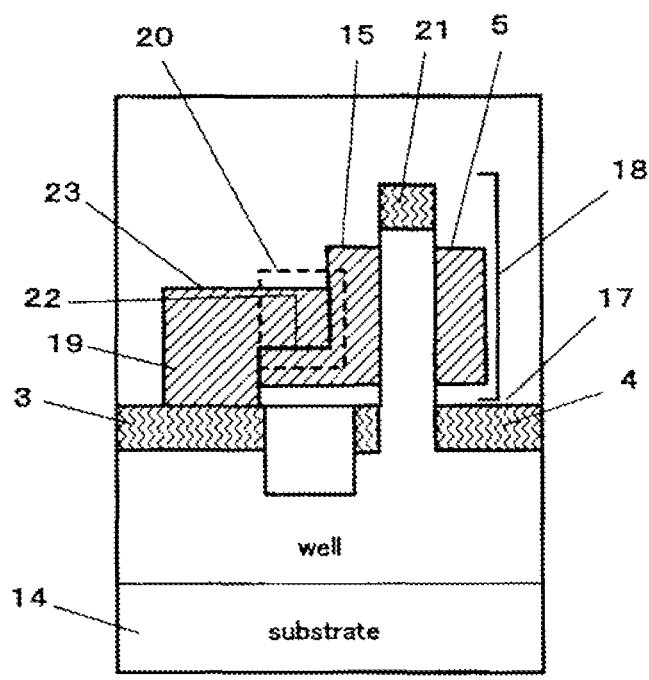
FIG. 37B shows an exemplary embodiment of a semiconductor device of the invention.

FIG. 37B shows a semiconductor device in which a side surface of convex portion 19 and lower surface 22 of protrusion 20 of the first local wiring are in contact with gate electrode 5 but the whole of the first local wiring is lower than upper surface 15 of gate electrode 5 and is positioned closer to surface of base 17 than upper surface 15. In this semiconductor device, lower surface 22 is lower than upper surface 15 of gate electrode 5 and is positioned closer to surface of base 17 than upper surface 15. In addition, upper surface 23 of the first local wiring is lower than upper surface 15 of gate electrode 5 and is positioned closer to surface of base 17 than upper surface 15.

Figure 39A:
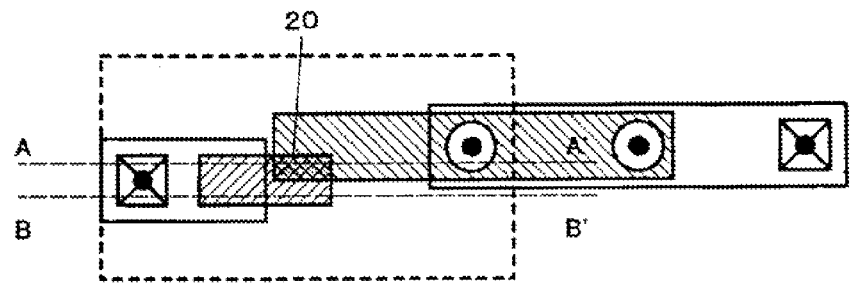
FIG. 39A shows an exemplary embodiment of a semiconductor device of the invention.
Figure 39B:
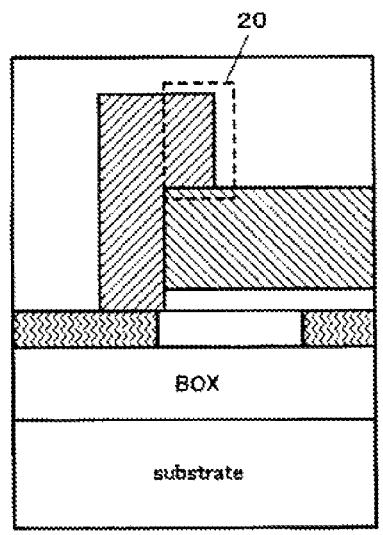
FIG. 39B shows an exemplary embodiment of a semiconductor device of the invention.
Figure 39C:
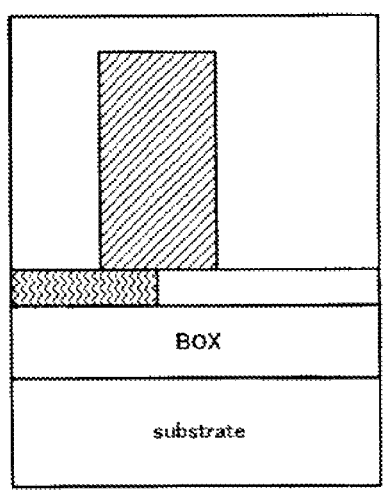
FIG. 39C shows an exemplary embodiment of a semiconductor device of the invention.

FIG. 39 shows another exemplary embodiment of a semiconductor device of the invention. FIG. 39A is a plan view of the semiconductor device and FIGS. 39B and 30C are A-A' and B-B' sectional views of the semiconductor device shown in FIG. 39A, respectively. In the semiconductor device of FIG. 39, the contact portions of the first local wiring and the gate electrode are partially overlapped. In other words, the first local wiring is in contact with the gate electrode at position which differs from a position just above the base and the first local wiring is formed in a single lithography process. Meanwhile, in the sectional view of FIG. 39B, the contact plug connected to the left base and the pillar of the transistor belonging to the right base are omitted. As illustrated in FIG. 39, in this exemplary embodiment, a region in which the gate electrode and the first local wiring are overlapped when seen from the upper side corresponds to the protrusion (reference numeral 20 in FIGS. 39A and 39B). This protrusion is defined by overlap of the gate electrode and the first local wiring. Like this, the protrusion may not necessarily protrude into one direction only.

Figure 40A:
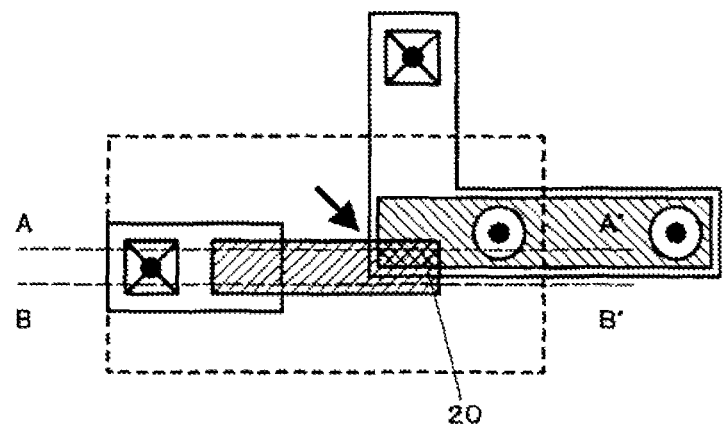
FIG. 40A shows an exemplary embodiment of a semiconductor device of the invention.
Figure 40B:
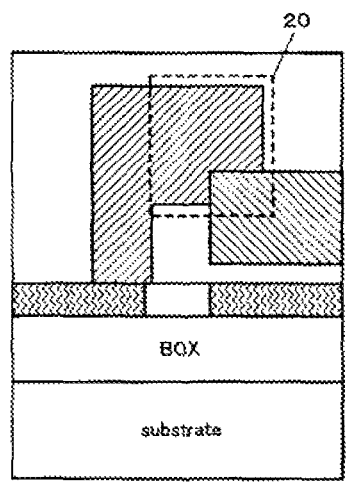
FIG. 40B shows an exemplary embodiment of a semiconductor device of the invention.
Figure 40C:
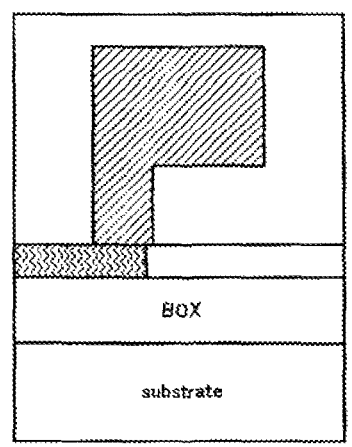
FIG. 40C shows an exemplary embodiment of a semiconductor device of the invention.

FIG. 40 shows another exemplary embodiment of a semiconductor device of the invention. FIG. 40A is a plan view of the semiconductor device and FIGS. 40B and 40C are A-A' and B-B' sectional views of the semiconductor device shown in FIG. 40A, respectively. The first local wiring is in contact with the gate electrode at a position just above the base. The first local wiring is formed in two lithography processes so as to space the first local wiring and the base just below the gate electrode. Meanwhile, in the sectional view of FIG. 40, the contact plug connected to the left base and the pillar of the transistor belonging to the right base are omitted. As illustrated in FIG. 40, in this exemplary embodiment, a region in which the right base and the local wiring are overlapped when seen from the upper side corresponds to about the protrusion (reference numeral 20 in FIGS. 40A and 40B). This region is defined by one of the two lithography processes. In the meantime, the pillar is omitted in FIG. 40B.

The first and second transistors may be n-type transistors or p-type transistors. In addition, the first and second transistors may be transistors of a same conductive type or different conductive types.

In addition, in the above descriptions, the convex portion, the protrusion, the lower surface and the like of the first local wiring have been described. However, in a semiconductor device including second and third local wirings, each of the second and third local wirings also includes a convex portion, a protrusion and a lower surface, like the first local wiring. In addition, the lower surface of the protrusion of each of the second and third local wirings is arranged at a height equal to or lower than the upper surface of the gate electrode to which the protrusion is connected. Furthermore, the second and third local wirings may have the same effects as that of the first local wiring. In the followings, an exemplary embodiment of the invention will be specifically described with reference to the drawings.

1. Inverter Chain

Figure 2:
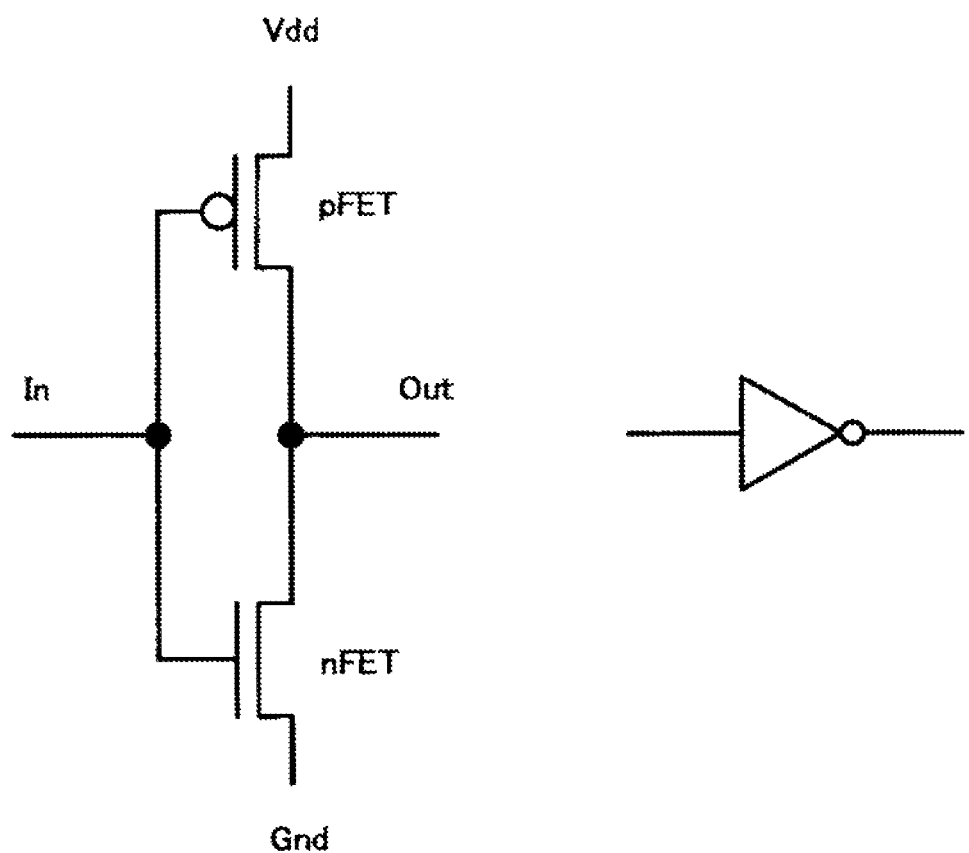
FIG. 2 shows an inverter that is a part of the invention.
Figure 3:
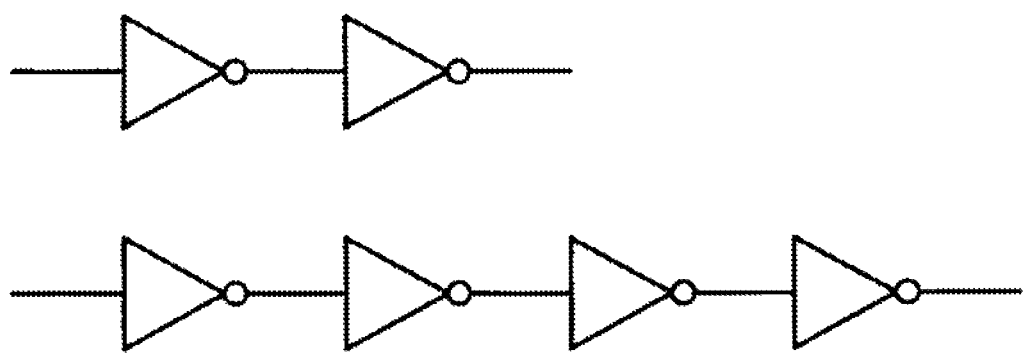
FIG. 3 shows an inverter chain that is an exemplary embodiment of the invention.

An exemplary embodiment of the invention relates to an inverter chain. This inverter chain is comprised of a plurality of inverters shown in FIG. 2, which are arranged as illustrated in FIG. 3, and can be used as a buffer or delay device. In this inverter chain, each inverter includes a p-type vertical transistor and an n-type vertical transistor. Like this, the inverter is constituted by the vertical transistors, so that it is possible to reduce an area of occupancy of the transistors, compared to a case where the planar-type transistors are used. As a result, it is possible to achieve miniaturization.

Each of the vertical transistors is a field effect transistor that includes a pillar, a lower conductive region becoming one of a source and a drain provided to a base, an upper conductive region becoming the other of a source and a drain provided to an upper portion of the pillar, a gate electrode provided on a side surface of the pillar and a gate insulting film interposed between the gate electrode and the pillar. The gate electrodes of the vertical transistors constituting each inverter are commonly made and integrally formed to make a connection gate electrode. Like this, the respective gate electrodes are integrated to make a connection gate electrode, so that it is possible to attempt the high densification.

In the inverter chain, lower conductive regions of first and third transistors and a second connection gate electrode are electrically connected by a first local wiring. A lower surface of a protrusion of the first local wiring is arranged at a height equal to or lower than an upper surface of the second connection gate electrode.

In addition, in the inverter chain including the three inverters, lower conductive regions of second and fourth transistors and a third connection gate electrode are electrically connected by a second local wiring. A lower surface of a protrusion of the second local wiring is arranged at a height equal to or lower than an upper surface of the third connection gate electrode.

The first to sixth transistors are formed on a same plane. The lower conductive region may be any one of a source and a drain. In addition, the upper conductive region may be any one of the source and the drain as long as the upper conductive region is different from the lower conductive region.

The material of the gate insulating film is not particularly limited. For example, a silicon oxide film ($SiO_2$), a silicon nitride film ($Si_3N_4$), a silicon oxynitride film or a stacked film of these films and an oxide including hafnium (Hf) may be exemplified. In addition, for example, a metal oxide, a metal silicate, a high-dielectric insulating film including nitrogen added to the metal oxide or metal silicate may be used as the gate insulating film.

In the meantime, the "high-dielectric insulating film" means an insulating film having a specific dielectric constant higher than $SiO_2$ (its dielectric constant is about 3.6) that is widely used as a gate insulating film in a semiconductor device. Typically, the specific dielectric constant of the high-dielectric insulating film may be several tens to several thousands. For example, HfSiO, HfSiON, HfZrSiO, HfZrSiON, ZrSiO, ZrSiON, HfAlO, HfAlON, HfZrAlO, HfZrAlON, ZrAlO, ZrAlON and the like may be used as the high-dielectric insulating film.

In addition, the gate electrode may be made of conductive poly silicon, metal, silicide or a stacked film thereof, for example. The conductive poly silicon may be obtained by containing impurities in poly silicon. At this time, a concentration of the impurities is preferably $1.0 \times 10^{20} \sim 1.0 \times 10^{21}/cm^3$. In addition, the impurities may be phosphorous, arsenic, boron and the like, for example.

Additionally, it is preferable to use a same metal material as the materials of the gate electrodes. By constituting the gate electrodes with a same metal material, it is possible to easily manufacture the gate electrodes. As the metal material, it is preferable to select a material having a work function that is near to a center of a forbidden band of semiconductor. However, in some cases, a gate electrode for an n-type vertical transistor and a gate electrode for a p-type vertical transistor, which constitute a same inverter, may be made of different materials so as to finely adjust a work function of a gate electrode.

In addition, silicide may be used as the material of the gate electrode. To be more specific, NiSi, $Ni_2Si$, $Ni_3Si$, $NiSi_2$, WSi, $TiSi_2$, $VSi_2$, $CrSi_2$, $ZrSi_2$, $NbSi_2$, $MoSi_2$, $TaSi_2$, CoSi, $CoSi_2$, PtSi, $Pt_2Si$, $Pd_2Si$ and the like may be exemplified as the silicide.

In this exemplary embodiment, the n-type and p-type transistors may be diversely arranged as long as the lower conductive regions of the n-type and p-type transistors constituting one inverter are electrically connected to the connection gate electrode constituting the other inverter by the local wirings. In the followings, specific arrangements of the respective transistors and the wiring structure electrically connecting the respective inverters will be described with reference to exemplary embodiments. In the meantime, it should be noted that the below exemplary embodiments are provided to easily understand the invention and the invention is not limited thereto.

First Exemplary Embodiment

Figure 4A:
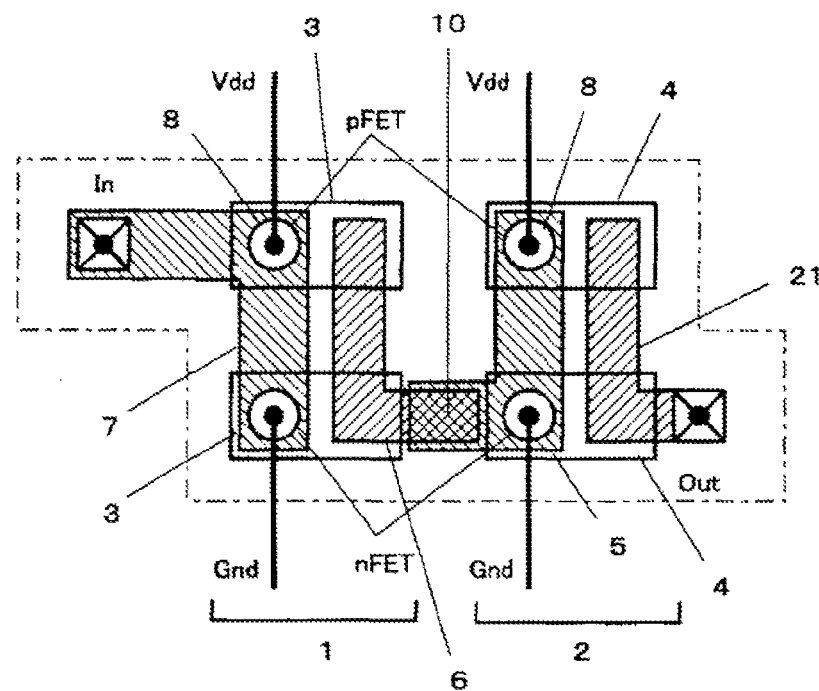
FIG. 4A shows a semiconductor device according to a first exemplary embodiment.

FIG. 4A is a plan view of a two-stage inverter chain constituted by first inverter 1 and second inverter 2. First inverter 1 includes a first n-type transistor (nFET) (which corresponds to a first transistor) and a first p-type transistor (pFET) (which corresponds to a third transistor). In addition, second inverter 2 includes a second n-type transistor (nFET) (which corresponds to a second transistor) and a second p-type transistor (pFET) (which corresponds to a fourth transistor).

Gate electrodes of the first n-type transistor and the first p-type transistor are connected, thereby forming a first connection gate electrode. In addition, gate electrodes of the second n-type transistor and the second p-type transistor are connected, thereby forming a second connection gate electrode. Additionally, a direction from the first n-type transistor toward the first p-type transistor is parallel with a direction from the second n-type transistor toward the second p-type transistor.

In the first exemplary embodiment, lower conductive region 3 of the n-type transistor (nFET) and lower conductive region 3 of the p-type transistor (pFET), which constitute first inverter 1, are spaced with each other, i.e., are not adjacent to each other. In addition, lower conductive region 3 of the n-type transistor and lower conductive region 3 of the p-type transistor, which constitute the first inverter, and second connection gate electrode 5, are electrically connected via first local wiring 6.

First local wiring 6 and second connection gate electrode 5 are electrically connected by portion 10 of FIG. 4A in which a protrusion of the first local wiring and an extension portion (a portion that the gate electrode is extended to a region except an upper side of the lower conductive region) of gate electrode 5 are overlapped. A lower surface of the protrusion of the first local wiring is opposed to the surface of base and is arranged at a height equal to or lower than an upper surface of the second connection gate electrode. In other words, the lower surface of the protrusion of the first local wiring is arranged at a height between the upper surface of second connection gate electrode 5 and the surface of base.

Meanwhile, in FIG. 4A, a square indicates a position of a contact hole. A contact plug electrically connected to the upper conductive region of the transistor is not shown and only the electric connection thereof is indicated by "•". First connection gate electrode 7 and upper conductive region 8 of each transistor are electrically connected to an external wiring via the contact plug. In addition, lower conductive regions 4 of the n-type and p-type transistors of the second inverter are electrically connected to the external wiring via wiring 21 and the contact plug.

Figure 4B:
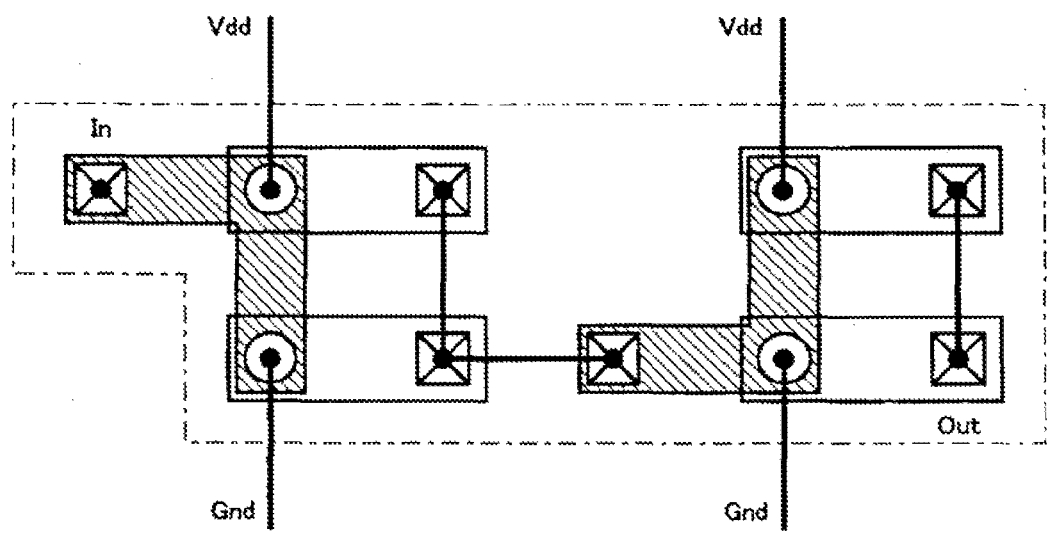
FIG. 4B shows a semiconductor device related to the first exemplary embodiment.

An area of occupancy of the inverter chain of this exemplary embodiment, which is surrounded by a dashed line in FIG. 4A, is $30F^2$ in an ideal case. Compared to this, FIG. 4B shows an example in which an electrical connection between inverters, which is likewise FIG. 4A, is realized by typical contact plug and upper layer wiring without using the first local wiring. An area of occupancy of this arrangement is $44F^2$ in an ideal case.

In FIG. 4B, since all contact holes (which exist at positions of squares and •) connected to the upper layer wiring are simultaneously formed, the contact holes are spaced with each other by a minimum width F. Meanwhile, in FIG. 4A, since first local wiring 6 is formed by a separate process from the upper wiring, it is possible to make the first local wiring be close to the typical contact hole to the maximum. To be more specific, it is possible to make the first local wiring be close to the contact hole to an extra distance Δ (which is typically a one-severalth of F) in which a short circuit due to misalignment is not caused. Due to this, it is possible to reduce the area of occupancy. In the meantime, the ideal case means a case where Δ is zero.

Additionally, in a wiring arrangement related to FIG. 4B, a contact hole and a wiring are formed by separate lithography processes. Meanwhile, in this exemplary embodiment, since the first local wiring can be formed in a single lithography process, it is possible to suppress the number of processes for forming wirings to the minimum. In order to secure a contact with the gate electrode while forming the first local wiring in a single lithography process, the lower surface of the protrusion of first local wiring 6 is arranged at a height equal to or lower than the upper surface of connection gate electrode 5. The structure in which the first local wiring is in contact with at least a part of the side surface of connection gate electrode 5 is preferable to reduce the contact resistance. In addition, in order to achieve such an advantage, the first local wiring is not applied to a wiring that intersects with connection gate electrode 5 above connection gate electrode 5 without contacting connection gate electrode 5.

Furthermore, as another effect that is obtained by applying the first local wiring to the vertical transistor, a decrease in height of a wiring may be exemplified. Since a channel region is vertically extended in the vertical transistor, a distance from the lower conductive region to the upper wiring is apt to be longer, compared to a typical planar-type transistor. As can be seen from FIG. 12B, since the first local wiring is embedded at a side lower than the upper conductive region, it is possible to suppress an increase in height of the upper wiring due to the first local wiring (the upper wiring need to be spaced from the local wiring by a predetermined distance), compared to a planar-type transistor.

The local wiring of this exemplary embodiment also performs a function of electrically connecting the lower conductive region of the n-type transistor and the lower conductive region of the p-type transistor, which are spaced from each other, in addition to a function of connecting an output of an inverter to an input of a next inverter. In other words, it is possible to realize two functions at the same time while suppressing an increase in area.

Second Exemplary Embodiment

Figure 5:
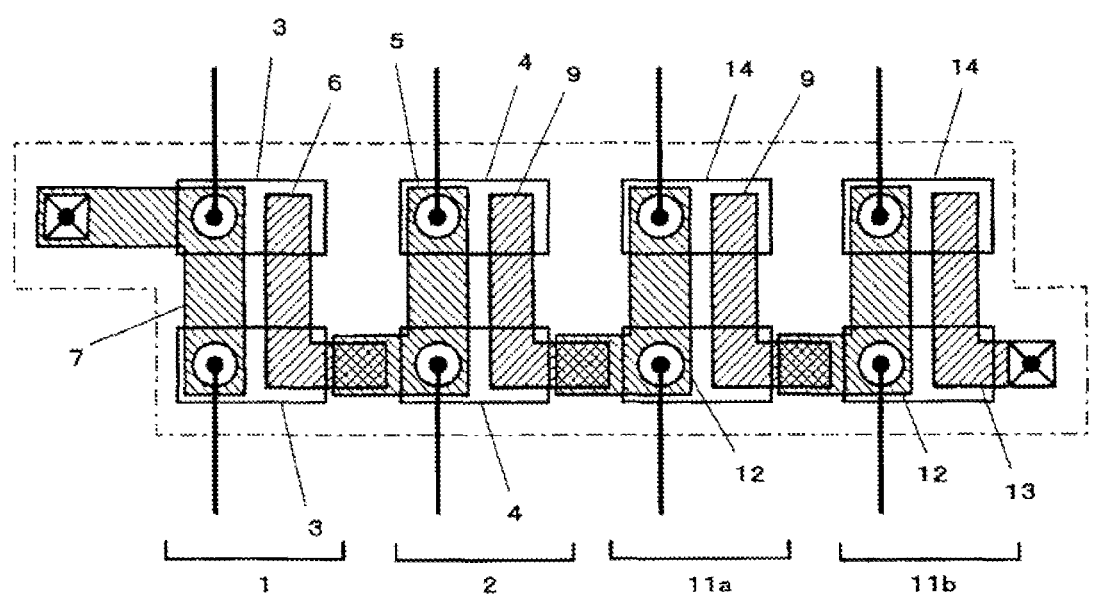
FIG. 5 shows a semiconductor device according to a second exemplary embodiment.

FIG. 5 is a plan view showing a four-stage inverter chain comprised of first inverter 1, second inverter 2 and two third inverters 11a, 11b. Each of third inverters 11a, 11b includes a third n-type transistor (nFET) (which corresponds to a fifth transistor) and a third p-type transistor (pFET) (which corresponds to a sixth transistor). Pillars, upper conductive regions, lower conductive regions, gate electrodes and gate insulating films of the fifth and sixth transistors are same as those of the first to fourth transistors. The gate electrodes of the third n-type transistor and the third p-type transistor are connected, thereby forming a third connection gate electrode.

In the first exemplary embodiment, wiring 21 (wiring 21 can be formed simultaneously with the first local wiring), which electrically connects lower conductive regions 4 of the n-type and p-type transistors constituting second inverter 2, is electrically connected to the external wiring via the contact plug. However, this exemplary embodiment is different from the first exemplary embodiment, in that lower conductive regions 4 of the n-type and p-type transistors are further electrically connected to third connection gate electrode 12 constituting third inverter 11a by second local wiring 9. In addition, third inverter 11a and third inverter 11b are likewise electrically connected via second local wiring 9. Second local wiring 9 has a convex portion and a protrusion like first local wiring 6. In addition, a lower surface of the protrusion is arranged at a height equal to or lower than an upper surface of the third connection gate electrode. In other words, the lower surface of the protrusion is opposed to the surface of base and is arranged at a height between a height of the upper surface of gate electrode 5 and the surface of base. Furthermore, lower conductive regions 14 of the n-type and p-type transistors constituting third inverter 11b are electrically connected to the external wiring via wiring 13 and the contact plugs.

Third Exemplary Embodiment

Figure 6A:
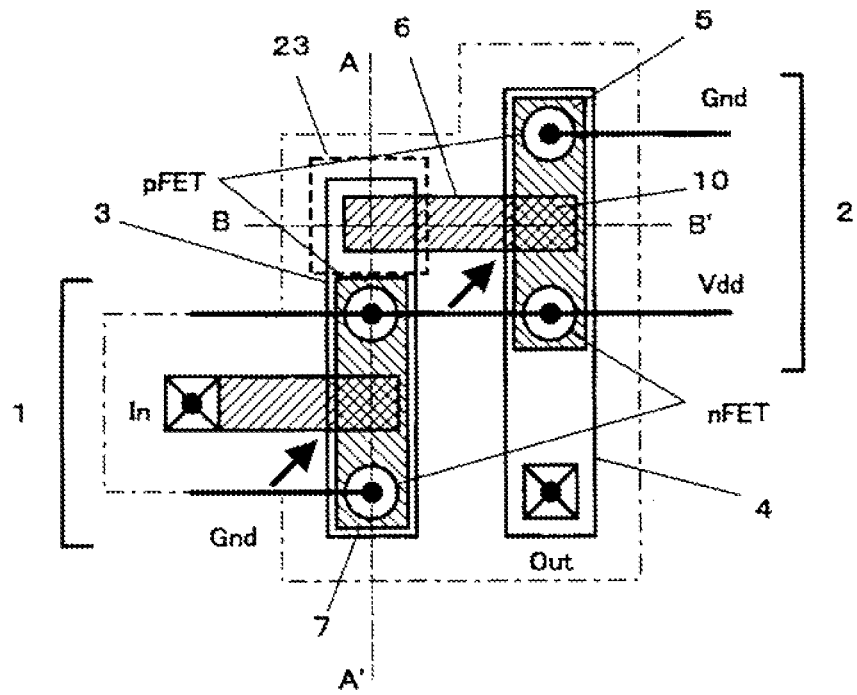
FIG. 6A shows a semiconductor device according to a third exemplary embodiment.

FIG. 6A is a plan view showing a two-stage inverter chain having an arrangement of transistors, which is different from that of the first exemplary embodiment. In this exemplary embodiment, the lower conductive region of the first n-type transistor (nFET) and the lower conductive region of the first p-type transistor (pFET), which constitute first inverter 1, are connected and thus integrally formed, thereby constituting first connection base 3. These lower conductive regions are electrically connected by a silicide layer that is provided on the lower conductive regions by a salicide technique. Likewise, the lower conductive region of the second n-type transistor (nFET) and the lower conductive region of the second p-type transistor (pFET), which constitute second inverter 2, are connected and thus integrally formed, thereby constituting second connection base 4. These lower conductive regions are electrically connected by a silicide layer that is provided on the lower conductive regions by the salicide technique.

Figure 41A:
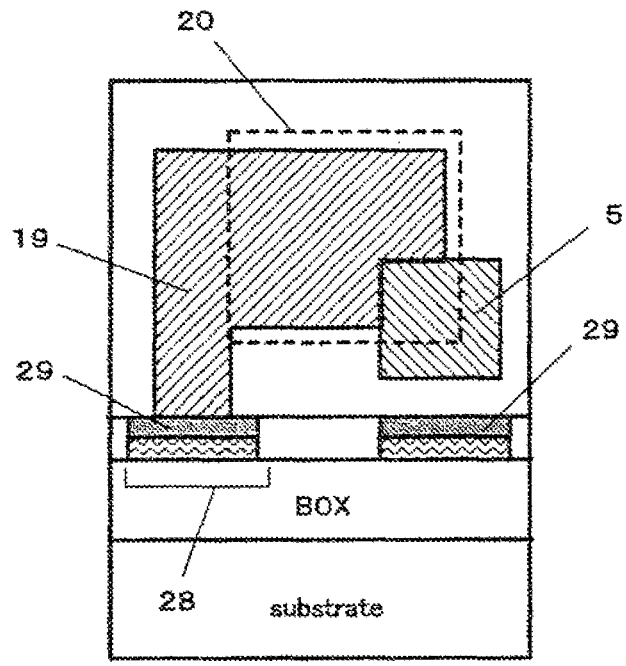
FIG. 41A shows an exemplary embodiment of a semiconductor device of the invention.
Figure 41B:
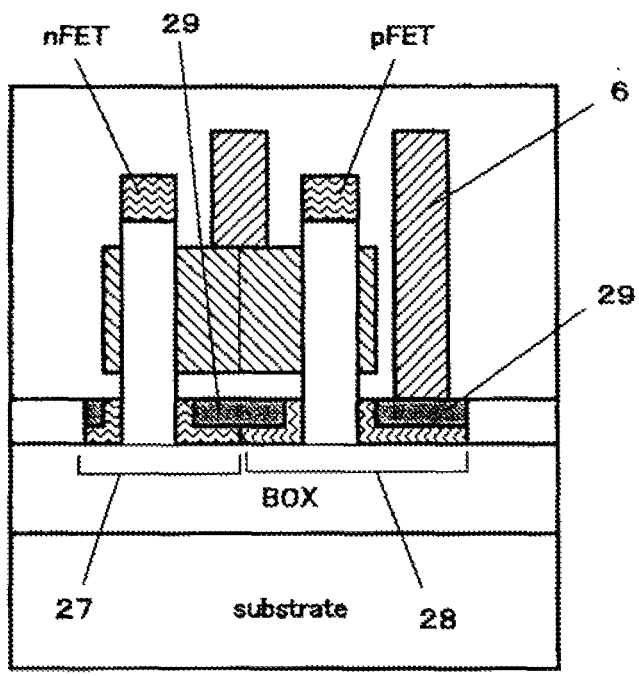
FIG. 41B shows an exemplary embodiment of a semiconductor device of the invention.

In the followings, a structure of the connection base will be specifically described with reference to FIG. 41. FIGS. 41A and 41B are sectional views taken along lines B-B and A-A' of the semiconductor device shown in FIG. 6A, respectively. As illustrated in FIG. 41, first connection base 3 includes first conductive type semiconductor region 27 and second conductive type semiconductor region 28 making a junction with first conductive type semiconductor region 27. In addition, first and second conductive type semiconductor regions 27, 28 form a two-dimensional plane-shape region when seen from an upper side (a direction perpendicular to the surface of base). In first conductive type semiconductor region 27, a pillar of the first n-type transistor is formed. In addition, in second conductive type semiconductor region 28, a pillar of the first p-type transistor is formed. Furthermore, silicide layer 29, which is a metal containing conductive layer, is provided on a region including a boundary of first conductive type semiconductor region 27 and second conductive type semiconductor region 28 of the first connection base, thereby electrically connecting the first and second conductive type semiconductor regions. In other words, an n-type semiconductor region in first conductive type semiconductor region 27 and a p-type semiconductor region in second conductive type semiconductor region 28 are electrically connected via silicide layer 29. In this case, when silicide layer 29 is not provided, a junction between the n-type semiconductor region and the p-type semiconductor region forms a PN diode, thereby exhibiting a rectification characteristic. As a result, the n-type semiconductor region and the p-type semiconductor region are not electrically connected.

In this exemplary embodiment, like the first connection base, the second connection base includes a first conductive type semiconductor region, a second conductive type semiconductor region and a silicide layer, and the first conductive type semiconductor region and the second conductive type semiconductor region are electrically connected. Like this, by providing the first connection base in which the n-type and p-type lower conductive regions are connected and integrated, it is possible to further reduce the area of occupancy.

In the meantime, as the means for connection lower conductive regions 3 of the n-type and p-type transistors, the invention is not limited to the silicide layer. For example, by constituting lower conductive regions 3 with metal materials, respectively, it is possible to electrically connect lower conductive regions 3 adjacent to each other.

In this exemplary embodiment, first connection base 3 includes first base extension portion 23 that extends in a direction from one of the first n-type transistor and the first p-type transistor toward the other of the first n-type transistor and the first p-type transistor. The convex portion of first local wiring 6 is connected to first base extension portion 23.

Additionally, in FIG. 6A, the connection portion of first local wiring 6 and connection gate electrode 5 is shown with portion 10 in which the first local wiring and the connection gate electrode are overlapped. Like this, in this exemplary embodiment, the protrusion of the first local wiring is connected to the second connection gate electrode between the pillar of the second n-type transistor and the pillar of the second p-type transistor, and the first local wiring is spaced and insulated from the second connection base. In the meantime, an arrow in FIG. 6A indicates that first local wiring 6 is connected to connection gate electrode 5 above second connection base 4 and is spaced and insulated from second connection base 4, as illustrated in FIG. 24B later. The effects obtained by using the local wiring are the same as those of a ninth exemplary embodiment that will be described later.

Meanwhile, from a standpoint of symmetry, the protrusion of the first local wiring is preferably connected to the second connection gate electrode at a center point between the pillar of the second n-type transistor and the pillar of the second p-type transistor. Thereby, the distances between the local wirings and the respective transistors are made to be same, so that it is possible to minimize a possibility that a short circuit of the local wiring and the transistor due to misalignment in manufacturing will be generated.

Figure 6B:
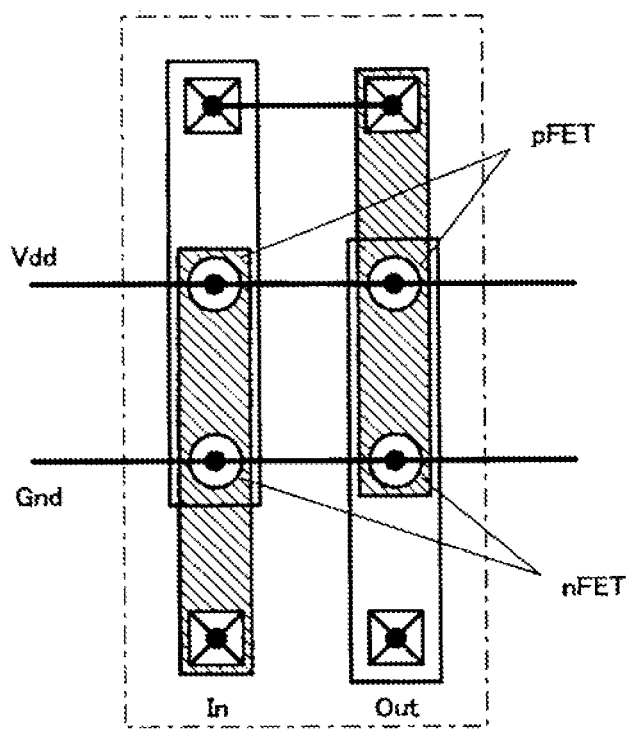
FIG. 6B shows a semiconductor device related to the third exemplary embodiment.

An area of occupancy of the inverter chain according to this exemplary, embodiment, which is surrounded by the dashed line in FIG. 6A, is ideally $26F^2$. Compared to this, FIG. 6B shows an example in which the same electrical connection between inverters as FIG. 6B is made by typical contact plugs and upper layer wirings without using the first local wiring. An area of occupancy in this arrangement is ideally $32F^2$. Like this, according to this exemplary embodiment, each inverter is comprised of the vertical transistors and the first and second inverters are electrically connected by a special wiring arrangement, so that it is possible to realize the miniaturization.

Fourth Exemplary Embodiment

Figure 7:
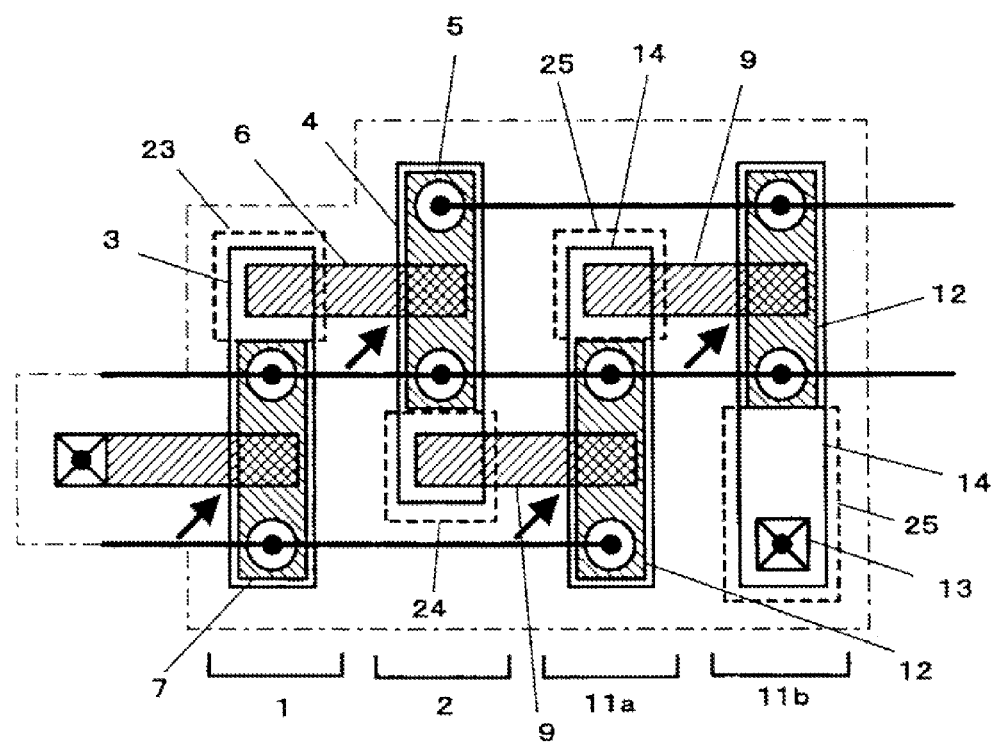
FIG. 7 shows a semiconductor device according to a fourth exemplary embodiment.

FIG. 7 is a plan view of a four-stage inverter chain including first inverter 1, second inverter 2 and two third inverters 1a, 11b. In this exemplary embodiment, lower conductive region 3 of the third n-type transistor (nFET) and lower conductive region 3 of the third p-type transistor (pFET), which constitute third inverters 11a, 11b, are connected and thus integrally formed, thereby constituting a third connection base.

In the third exemplary embodiment, second connection base 4 is electrically connected to the external wiring. However, this exemplary embodiment is different from the third exemplary embodiment, in that second connection base 4 is electrically connected to connection gate electrode 12 of third inverter 11a by second local wiring 9. Likewise, connection base 14 of third inverter 11a and connection gate electrode 12 of third inverter 11b are electrically connected via second local wiring 9. In addition, connection base 14 of third inverter 11b is electrically connected to the external wiring via a contact plug.

In this exemplary embodiment, second connection base 4 includes second base extension portion 24 that extends in a direction opposite to the extension direction of first connection base 3. Likewise, third connection base 14 of third inverter 11a includes base extension portion 25 that extends in a direction opposite to the extension direction of second connection base 4. In addition, third connection base 14 of third inverter 11b includes base extension portion 25 that extends in a direction opposite to the extension direction of third connection base 4 of third inverter 11a. Like this, by providing the base extension portions of the inverters adjacent to each other, which mutually extend in the opposite directions, it is possible to reduce an area of occupancy of the inverters.

In the meantime, from a standpoint of symmetry, the protrusion of the first local wiring is preferably connected to the second connection gate electrode between the pillar of the second n-type transistor and the pillar of the second p-type transistor. In addition, the protrusion of the second local wiring is preferably connected to the third connection gate electrode at a center point between the pillar of the third n-type transistor and the pillar of the third p-type transistor. Thereby, the distances between the local wirings and the respective transistors are made to be same, so that it is possible to minimize a possibility that a short circuit of the local wiring and the transistor due to misalignment in manufacturing will be generated.

Fifth Exemplary Embodiment

Figure 8:
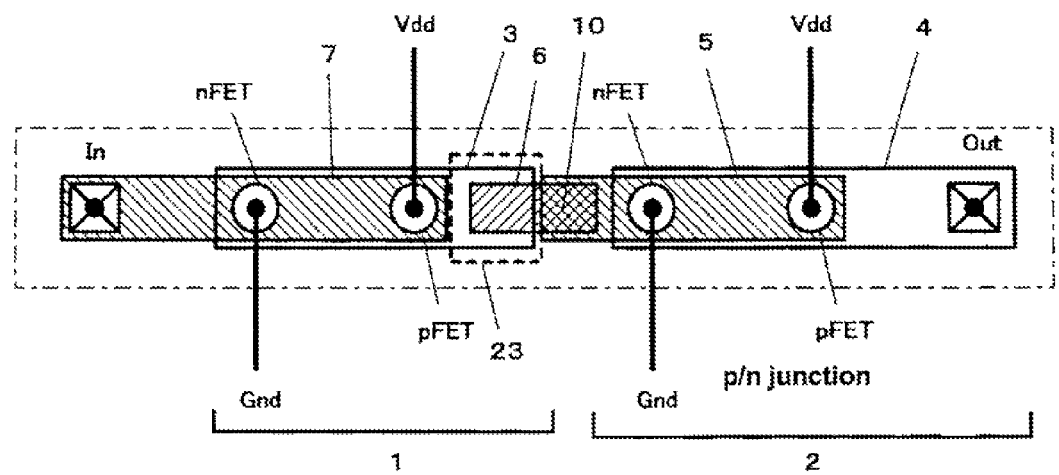
FIG. 8 shows a semiconductor device according to a fifth exemplary embodiment.

FIG. 8 is a plan view of a two-stage inverter chain having an arrangement of transistors, which is different from that of the third exemplary embodiment. In this exemplary embodiment, the lower conductive region of the first n-type transistor (nFET) and the lower conductive region of the first p-type transistor (pFET), which constitute first inverter 1, are connected and thus integrally formed, thereby constituting first connection base 3. These lower conductive regions are electrically connected by a silicide layer formed on the lower conductive regions by the salicide technique as illustrated in FIG. 41 or electrically connected by constituting the lower conducive regions with metal materials.

First connection base 3 includes first base extension portion 23 that extends from one of the first n-type transistor and the first p-type transistor toward the other of the first n-type transistor and the first p-type transistor. The protrusion of the first local wiring is connected to first base extension portion 23. In addition, second connection gate electrode 5 includes a first gate extension portion (a portion that gate electrode 5 is extended to a region except an upper side of second connection base 4) that extends in the connection direction thereof, and the protrusion of the first local wiring is connected to the first gate extension portion. In the meantime, the connection portion of first local wiring 6 and connection gate electrode 5 is indicated in FIG. 8 as portion 10 in which the first local wiring and the gate extension portion are overlapped.

An area of occupancy of the inverter chain according to this exemplary embodiment, which is surrounded by the dashed line of FIG. 8, is ideally $26F^2$. Like this, according to this exemplary embodiment, each inverter is constituted by the vertical transistors and the first and second inverters are electrically connected by a special wiring arrangement, so that it is possible to realize the miniaturization.

Sixth Exemplary Embodiment

Figure 9:
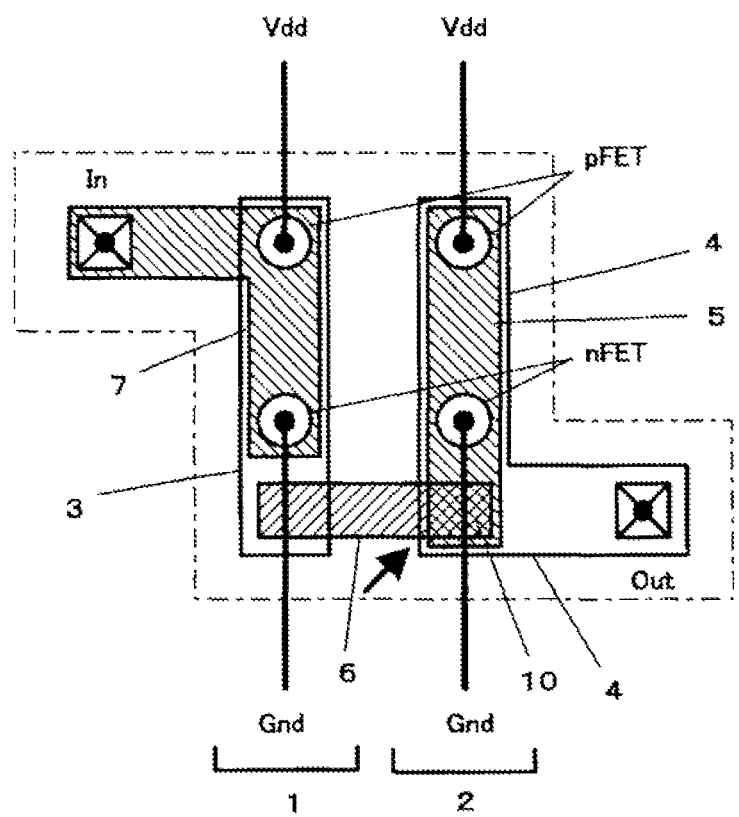
FIG. 9 shows a semiconductor device according to a sixth exemplary embodiment.

FIG. 9 is a plan view of a two-stage inverter chain having an arrangement of transistors, which is different from that of the third exemplary embodiment. In this exemplary embodiment, the lower conductive region of the first n-type transistor (nFET) and the lower conductive region of the first p-type transistor (pFET), which constitute first inverter 1, are connected and thus integrally formed, constituting first connection base 3. These lower conductive regions are electrically connected, likewise the fifth exemplary embodiment. In addition, first connection base 3 is electrically connected to second connection gate electrode 5 by first local wiring 6. In the meantime, the connection portion of first local wiring 6 and connection gate electrode 5 is indicated in FIG. 9 with portion 10 in which the first local wiring and the connection gate electrode are overlapped. In addition, first local wiring 6 is spaced and thus electrically insulated from second connection base 4. The effects obtained by using such the local wiring are the same as those of a ninth exemplary embodiment that will be described later.

An area of occupancy of the inverter chain according to this exemplary embodiment, which is surrounded by the dashed line of FIG. 9, is ideally $28F^2$. Like this, according to this exemplary embodiment, each inverter is constituted by the vertical transistors and the first and second inverters are electrically connected by a special wiring arrangement, so that it is possible to realize the miniaturization As described in the first to sixth exemplary embodiments, the inverter chains of these exemplary embodiments include two or more inverters. The number of inverters constituting the semiconductor device is not particularly limited as long as at least first and second inverters are provided. In other words, the inverter chain may be comprised of three or more inverters by including one or more third inverters, in addition to the first and second inverters.

In addition, as described in the first to sixth exemplary embodiments, the electrical connection between the inverters is made as follows. In other words, the connection gate electrode constituting one inverter is electrically connected to the external wiring via the contact plug. In addition, the lower conductive regions of the n-type and p-type transistors constituting the other one inverter are electrically connected to the external wiring via the contact plugs. Furthermore, the lower conductive regions of the n-type and p-type transistors constituting the inverter, other than the other one inverter, are directly and electrically connected to the connection gate electrode constituting the adjacent inverter via the first and second local wirings without using the contact plug and the external wiring. Due to this, it is possible to reduce an area of occupancy of the wirings connecting the inverters and thus to realize the miniaturization. In addition, the upper conductive regions of the transistors constituting each inverter are electrically connected to the external wiring via the contact plugs.

Meanwhile, in the first to sixth exemplary embodiments, the first n-type transistor is regarded as the first transistor and the first p-type transistor is regarded as the third transistor for convenience' sake. However, it should be understood that the first and third transistors are not limited to the n-type and p-type transistors, respectively. For example, it may be possible that the first n-type transistor is regarded as the third transistor and the first p-type transistor is regarded as the first transistor.

Likewise, the second and fourth transistors are not limited to the n-type and p-type transistors, respectively. For example, it may be possible that the second n-type transistor is regarded as the fourth transistor and the second p-type transistor is regarded as the second transistor. In addition, the fifth and sixth transistors are not limited to the n-type and p-type transistors, respectively. For example, it may be possible that the third n-type transistor is regarded as the sixth transistor and the third p-type transistor is regarded as the fifth transistor.

In the meantime, as the materials of the lower conductive regions, the upper conductive regions, the gate electrodes and the gate insulating films of the fifth and sixth transistors, the same materials as those of the first to fourth transistors may be used.

In the first and second exemplary embodiments, the lower conductive regions of the n-type and p-type transistors are not directly connected to each other. Due to this, a bilk substrate may be used, likewise the exemplary embodiment of FIG. 11B. Meanwhile, in the third to sixth exemplary embodiments, the lower conductive regions of the n-type and p-type transistors are directly connected to each other. Accordingly, likewise the exemplary embodiment of FIG. 19B, it is necessary to insulate the lower conductive regions from the substrate. The reason is the same as the below SRAM.

Additionally, in the first to sixth exemplary embodiments, it doesn't matter if the positions of the n-type transistor and the p-type transistor are appropriately changed. However, when the positions of the n-type transistor and the p-type transistor are appropriately changed, it is necessary to correspondingly change the positions of the power supply line and the ground line, too.

2. SRAM (Static Random Access Memory)

Another exemplary embodiment of the invention relates to a SRAM (static random access memory). The SRAM comprises a memory cell that includes a first n-type transistor, a first p-type transistor, a second n-type transistor, a second p-type transistor, first and second access transistors and first and third local wirings. The first inverter includes the first n-type transistor (which corresponds to the first transistor) and the first p-type transistor (which corresponds to the third transistor). The second inverter includes the second n-type transistor (which corresponds to the second transistor) and the second p-type transistor (which corresponds to the fourth transistor).

In addition, the first to fourth transistors and the first and second access transistors include respectively a pillar made of semiconductor protruding from a surface of base, a lower conductive region which is one of a source and a drain provided in a base, an upper conductive region which is the other of a source and a drain provided in an upper portion of the pillar, a gate electrode provided on a side surface of the pillar and a gate insulating film interposed between the gate electrode and the pillar.

In the above semiconductor device, the first and third local wirings include respectively a convex portion protruding from the base and a protrusion protruding from a side surface of the convex portion. The convex portion of the first local wiring is connected to the lower conductive region of the first n-type transistor, the lower conductive region of the first p-type transistor and the lower conductive region of the first access transistor. In addition, the protrusion of the first local wiring is connected to a second connection gate electrode and a lower surface of the protrusion of the first local wiring is arranged at a height equal to or lower than an upper surface of the second connection gate electrode.

The convex portion of the third local wiring is connected to the lower conductive region of the second n-type transistor, the lower conductive region of the second p-type transistor and the lower conductive region of the second access transistor. In addition, the protrusion of the third local wiring is connected to a first connection gate electrode and a lower surface of the protrusion of the third local wiring is arranged at a height equal to or lower than an upper surface of the first connection gate electrode. Additionally, the first to fourth transistors and the first and second access transistors are formed on a same plane.

In the meantime, from a standpoint of symmetry, the protrusion of the first local wiring is preferably connected to the second connection gate electrode at a center point between the pillar of the second n-type transistor and the pillar of the second p-type transistor. In addition, the protrusion of the third local wiring is preferably connected to the first connection gate electrode at a center point between the pillar of the first n-type transistor and the pillar of the first p-type transistor. Thereby, the distances between the local wirings and the respective transistors are made to be same, so that it is possible to minimize a possibility that a short circuit of the local wiring and the transistor due to misalignment in manufacturing will be generated.

The gate electrodes of the first n-type and p-type transistors, which constitute the first inverter, are commonly made and integrally formed, thereby constituting the first connection gate electrode. In addition, the gate electrodes of the second n-type and p-type transistors, which constitute the second inverter, are commonly made and integrally formed, thereby constituting the second connection gate electrode. Like this, by integrally forming the gate electrodes constituting the respective inverters to make a connection gate electrode, it is possible to attempt the high densification. In the meantime, although the gate electrodes of the first and second access transistors need to be electrically connected to each other ultimately, it may be possible that they are not necessarily integrally formed with the gate electrodes of the first to fourth transistors. The reason is as follows: Since the gate electrode of the first access transistor is in principle connected to a word line that is an external wiring, the gate electrode of the first access transistor can be electrically connected to the gate electrode of the second access transistor through the word line even if they are not integrally formed.

The memory cell is provided thereon with bit lines, a word line, power line Vdd or ground line Gnd. The gate electrodes of the first and second access transistors are electrically connected to the same word line, respectively. In addition, the upper conductive regions of the first and second access transistors are electrically connected to the bit lines.

Like this, the memory cell includes the six vertical transistors, i.e., the first to fourth transistors constituting the first and second inverters and the first and second access transistors. The first n-type and p-type transistors constituting the first inverter correspond to a first driver transistor and a first load transistor. Likewise, the second n-type and p-type transistors constituting the second inverter correspond to a second driver transistor and a second load transistor.

In the followings, the first and second access transistors are n-type vertical transistors unless particularly described. In addition, the first and second driver transistors are n-type transistors and the first and second access transistors are p-type transistors. The upper conductive regions of the driver transistors are electrically connected to ground line Gnd and the upper conductive regions of the load transistors are electrically connected to power line Vdd.

In addition, the lower conductive region of the first access transistor, the lower conductive regions of the first n-type and p-type transistors, the first local wiring and the second connection gate electrode constitute a first accumulation node. Likewise, the lower conductive region of the second access transistor, the lower conductive regions of the second n-type and p-type transistors, the third local wiring and the first connection gate electrode constitute a second accumulation node.

Figure 10:
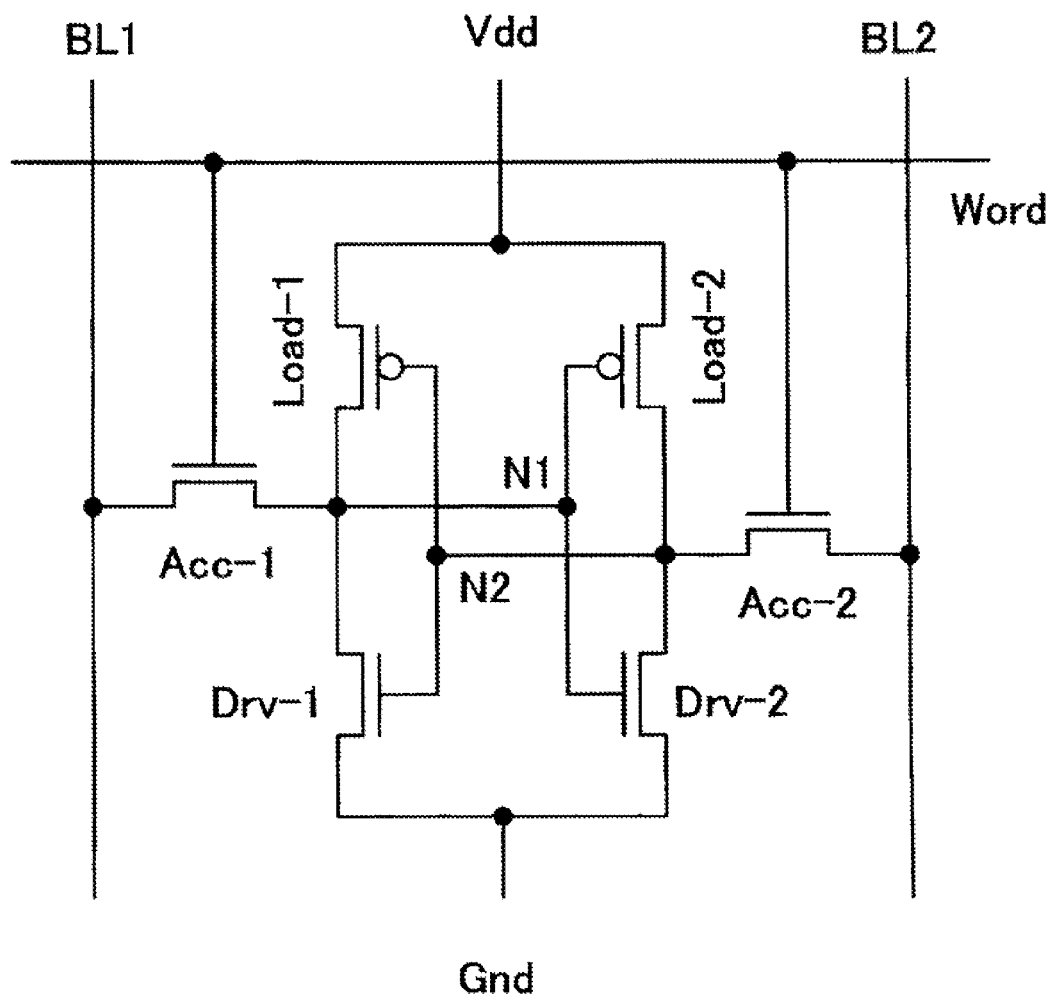
FIG. 10 is a circuit diagram showing an exemplary embodiment of a memory cell of a SRAM that is a semiconductor device of the invention.

FIG. 10 is a circuit diagram showing an example of the memory cell of the SRAM according to this exemplary embodiment. As illustrated in FIG. 10, first load transistor Load-1 that is a p-type transistor and first driver transistor Drv-1 that is an n-type transistor constitute a first inverter. In addition, second load transistor Load-2 that is a p-type transistor and second driver transistor Drv-2 that is an n-type transistor constitute a second inverter.

In the above semiconductor device, output node N1 of the first inverter is inputted to the second inverter through the connection gate electrode of the second inverter and output node N2 of the second inverter is inputted to the first inverter through the connection gate electrode of the first inverter. Nodes N1 and N2 constitute an accumulation node. In addition, when one node is at the ground potential (Gnd), the other is at the power potential (Vdd), and when one node is at the power potential (Vdd), the other is at the ground potential (Gnd). The memory cell stores the information with the above two states being "1" or "0" state.

Accumulation node N1 is connected to first bit line BL1 via first access transistor Acc-1 that is an n-type transistor. In addition, accumulation node N2 is connected to bit line BL2 via second access transistor Acc-2 that is an n-type transistor. The gate electrodes of two access transistors Acc-1, Acc-2 are connected to common word line Word. In addition, the upper conductive region opposite to the accumulation node of two load transistors Load-1, Load-2 is connected to power line Vdd. In addition, the upper conductive regions opposite to the accumulation nodes of two driver transistors Drv-1, Drv-2 are connected to ground line Gnd.

In FIG. 10, as described above, each of the six vertical transistors constituting the memory cell includes a pair of a lower conductive region and an upper conductive region. In addition, the lower conductive regions are electrically connected to any one accumulation node N1 or N2. In addition, accumulation node N1 or N2 is preferably electrically connected to the gate electrode of the vertical transistor in the memory cell and is not electrically connected to any one of wirings Vdd, Gnd, BL1, BL2, Word that are connected to the outside of the cell.

In the meantime, as the materials of the lower conductive regions, the upper conductive regions, the gate electrodes and the gate insulating films of the first and second access transistors, the same materials as those of the transistors constituting the first and second inverters may be used.

Like this, the semiconductor device constituting the SRAM of this exemplary embodiment exhibits the following effects.

(1) By constituting the six transistors of the memory cell with the vertical transistors, it is possible to reduce an area of occupancy of the transistors.

(2) The sources or drains connected to the gate electrodes in the respective vertical transistors can be arranged at a lower side as the lower conductive regions. As a result, it is possible to easily miniaturize the area of the memory cell.

(3) The gate electrode is directly and electrically connected to the other lower conductive region in the same memory cell without the contact plug, the external wiring and the like. Due to this, it is not necessary to provide a region for electrically connecting the lower conductive region to the contact plug, the external wiring and the like and it is possible to reduce an area of the memory cell and thus to easily miniaturize the memory cell.

(4) All of the wirings to connect the memory cells with each other are formed at an upper side, so that it is possible to make the resistance of the wirings to be low, equivalently to that of the planar-type transistor. As a result, it is possible to realize a SRAM of high performance.

(5) The electrical connections with the external wirings are made via the upper conductive regions of the first and second access transistors Acc-1, Acc-2. Due to this, it is possible to make a contact with the external wirings easily without occupying an extra area.

(6) Since the structure is simple, it is possible to manufacture a semiconductor device in a simple manufacturing process.

In this exemplary embodiment, the respective vertical transistors can be diversely arranged as long as the respective vertical transistors are electrically connected, as described above. In the followings, the specific arrangement of the respective vertical transistors constituting the memory cells of the SRAM and the structure of the wirings to electrically connect the inverters with each other will be described with reference to exemplary embodiments. However, it should be noted that the invention is not limited to the following exemplary embodiments.

Seventh Exemplary Embodiment

Semiconductor Device

Figure 11A:
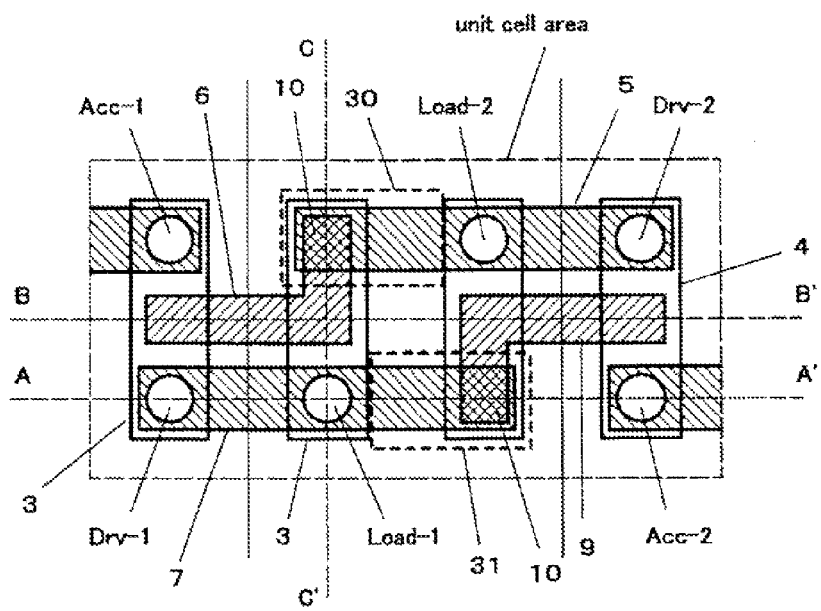
FIG. 11A shows a semiconductor device according to a seventh exemplary embodiment.
Figure 11B:
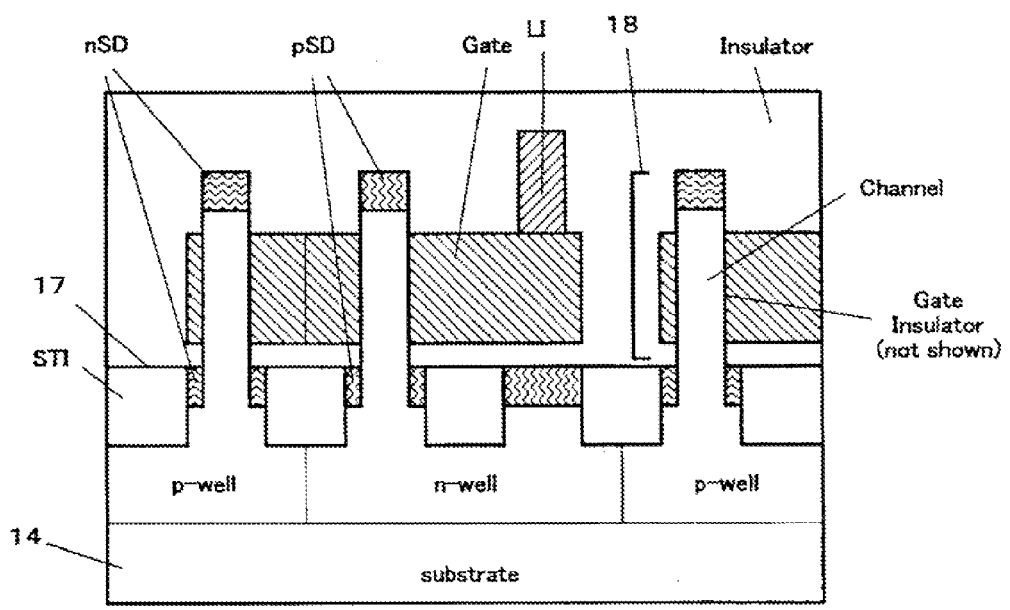
FIG. 11B shows a semiconductor device according to a seventh exemplary embodiment.
Figure 12A:
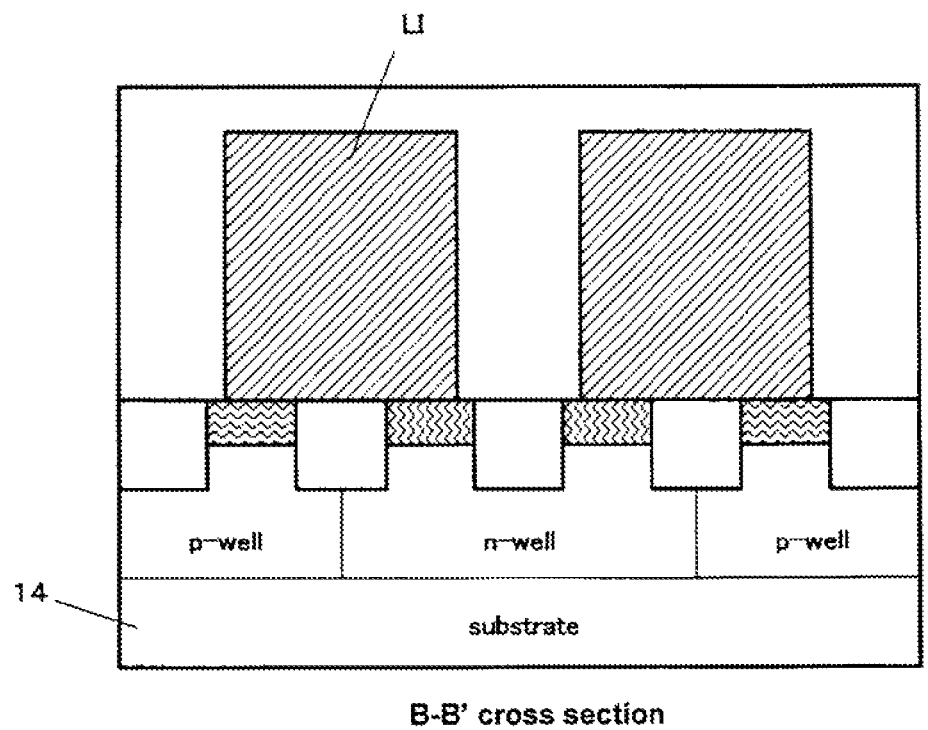
FIG. 12A shows a semiconductor device according to a seventh exemplary embodiment.
Figure 12B:
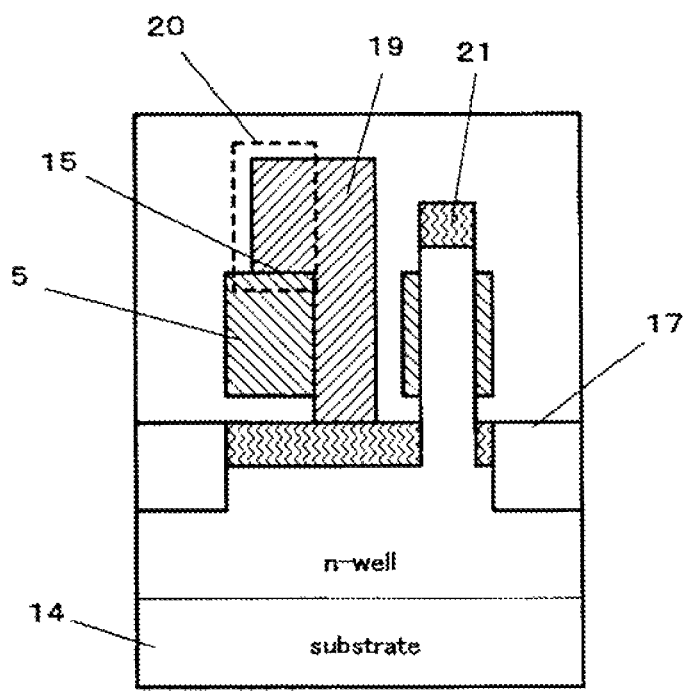
FIG. 12B shows a semiconductor device according to a seventh exemplary embodiment.

FIG. 11A is a plan view showing an exemplary embodiment of a memory cell, FIG. 11B is an A-A' sectional view of FIG. 11A, FIG. 12A is a B-B' sectional view of FIG. 11A and FIG. 12B is a C-C' sectional view of FIG. 11A. Meanwhile, in FIG. 11A, a hatching of a portion constituting a lower conductive region is omitted. In addition, since the gate insulating film is typically very thin, the gate insulating film is not shown in FIGS. 11 and 12. In the meantime, the gate insulating film and the hatching of the lower conductive region are omitted in the drawings following FIG. 13, with regard to the plan view.

In this exemplary embodiment, a memory cell is formed using a bulk semiconductor substrate. As the semiconductor constituting the bulk semiconductor substrate, Si is typically used. However, SiGe, Ge or the other semiconductor materials may be used.

The memory cell includes six vertical transistors. Each of the transistors has pillar 18 that upwardly protrudes from surface of base 17 of the semiconductor substrate. In addition, an upper portion of each pillar 18 is comprised of an upper conductive region. In addition, a gate insulating film and a gate electrode are provided on a side surface of the pillar. When each transistor is ON, the pillar between the lower conductive region and the upper conductive region becomes a channel region, so that channel current flows between the lower conductive region and the upper conductive region. The lower conductive region of each transistor is divided into regions by an isolation insulator (STI), which are parallel with a plane direction of the substrate, and a lower boundary thereof is limited by a depth of the isolation insulator.

In the n-type transistor, the lower and upper conductive regions are made of high-concentration n-type semiconductor regions and the pillar between the lower conductive region and the upper conductive region is typically made of a low-concentration n-type or p-type doped semiconductor region. Additionally, in the p-type vertical transistor, the lower and upper conductive regions are made of high-concentration p-type semiconductor regions and the pillar between the lower conductive region and the upper conductive region is typically made of a low-concentration n-type or p-type doped semiconductor region.

As illustrated in FIG. 11A, the bases of first access transistor Acc-1 and first driver transistor Drv-1 are integrally formed to constitute the first connection base. Thereby, the lower conductive region of the first access transistor and the lower conductive region of the first driver transistor are electrically connected without using a wiring, thereby constituting a part of the first accumulation node. In the meantime, the lower conductive region of first load transistor Load-1 is separately formed from the bases of the first access transistor and the first driver transistor.

In addition, likewise, the lower conductive regions of second access transistor Acc-2 and second driver transistor Drv-2 are integrally formed to constitute the second connection base. Thereby, the lower conductive region of the second access transistor and the lower conductive region of the second driver transistor are electrically connected without using a wiring, thereby constituting a part of the second accumulation node. In the meantime, the lower conductive region of second load transistor Load-2 is separately formed from the bases of the second access transistor and the second driver transistor.

In this exemplary embodiment, the reason to isolate the lower conductive region of the n-type transistor and the lower conductive region of the p-type transistor, which constitute the same inverter, is to prevent a malfunction due to the short circuit between the lower conductive regions of the n-type and p-type transistors and the power or ground. In other words, the reason is to prevent the lower conductive region (n-type) of the n-type transistor from being short-circuited with the power through an n-well. In addition, the reason is to prevent the lower conductive region (p-type) of the p-type transistor from being short-circuited with the ground through a p-well.

As illustrated in FIGS. 11 and 12, the second driver transistor and the second load transistor constitute second connection gate electrode 5 integrally formed. Connection gate electrode 5 includes second gate extension portion 30 that extends in a left direction of the drawing. In other words, when seen from the upper side, second gate extension portion 30 is further extended from the portions above lower conductive regions 4 of the n-type and p-type transistors constituting the second inverter and is thus extended to the outside thereof. Lower conductive regions 3 of the first access transistor, the first driver transistor and the first load transistor are electrically connected to second gate extension portion 30 by first local wiring 6. Lower conductive regions 3, gate electrodes 5 and first local wirings 6 of the first access transistor, the first driver transistor and the first load transistor constitute the first accumulation node.

In addition, likewise, the first driver transistor and the first load transistor constitute first connection gate electrode 7 integrally formed. Connection gate electrode 7 includes first gate extension portion 31 that extends in a right direction of the drawing. In other words, when seen from the upper side, gate extension portion 31 is further extended from portions above lower conductive regions 3 of the n-type and p-type transistors constituting the first inverter and is thus extended to the outside thereof. Lower conductive regions 4 of the second access transistor, the second driver transistor and the second load transistor are electrically connected to first gate extension portion 31 by third local wiring 9. Lower conductive regions 4, gate electrodes 7 and third local wirings 9 of the second access transistor, the second driver transistor and the second load transistor constitute the second accumulation node.

In the meantime, the connection portion of first local wiring 6 and connection gate electrode 5 is indicated with portion 10 in which first local wiring 6 and second gate extension portion 31 are overlapped, in FIG. 11A. In addition, the connection portion of third local wiring 9 and connection gate electrode 7 is indicated with portion 10 in which third local wiring 9 and first gate extension portion 31 are overlapped, in FIG. 11A.

As illustrated in FIG. 12B, first local wiring 6 includes convex portion 19 and protrusion 20. A lower surface of protrusion 20 is in contact with upper surface 15 of connection gate electrode 5 and is positioned at the same height as upper surface 15. In the meantime, although not shown in the sectional views like FIG. 12B, third local wiring 9 also includes a convex portion and a protrusion, as first local wiring 6. In addition, a lower surface of third local wiring 9 is in contact with an upper surface of gate electrode 7 and is positioned at the same height as the upper surface of gate electrode 7.

In the meantime, although not shown in FIGS. 11 and 12, the upper conductive regions of the first and second driver transistors are electrically connected to the ground line and the upper conductive regions of the first and second load transistors are electrically connected to the power line. In addition, the upper conductive region of the first access transistor is electrically connected to the first bit line and the upper conductive region of the second access transistor is electrically connected to the second bit line.

Additionally, in this exemplary embodiment, as illustrated in FIGS. 11B and 12B, the lower conductive region and the upper conductive region are out of contact with the gate insulating film, and the gate electrode is not provided on the lower conductive region and the upper conductive region.

Figure 13A:
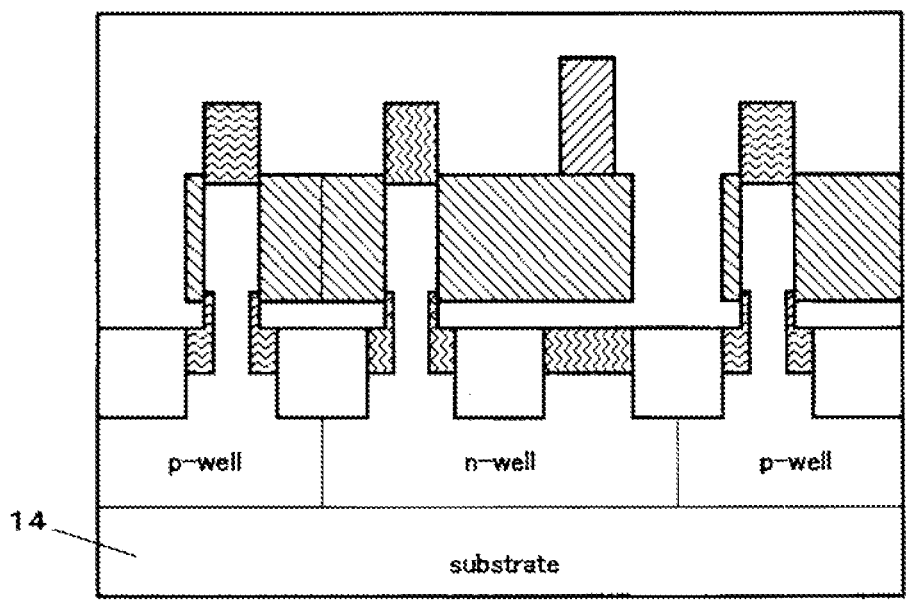
FIG. 13A shows a modified exemplary embodiment of a semiconductor device according to a seventh exemplary embodiment.
Figure 13B:
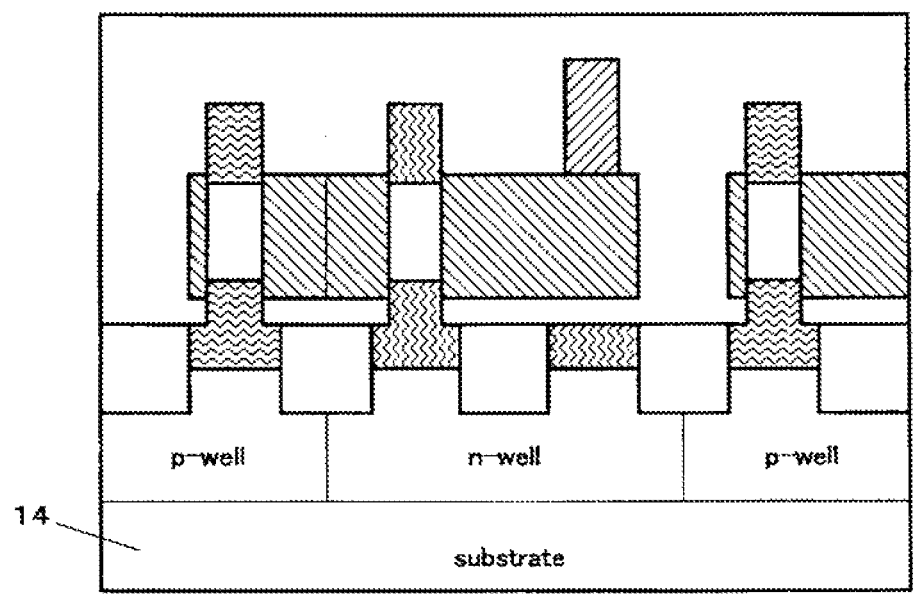
FIG. 13B shows a modified exemplary embodiment of a semiconductor device according to a seventh exemplary embodiment.

However, the lower conductive region and the upper conductive region of the vertical transistor of this exemplary embodiment are not limited to the above structure. FIGS. 13A and 13B are sectional views corresponding to the A-A' sectional view of FIG. 11A and show the lower conductive region and the upper conductive region that are different from those in FIG. 11B. In the semiconductor device of FIG. 13A, the lower conductive region and the upper conductive region are formed over a wider region, i.e., to the gate electrode of the pillar, so that the lower conductive region and the upper conductive region are in contact with the gate insulating film, and the gate electrode is provided on the lower conductive region and the upper conductive region. In this exemplary embodiment, even when the lower conductive region and the upper conductive region are in contact with the gate insulating film, as illustrated in FIG. 13A, it is possible to operate each transistor and memory cell without a particular problem. In addition, the lower conductive region and the upper conductive region are enabled to be in or out of contact with the gate insulating film by controlling regions in the pillar in which impurities for the lower conductive region and the upper conductive region are diffused and regions in which the gate insulating film and the gate electrode are formed in a process for manufacturing a semiconductor device.

Further, in this exemplary embodiment, as illustrated in FIGS. 11B and 12B, the base just below the pillar of each transistor is not provided with a lower conductive region. In this exemplary embodiment, by providing such a structure, when the transistor is ON, the channel region is electrically connected to the semiconductor substrate. As a result, it is possible to prevent a so-called substrate floating effect in which a potential of the channel region is unstable. However, the region for forming the lower conductive region is not limited to the region surrounding a root portion of the pillar. For example, as illustrated in FIG. 13B, the region for forming the lower conductive region may be also the whole lower portion of the pillar. In the structure shown in FIG. 13B, when the transistor is ON, the lower conductive region exists between the channel region and the semiconductor substrate and the channel region is completely isolated from the semiconductor substrate by the lower conductive region. In this case, it is preferable to design a transistor so that it performs a complete depletion operation in which the channel region is completely depleted at the time of reverse.

P-wells and n-wells are formed in the semiconductor substrate, like a related planar-type vertical transistor. The p-well exists in the region in which the n-type transistor is provided and is typically given with ground potential (Gnd). The n-well exists in the region in which the p-type transistor is provided and is typically given with power potential (Vdd). Thereby, reverse bias is applied between the lower and upper conductive regions and the wells and between the n-well and the p-well, so that insulation is guaranteed.

In FIGS. 11 and 12, the size and sectional shape of the bases of the respective transistors are identical. Thereby, regularity of the pattern is increased, so that it is possible to easily perform the processing. In addition, an area of the base is increased to increase the electrical capacity of the accumulation nodes, so that it is possible to stabilize an operation of the SRAM against the disturbance. In the meantime, the base of the load transistor may be made to be smaller than the base of the access transistor and driver transistor integrally formed as long as a connection to the wiring can be made. In addition, the respective transistors are formed to have an approximately same height. In this exemplary embodiment, the multi-layer of the transistor as described in Patent Documents 1 and 6 is not carried out, so that the manufacturing process can be simplified.

Figure 14:
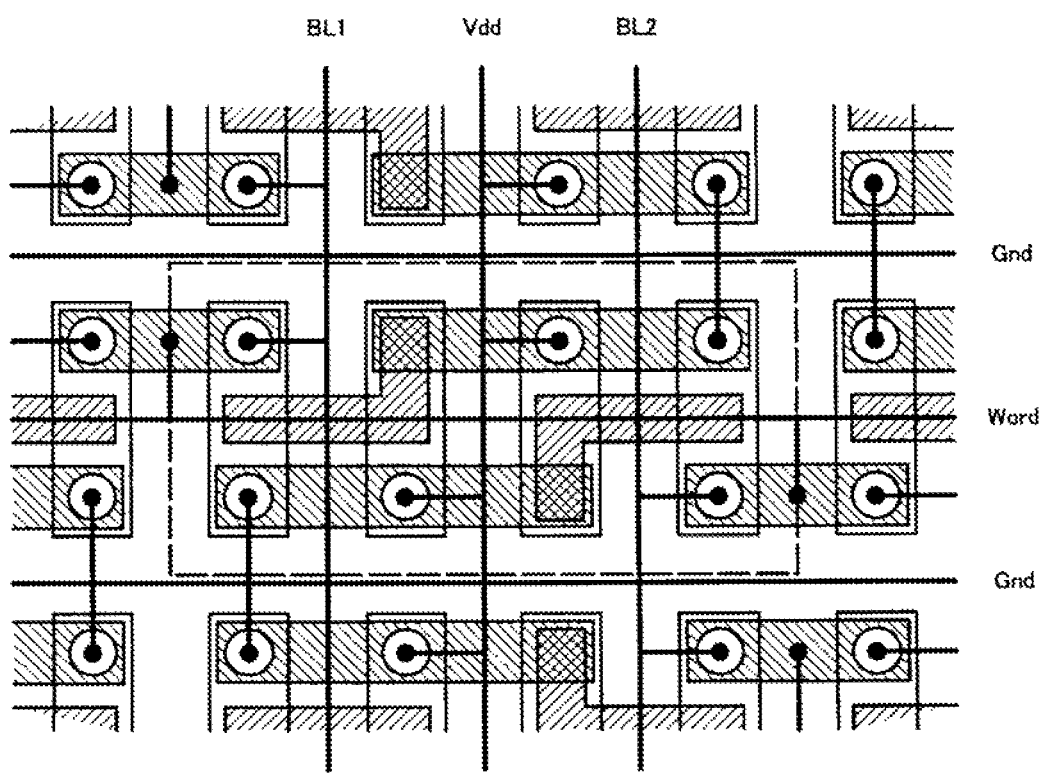
FIG. 14 shows a semiconductor device according to a seventh exemplary embodiment.

FIG. 14 shows an exemplary embodiment of a semiconductor device in which a plurality of the memory cells of FIGS. 11 and 12 are arranged in an array pattern and power line Vdd, ground line Gnd, first and second bit lines BL1, BL2 and word line Word are electrically connected to each memory cell. In FIG. 14, a rectangular dashed region corresponds to a single memory cell. In FIG. 14, when all of the minimum width and the minimum distance of each structure are F, the dimensions of the memory cell are such that a horizontal width is approximately 8F, a vertical width is 4F and an area is ideally $32F^2$.

Like this, in this exemplary embodiment, the lower conductive regions of the first n-type and p-type transistors and the first access transistor are directly and electrically connected to the second connection gate electrode via the first local wiring. The first local wiring enables the distance to the adjacent contact hole to be small, so that it is possible to reduce an area of occupancy of the connection portions of the lower conductive regions of the first n-type and p-type transistors and the second access transistor and the second connection gate electrode.

Likewise, the lower conductive regions of the second n-type and p-type transistors are directly and electrically connected to the second access transistor and the first connection gate electrode via the third local wiring. The third local wiring enables the distance to the adjacent contact hole to be small, so that it is possible to reduce an area of occupancy of the connection portions of the lower conductive regions of the second n-type and p-type transistors and the second access transistor and the first connection gate electrode. Due to this, in this exemplary embodiment, it is possible to form all of the wirings to connect the cells with each other in the upper side, so that memory cells of ultra high density can be realized.

In this exemplary embodiment, when arranging the memory cells in a line, regarding the horizontal direction, it is preferable to arrange the memory cells in a mirror-image symmetry about the boundary line of the unit cell, as illustrated in FIG. 14. The reason is because it is possible to share the connection portion of the word line and the gate electrode of the access transistor with the adjacent cells and to thus increase a degree of integration. In FIG. 14, the memory cells are also vertically arranged in a line in a mirror-image symmetry manner. However, it should be noted that the arrangement of the memory cells is not limited thereto. For example, the unit cells may be vertically arranged in a translational symmetry manner (the cells are arranged in a line in such a manner that the cells are simply parallel displaced). The reason is because a connection portion of the wirings cannot be shared between adjacent memory cells, even in any case.

Method for Manufacturing a Semiconductor Device

In the followings, a method for manufacturing the semiconductor device according to the seventh exemplary embodiment will be described with reference to FIGS. 15 to 18. First, a mask is provided by a lithography technique, thereby protecting desired regions on a semiconductor substrate such as silicon and the like. Then, only regions of the semiconductor substrate, which are not protected, are selectively etched to form six pillars 18 that upwardly protrude from surface of base 17 of the semiconductor substrate.

Next, by providing the mask with the lithography technique, the desired regions are protected and only the regions of the semiconductor substrate, which are not protected, are selectively etched to remove a substrate of a region to be an isolation insulator. Next, an insulator is deposited in order to have a thickness thicker than the pillars and then a surface of the insulator is flattened by a CMP technique. In addition, the insulator is selectively etched back to form an isolation insulator.

Next, regions for forming p-type transistors are covered by the mask and p-type impurities are ion-implanted from the upper side, thereby forming p-wells in regions for forming n-type transistors. Next, the mask having covered the region for forming p-type transistors is removed, and the regions for forming n-type transistors are covered by the mask. After that, n-type impurities are vertically ion-implanted from the upper side, thereby forming n-wells in regions for forming p-type transistors. Next, the mask having covered the regions for forming n-type transistors is removed. In the meantime, the processes for forming the n-wells and the p-wells may be performed in reverse order, compared to the above method. In addition, the formation of n-wells and p-wells may be carried out before forming the pillars and the isolation insulator.

Next, a mask is formed so as to cover the regions for forming the p-type transistors, and then n-type impurities are vertically ion-implanted from the upper side, thereby forming upper conductive regions and lower conductive regions on upper portions and portions adjacent to roots of the pillars for n-type transistors, respectively. Next, the mask having covered the regions for forming p-type transistors is removed and then the regions for forming n-type transistors are covered by the mask. Next, p-type impurities are vertically ion-implanted from the upper side, thereby forming upper conductive regions and lower conductive regions on upper portions and portions adjacent to roots of the pillars for p-type transistors, respectively. Next, the mask having covered the regions for forming n-type transistors is removed. In the meantime, the processes for forming the lower conductive regions and the upper conductive regions of the n-type transistors and the processes for forming the lower conductive regions and the upper conductive regions of the p-type transistors may be performed in reverse order. In addition, in order to form the lower conductive regions as illustrated in FIGS. 13A and 13B, it is preferable to appropriately diffuse the impurities of the sources and drains toward the gates during the manufacturing process.

Figure 15A:
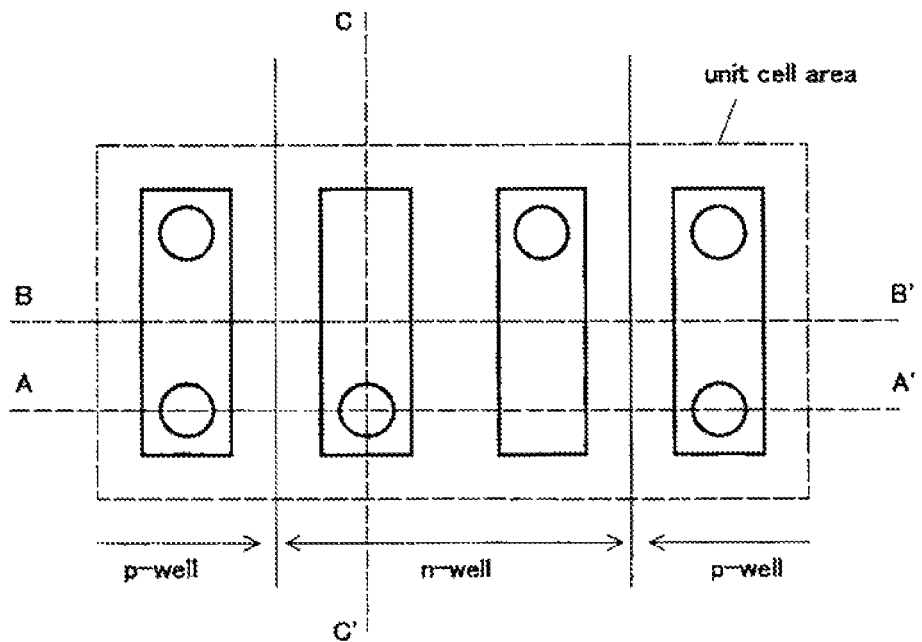
FIG. 15A shows a part of a process for manufacturing a semiconductor device according to a seventh exemplary embodiment.
Figure 15B:
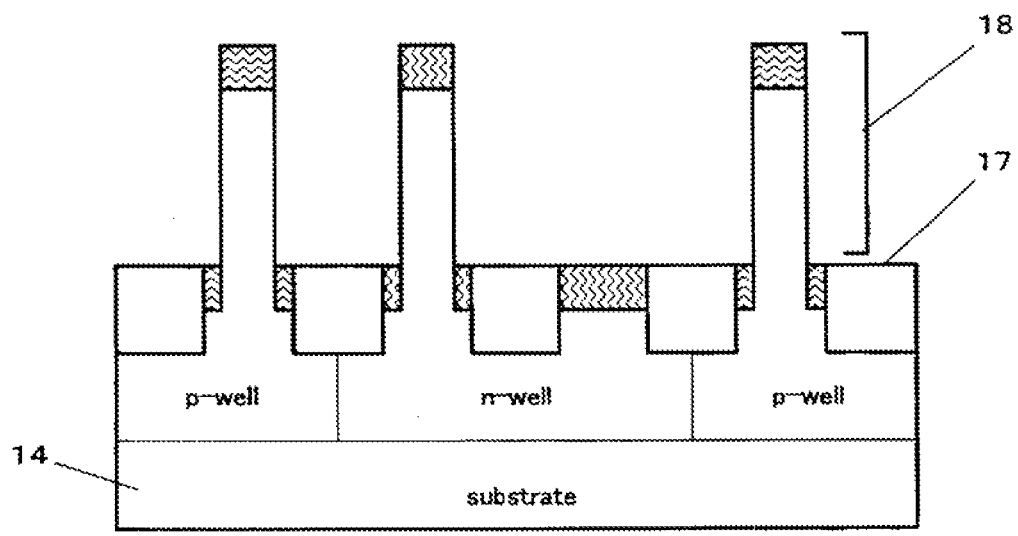
FIG. 15B shows a part of a process for manufacturing a semiconductor device according to a seventh exemplary embodiment.
Figure 16A:
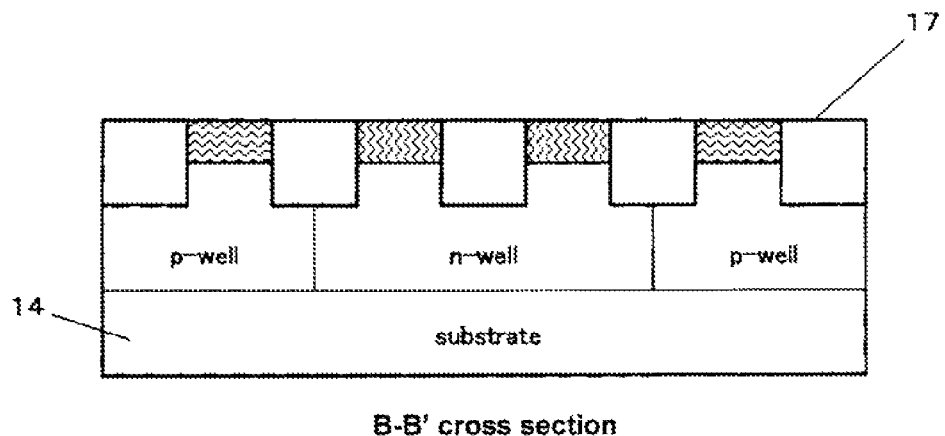
FIG. 16A shows a part of a process for manufacturing a semiconductor device according to a seventh exemplary embodiment.
Figure 16B:
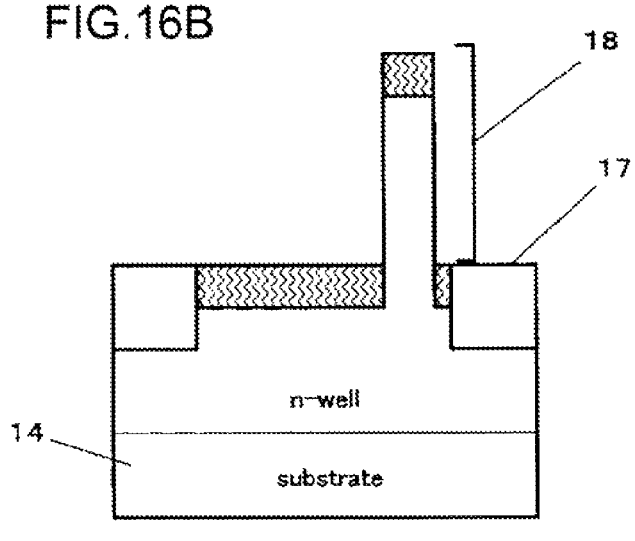
FIG. 16B shows a part of a process for manufacturing a semiconductor device according to a seventh exemplary embodiment.

Through the above process, the structure shown in FIGS. 15 and 16 is obtained. In the meantime, FIG. 15A is a plan view showing the manufacturing process on the way, FIG. 15B is an A-A' sectional view of FIG. 15A, FIG. 16A is a B-B' sectional view of FIG. 15A and FIG. 16B is a C-C' sectional view of FIG. 15A. According to the above method, it is possible to form the upper conductive regions and the lower conductive regions on the upper portions and portions adjacent to the roots of the pillars at the same time. Next, it is possible to easily realize a structure in which the portions of the pillars to be channel regions and the semiconductor substrate communicate with each other without being isolated by the lower conductive regions.

Figure 17A:
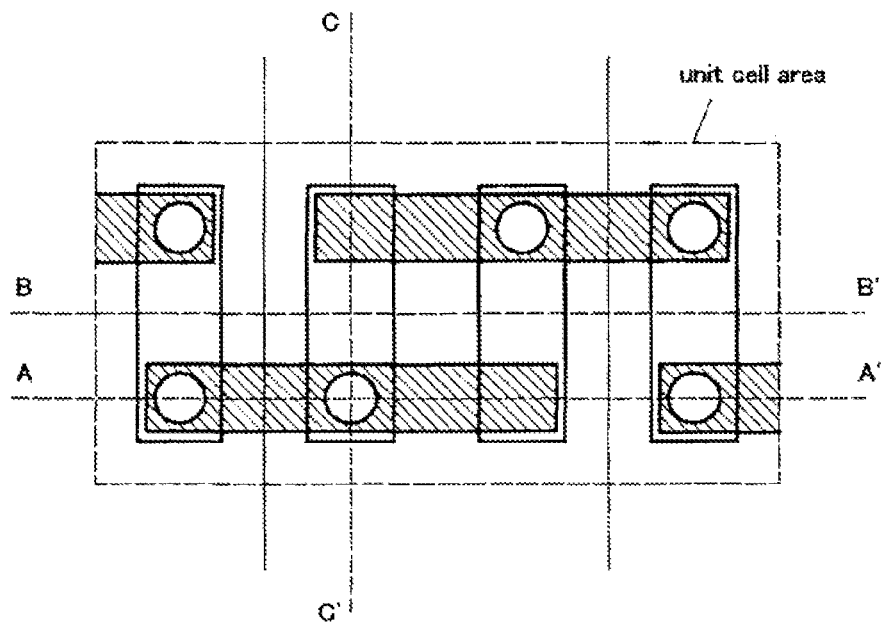
FIG. 17A shows a part of a process for manufacturing a semiconductor device according to a seventh exemplary embodiment.
Figure 17B:
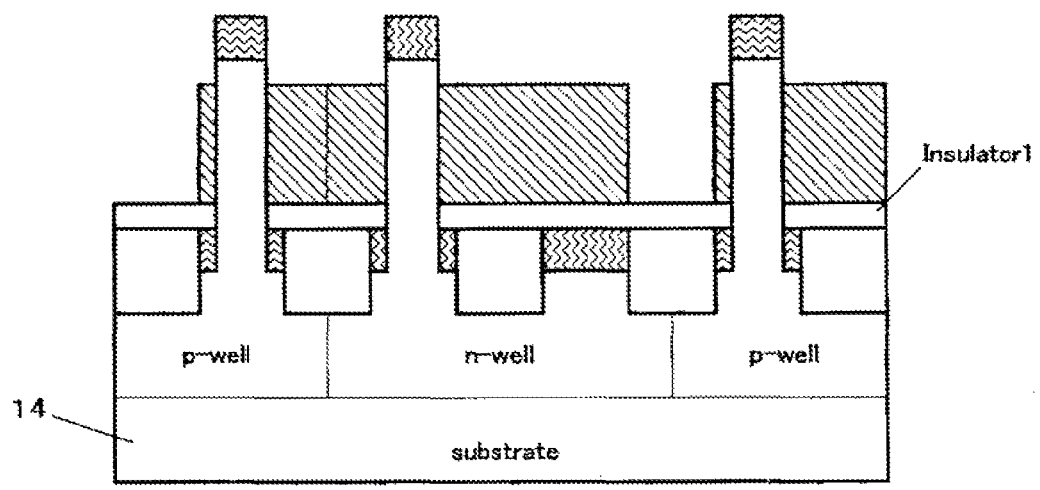
FIG. 17B shows a part of a process for manufacturing a semiconductor device according to a seventh exemplary embodiment.
Figure 18A:
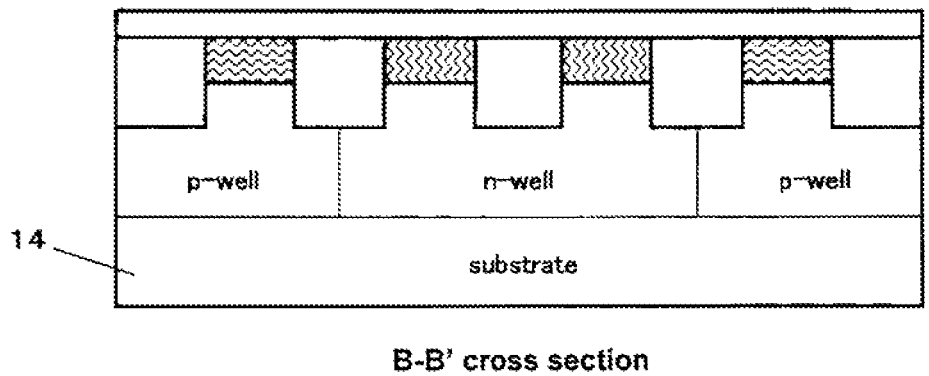
FIG. 18A shows a part of a process for manufacturing a semiconductor device according to a seventh exemplary embodiment.
Figure 18B:
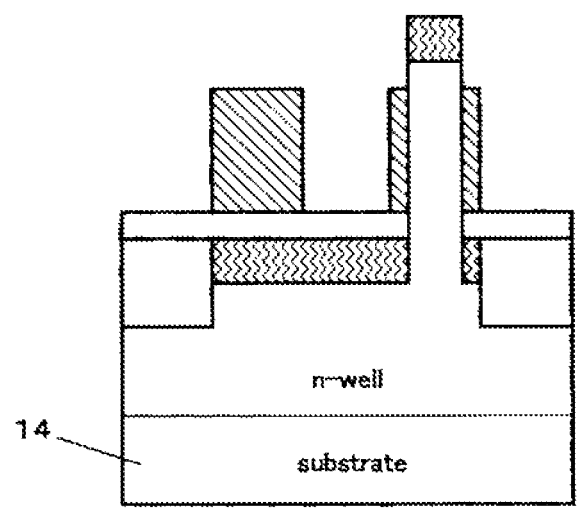
FIG. 18B shows a part of a process for manufacturing a semiconductor device according to a seventh exemplary embodiment.

Next, an insulator is deposited in order to have a thickness thicker than the pillars and then a surface of the insulator is flattened by the CMP technique. After that, the insulator is selectively etched back to form a first insulating film that has the same height as a lower end of a gate electrode, which will be formed later, and covers a whole surface of a region in which the pillars do not exist. Then, surfaces of the pillars are covered with the gate insulatings film by thermal oxidation or CVD. Next, metal, which is a material of a gate electrode, is deposited to have a thickness thicker than the pillars and then a surface of the metal is flattened by the CMP technique. Next, the metal is selectively etched back to form a metal film that has the same height as upper ends of the upper conductive regions of the pillars and covers a whole surface of a region in which the pillars do not exist. Next, desired regions are protected by the mask formed with the lithography technique, and only the metal film in regions that are not protected is selectively etched to form gate electrodes. Through the above process, the structure shown in FIGS. 17 and 18 is obtained. In the meantime, FIG. 17A is a plan view showing the manufacturing process on the way, FIG. 17B is an A-A' sectional view of FIG. 17A, FIG. 18A is a B-B' sectional view of FIG. 17A and FIG. 18B is a C-C' sectional view of FIG. 17A.

Next, an insulator is deposited to have a thickness thicker than the pillars and a surface of the insulator is flattened by the CMP technique, thereby forming an insulating film covering the whole surface. Next, desired regions are protected by the mask formed with the lithography technique, and only the insulating film in regions that are not protected is selectively etched to form recesses to be embedded with wirings. Next, a conductor is deposited to fill the recesses and a surface of the conductor is flattened by the CMP technique, thereby filling up the recesses with the conductor to form wirings. Next, an insulator is formed on the whole surface, so that the structure shown in FIGS. 11 and 12 is obtained.

As the material of the wirings, it is possible to use refractory metal such as tungsten that is conventionally used for contact embedding, because the low resistance such as that of the external wiring is not required. For example, it is appropriate to deposit tungsten on a thin barrier film of titanium nitride and the like.

Eighth Exemplary Embodiment

Figure 19A:
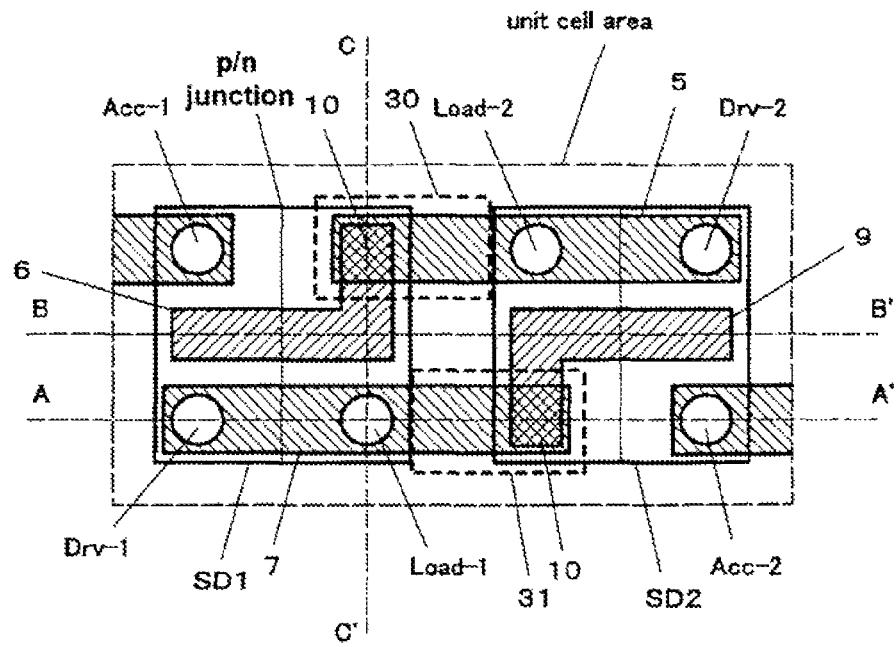
FIG. 19A shows a semiconductor device according to an eighth exemplary embodiment.
Figure 19B:
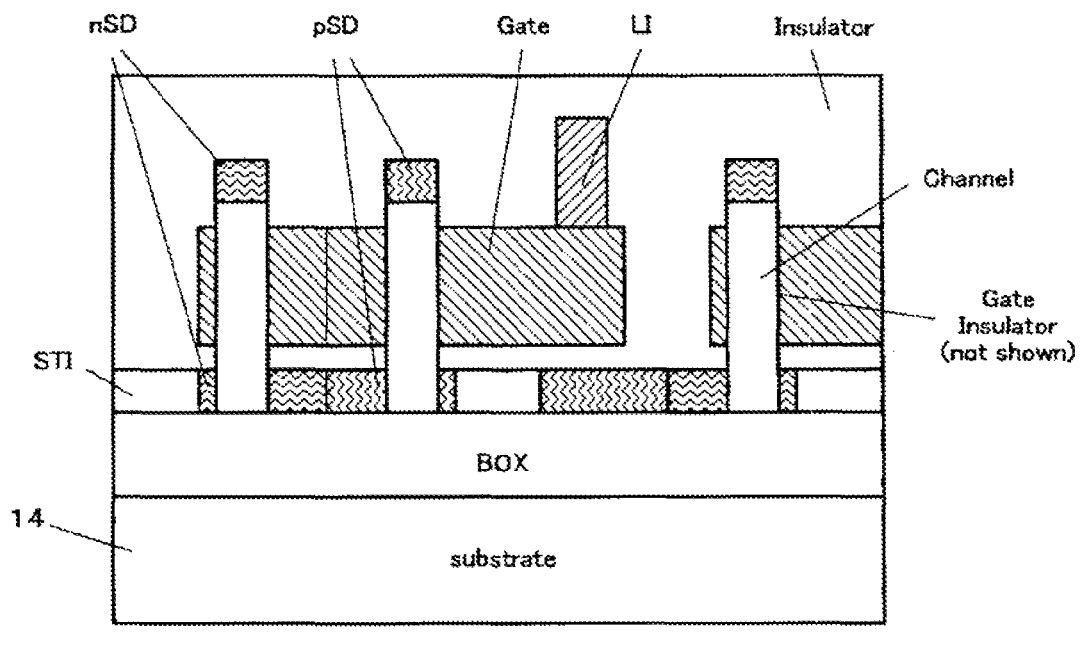
FIG. 19B shows a semiconductor device according to an eighth exemplary embodiment.
Figure 20A:
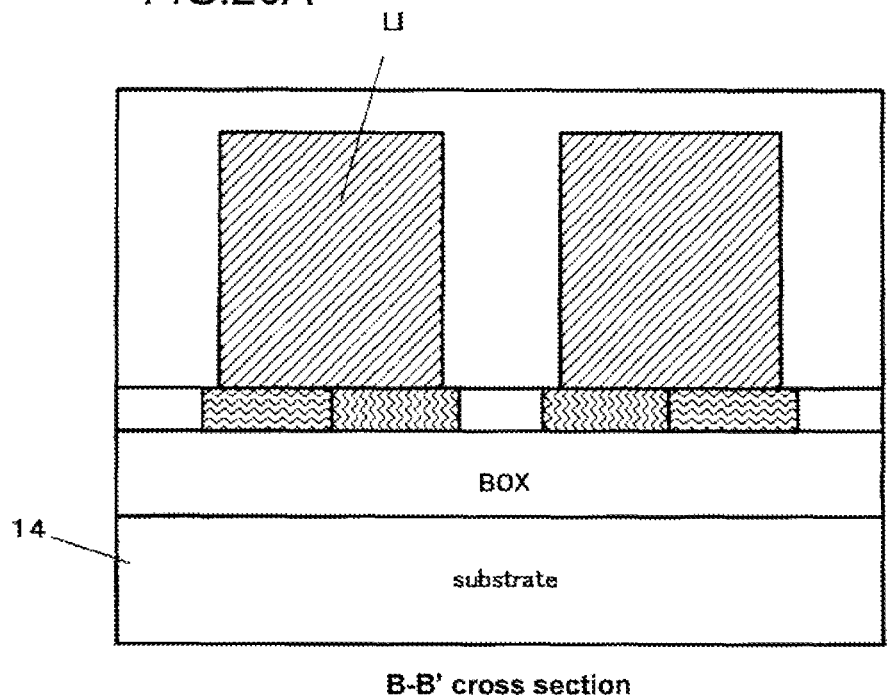
FIG. 20A shows a semiconductor device according to an eighth exemplary embodiment.
Figure 20B:
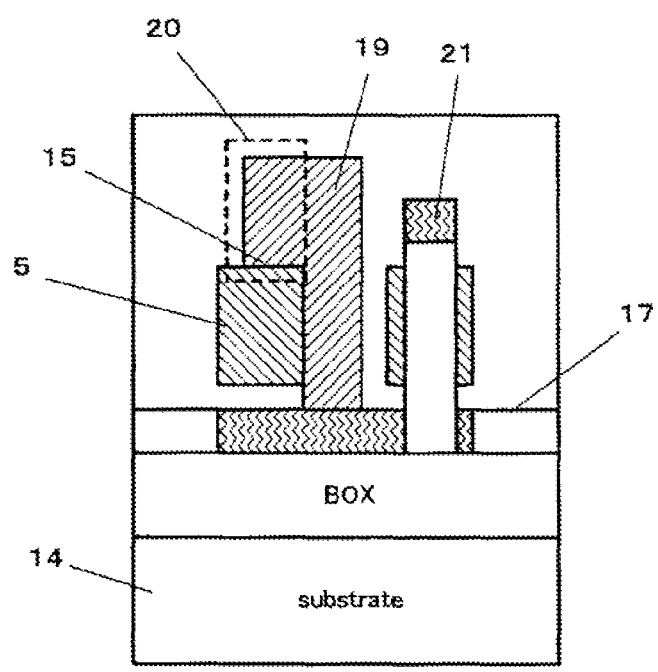
FIG. 20B shows a semiconductor device according to an eighth exemplary embodiment.

FIGS. 19 and 20 shows another exemplary embodiment of a memory cell. FIG. 19A is a plan view of a memory cell according to this exemplary embodiment, FIG. 19B is an A-A' sectional view of FIG. 19A, FIG. 20A is a B-B' sectional view of FIG. 19A and FIG. 20B is a C-C' sectional view of FIG. 19A. This exemplary embodiment is different from the seventh exemplary embodiment, in that a semiconductor thin film is provided on an insulator and lower conductive regions of the respective transistors are formed in the semiconductor thin film. Like this, a silicon on insulator (S01) substrate may be typically exemplified as the substrate including the semiconductor thin film on the insulator. However, the semiconductor thin film may be made of SiGe, Ge or other semiconductors.

Additionally, this exemplary embodiment is different from the seventh exemplary embodiment, in that the lower conductive region of the first load transistor is integrally formed in addition to the first access transistor and the first driver transistor, thereby constituting a base belonging to a part of the first accumulation node. In other words, the base of the first access transistor, the base of the first driver transistor and the base of the first load transistor are integrally formed to constitute a first connection base.

In addition, this exemplary embodiment is different from the seventh exemplary embodiment, in that the lower conductive region of the second load transistor is integrally formed in addition to the second access transistor and the second driver transistor, thereby constituting a base belonging to a part of the second accumulation node. In other words, the base of the second access transistor, the base of the second driver transistor and the base of the second load transistor are integrally formed to constitute a second connection base.

In this exemplary embodiment, even with the above structure, since the lower portion of the semiconductor thin film is insulated by the embedded insulator, the lower conductive region (n-type) of the n-type transistor is not short-circuited with the power via the n-well. In addition, the lower conductive region (p-type) of the p-type transistor is also not short-circuited with the ground via the p-well.

In addition, the lower conductive region of the n-type transistor and the lower conductive region of the p-type transistor are not always short-circuited just by coming into contact with each other directly. Accordingly, it is possible to form a local wiring over the lower conductive region (n-type region) of the n-type transistor and the lower conductive region (p-type region) of the p-type transistor, which constitute a same inverter. In this case, the lower conductive region and the upper conductive region are semiconductor regions in which impurities are doped. By providing the local wiring having such a structure, it is possible to form a wiring with a simple process using the well-known lithography technique.

Lower conductive regions 3 of the first access transistor, the first driver transistor and the first load transistor are electrically connected to connection gate electrode 5 by first local wiring 6. In addition, likewise, lower conductive regions 4 of the second access transistor, the second driver transistor and the second load transistor are electrically connected to connection gate electrode 7 by second local wiring 9.

In the meantime, the connection portion of first local wiring 6 and connection gate electrode 5 is indicated in FIG. 19A with portion 10 in which the first local wiring and the second gate extension portion 30 (a portion that the gate electrode is extended to a region except a region above the second connection base) of connection gate electrode 5 are overlapped. Connection portion 10 becomes a region except a region above second connection base SD2. In addition, the connection portion of second local wiring 9 and connection gate electrode 7 is indicated in FIG. 19A with portion 10 in which the second local wiring and the first gate extension portion 31 (a portion that the gate electrode is extended to a region except a region above the first connection base) of connection gate electrode 7 are overlapped. Connection portion 10 is a region except a region above first connection base SD1.

As illustrated in FIGS. 12B and 20B, first local wiring 6 includes convex portion 19 and protrusion 20. A lower surface of protrusion 20 is in contact with upper surface 15 of connection gate electrode 5 and is positioned at the same height as upper surface 15. In the meantime, although not shown in the sectional views like FIG. 12B, third local wiring 9 also includes a convex portion and a protrusion, like first local wiring 6. In addition, a lower surface of third local wiring 9 is in contact with an upper surface of connection gage electrode 7 and is positioned at the same height as the upper surface.

Like this, since the connection portions of first and third local wirings 6, 9 and the connection gate electrodes are structured as described above, it is possible to form the first and third local wirings in a single lithography process. Furthermore, since it is possible to lower the heights of the first and third local wirings, it is possible to suppress an increase in height of the upper wiring due to the local wiring (the upper wiring should be spaced from the local wiring by a predetermined distance).

In the meantime, the method for connecting the lower conductive regions is not limited to the above method. For example, it may be possible that a silicide layer is formed on a semiconductor region having impurities doped therein by a salicide technique and the lower conductive regions are electrically connected by the silicide layer. In addition, the lower conductive regions of the n-type and p-type transistors may be electrically connected by constituting the lower conductive regions with metal materials. Like this, by constituting the lower conductive regions of the n-type and p-type transistors with metal materials or with a salicide structure, the lower conductive regions of the n-type and p-type transistors are automatically electrically-connected just by coming into contact with each other directly. Due to this, in this case, it is not necessary to form a local wiring that is electrically connected by stepping over the lower conductive regions of the n-type and p-type transistors, so that a process can be simplified.

The salicide structure may be formed as follows, like the method with regard to the conventional planar-type transistor. In other words, after obtaining the structure of FIGS. 15A to 16B, an insulating film is vapor-grown and anisotropically etched to cover a side surface of the pillar with an insulating protective film. Next, metal such as Ni and Co is deposited and the metal and exposed semiconductor are alloyed in a self-aligned manner by heating (salicidation, salicide=self-aligned silicide). Then, un-reacted metal that is out of contact with the lower conductive region is removed by etching using chemical solution. Thereby, only the surface of the lower conductive region is formed with metal such as Ni silicide in a self-aligned manner. In addition, the insulating protective film is removed, if required. In the meantime, in the salicide process, it may be possible that the lower conductive region formed by ion implantation is completely silicided to totally constitute the lower conductive region with metal. At this time, n-type and p-type impurities ion-implanted previously can be made to have a function of adjusting effective work functions of metal source and drain to be favorable to the n-type and p-type vertical transistors.

Figure 38A:
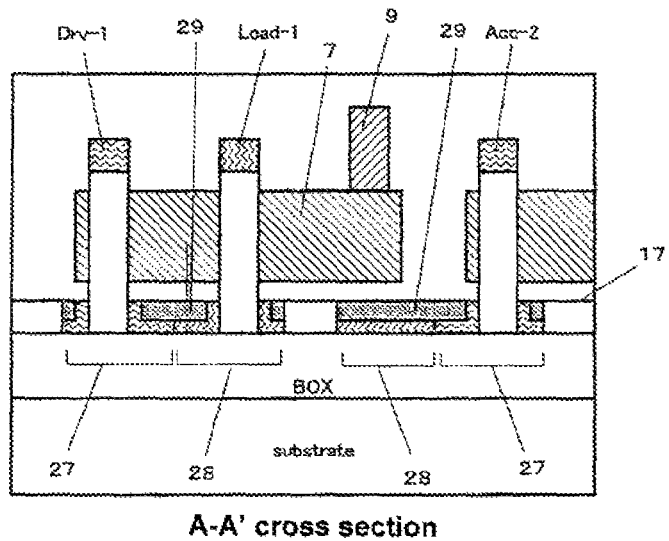
FIG. 38A shows an exemplary embodiment of a semiconductor device of the invention.
Figure 38B:
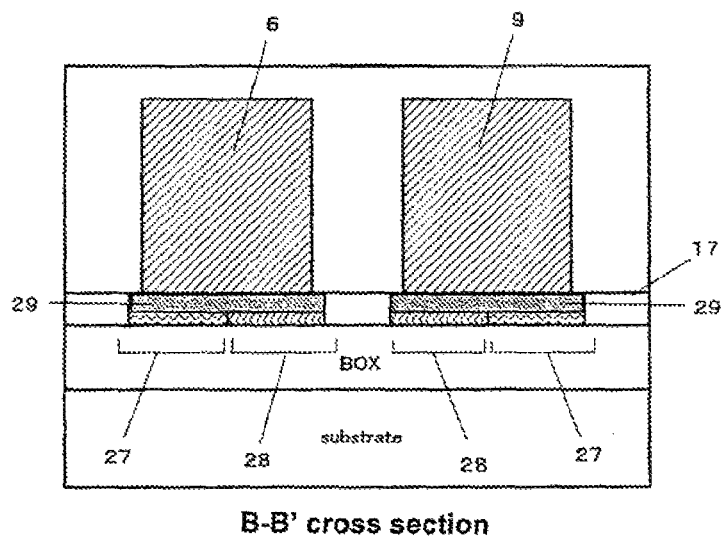
FIG. 38B shows an exemplary embodiment of a semiconductor device of the invention.
Figure 38C:
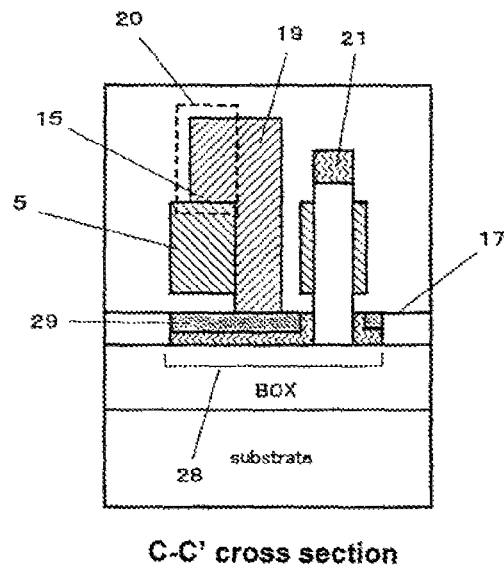
FIG. 38C shows an exemplary embodiment of a semiconductor device of the invention.

FIG. 38 shows an exemplary embodiment of a semiconductor device having a salicide structure. FIGS. 38A to 38C are A-A', B-B' and C-C' sectional views of the semiconductor device shown in FIG. 19A, respectively. As illustrated in FIG. 38, first connection base SD1 includes first conductive type semiconductor region 27 and second conductive type semiconductor region 28 that makes a junction with first conductive type semiconductor region 27. In the meantime, first and second conductive type semiconductor regions 27, 28 form a two-dimensional plane-shape region, when seen from an upper side (a direction perpendicular to a surface of base). First conductive type semiconductor region 27 is provided with a pillar of the first n-type transistor. In addition, second conductive type semiconductor region 28 is provided with a pillar of the first p-type transistor. Silicide layer 29, which is a metal containing conductive layer, is provided on a region including a boundary of first conductive type semiconductor region 27 and second conductive type semiconductor region 28, thereby electrically connecting the first and second conductive type semiconductor regions.

In this exemplary embodiment, likewise first connection base SD1, second connection base SD2 includes first conductive type semiconductor region 27, second conductive type semiconductor region 28 and silicide layer 29, and the first conductive type semiconductor region and the second conductive type semiconductor region are electrically connected. Like this, by providing the first and second connection bases including the n-type and p-type lower conductive regions connected and integrated, it is possible to further reduce the area of occupancy.

In the meantime, the connection means of lower conductive regions 3 of the n-type and p-type transistors is not limited to the silicide layer. For example, by constituting lower conductive regions 3 with metal materials, respectively, it is possible to electrically connect lower conductive regions 3 adjacent to each other.

In addition, the shape of the local wiring is not limited to that of this exemplary embodiment and can be appropriately selected. However, a degree of freedom of the shape of the local wiring is high in semiconductor device in which a semiconductor thin film is formed on an insulator, like this exemplary embodiment. Particularly, in some cases of a related semiconductor device, as the miniaturization is further progressed, a size of a wiring is reduced, so that it may be difficult to form a local wiring stepping over lower conductive regions of n-type and p-type transistors. Compared to this, in this exemplary embodiment, it is possible to form a metal region or a wiring having a salicide structure so as to electrically and continuously connect upper portions or all of the lower conductive regions of the n-type and p-type transistors. Accordingly, it is not necessary for the local wiring to extend over the lower conductive regions of the n-type and p-type transistors. Due to this, even when the miniaturization is further progressed, it is possible to easily form the first and second local wirings.

In the meantime, like this exemplary embodiment, a structure in which a semiconductor thin film is formed on an insulator and lower conductive regions are formed in the semiconductor thin film can be also manufactured by a process that is substantially identical to the seventh exemplary embodiment. FIGS. 21 and 22 show structures during the manufacturing of this exemplary embodiment. In the meantime, FIG. 21A is a plan view showing a manufacturing process on the way, FIG. 21B is an A-A' sectional view of FIG. 21A, FIG. 22A is a B-B' sectional view of FIG. 21A and FIG. 22B is a C-C' sectional view of FIG. 21A.

Figure 21A:
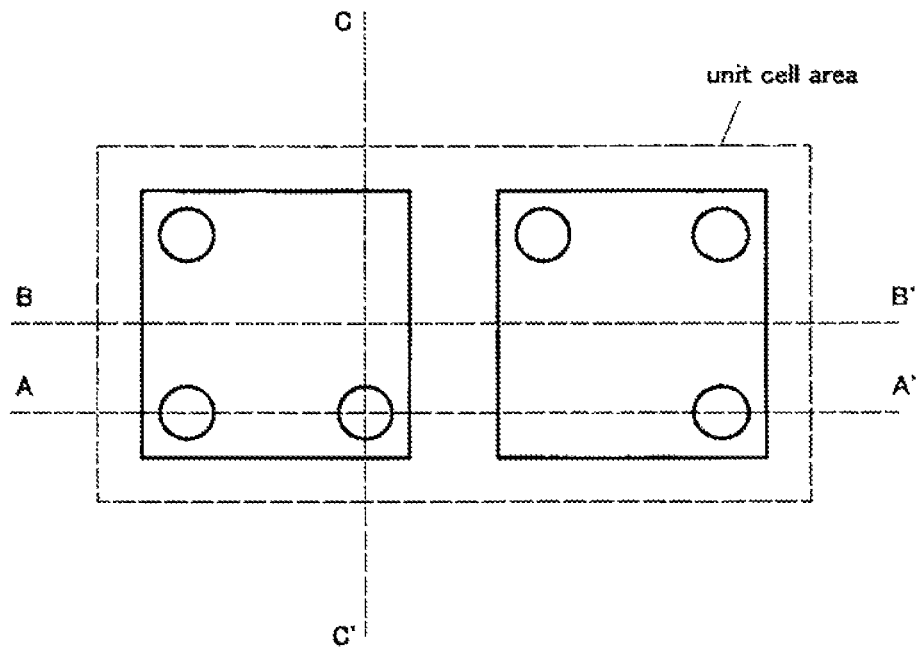
FIG. 21A shows a part of a process for manufacturing a semiconductor device according to an eighth exemplary embodiment.
Figure 21B:
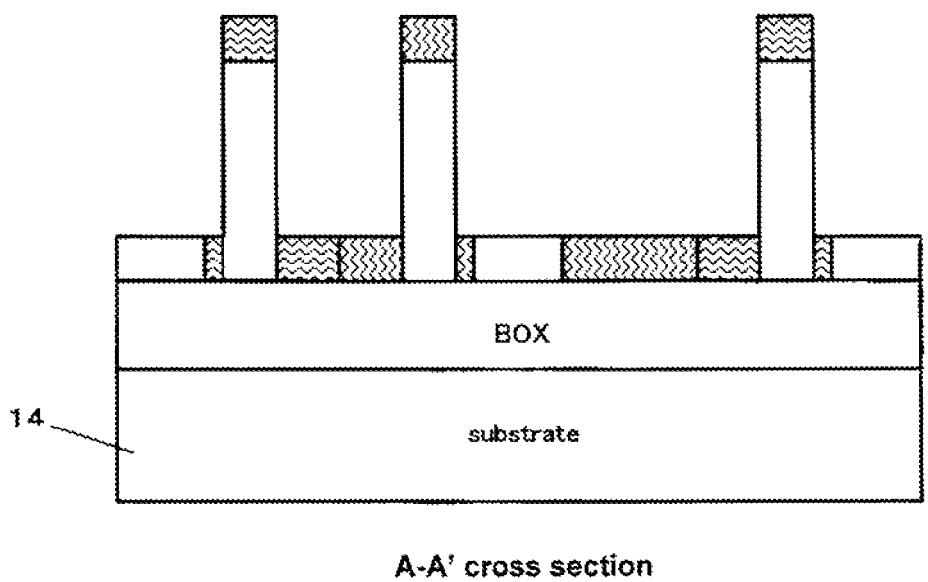
FIG. 21B shows a part of a process for manufacturing a semiconductor device according to an eighth exemplary embodiment.
Figure 22A:
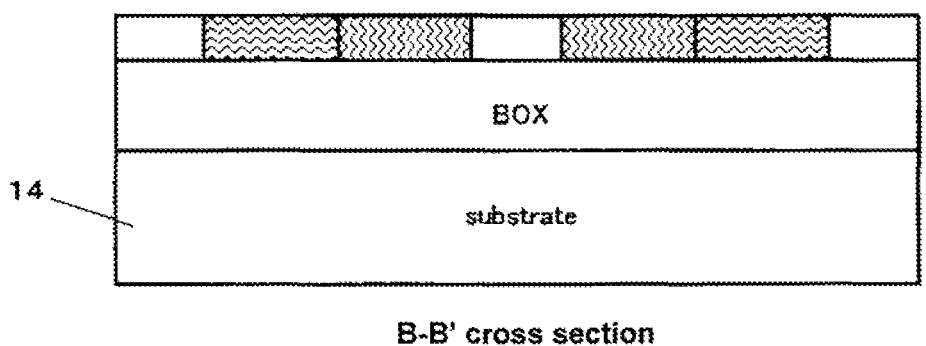
FIG. 22A shows a part of a process for manufacturing a semiconductor device according to an eighth exemplary embodiment.
Figure 22B:
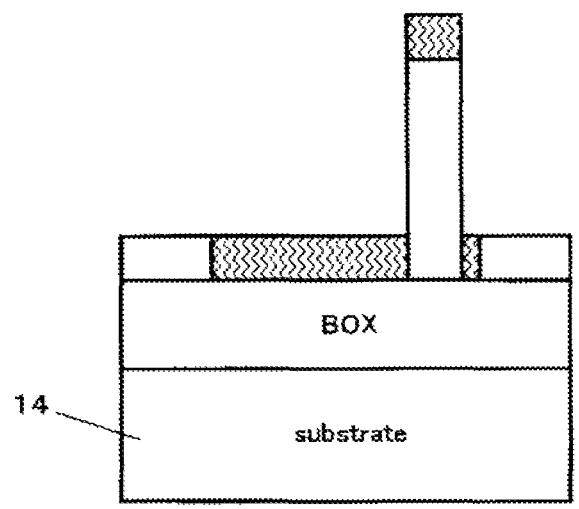
FIG. 22B shows a part of a process for manufacturing a semiconductor device according to an eighth exemplary embodiment.
Figure 23A:
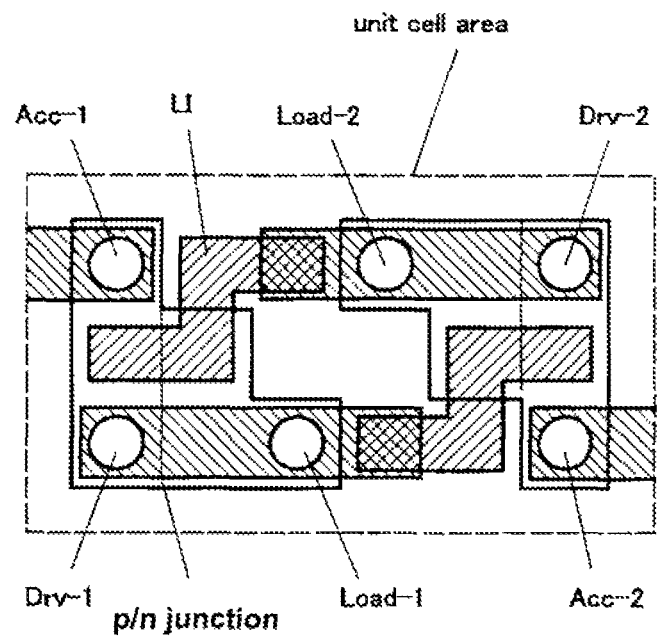
FIG. 23A shows a modified exemplary embodiment of a semiconductor device according to an eighth exemplary embodiment.
Figure 23B:
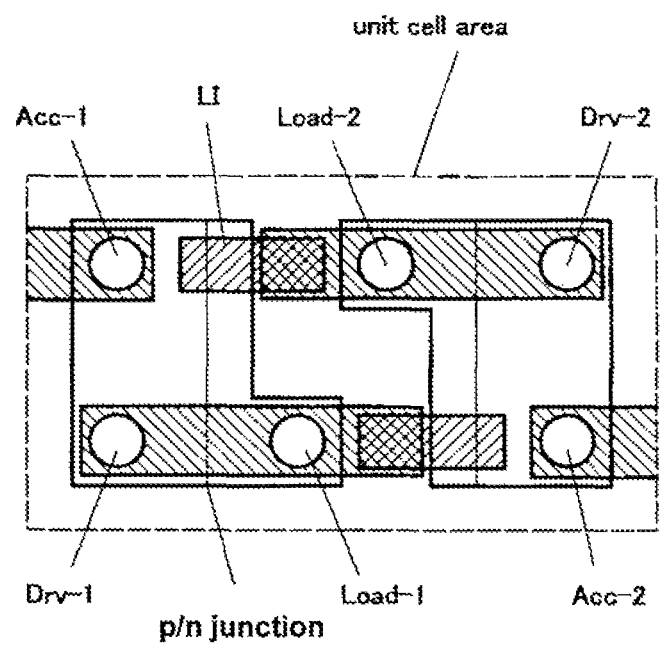
FIG. 23B shows a modified exemplary embodiment of a semiconductor device according to an eighth exemplary embodiment.

As illustrated in FIG. 21A, in this exemplary embodiment, the bases of the first access transistor, the first driver transistor, the first load transistor, the second access transistor, the second driver transistor, the second load transistor have an approximate square plane structure of the base. Thereby, the pattern is simplified, so that it is possible to easily perform the processing thereof. In addition, as an area of the bases is increased, the electrical capacities of the accumulation nodes are increased, so that it is possible to stabilize an operation of a SRAM against disturbance.

In the meantime, in this exemplary embodiment, the shape of the base is not limited to the approximate square shape and can be formed into a desired shape. Like this, by appropriately changing the shape of the base, it is possible to reduce an area of a cell.

FIG. 23 shows another exemplary embodiment of a semiconductor device having a different arrangement of transistors. In this semiconductor device, as illustrated in FIGS. 19 and 20, the bases of the first access transistor, the first driver transistor and the first load transistor are integrally formed, thereby constituting a first connection base. In addition, the bases of the second access transistor, the second driver transistor and the second load transistor are integrally formed, thereby constituting a second connection base. However, this semiconductor device is different from the semiconductor device shown in FIGS. 19 and 20, in that the plane structures of these integrated connection bases are not approximate square shapes.

In the semiconductor device shown in FIG. 23, a portion of the base adjacent to a vertex being not near any transistor among square vertexs of the base is recessed. In addition, the first access transistor is opposed to the second load transistor, and the second access transistor is opposed to the first load transistor. Thereby, it is possible to shorten a distance between the first access transistor and the second load transistor and a distance between the second access transistor and the first load transistor. With the arrangement, a horizontal width of a unit cell is shortened to about 7F from about 8F and a cell area can be reduced to $28F^2$ from $32F^2$. In the meantime, a shape of a base capable of reducing the cell area can be appropriately selected from various options.

Ninth Exemplary Embodiment

Figure 24A:
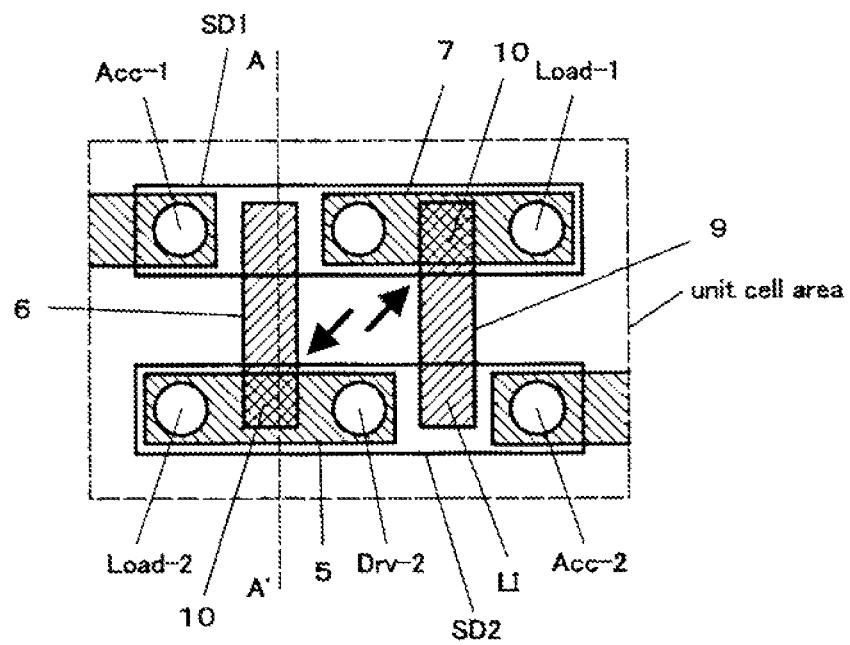
FIG. 24A shows a semiconductor device according to a ninth exemplary embodiment.
Figure 24B:
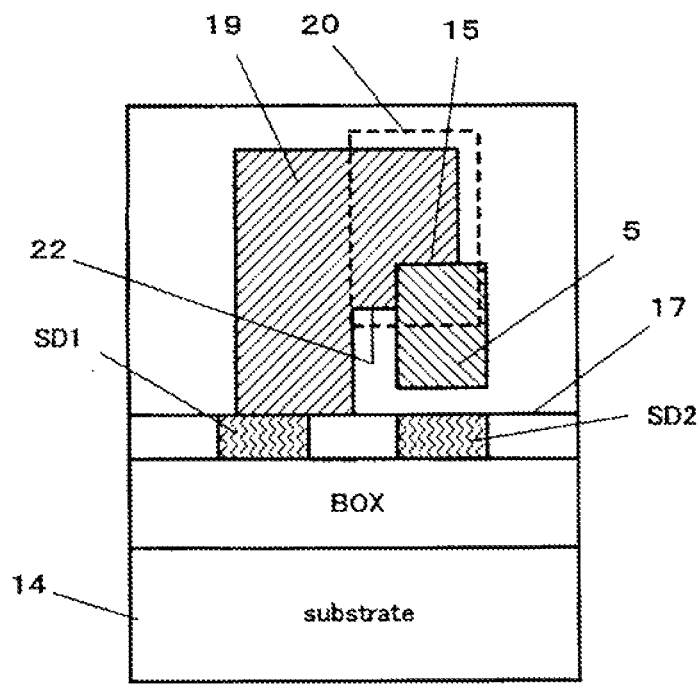
FIG. 24B shows a semiconductor device according to a ninth exemplary embodiment.

FIG. 24 shows another exemplary embodiment of a memory cell. FIG. 24A is a plan view of a semiconductor device and FIG. 24B is an A-A' sectional view of FIG. 24A. In this exemplary embodiment, like the eighth exemplary embodiment, a semiconductor think film is provided on an insulator and lower conductive regions of the respective transistors are formed in the semiconductor thin film. However, the semiconductor device of this exemplary embodiment is different from the eighth exemplary embodiment with respect to an arrangement of the respective transistors and connection positions of wirings on gate electrodes, as illustrated in FIG. 24A. Also in this exemplary embodiment, a restriction on the structure of the wiring is decreased, so that it is possible to easily reduce a cell area.

In the eighth exemplary embodiment, the first and third local wirings are connected to the connection gate electrodes at the extension portions that are extended to a region except region above the connection base constituting each inverter. However, in this exemplary embodiment, as illustrated in FIG. 24B, first local wiring 6 is connected to connection gate electrode 5 between the pillar of the second n-type transistor and the pillar of the second p-type transistor. In addition, first local wiring 6 is connected to connection gate electrode 5 above second connection base SD2. Additionally, first local wiring 6 is spaced and insulated from second connection base SD2.

Likewise, third local wiring 9 is connected to connection gate electrode 7 between the pillar of the first n-type transistor and the pillar of the first p-type transistor. In addition, third local wiring 9 is connected to connection gate electrode 7 above first connection base SD1. Additionally, third local wiring 9 is spaced and insulated from first connection base SD1.

In addition, first local wiring 6 includes convex portion 19 and protrusion 20. Protrusion 20 has two lower surfaces. Among them, one lower surface of the protrusion is in contact with upper surface 15 of connection gate electrode 5 and is positioned at the same height as upper surface 15, and another lower surface 22 of the protrusion is positioned closer to surface of base 17 than upper surface 15. In the meantime, although not shown in the sectional views as FIG. 12B, third local wiring 9 also has a convex portion and a protrusion, like first local wiring 6. In addition, the protrusion of third local wiring 9 includes a lower surface that is in contact with an upper surface of connection gate electrode 6 and is positioned at the same height as the upper surface and a lower surface that is positioned closer to surface of base 17 than upper surface. The connection portion of first local wiring 9 and connection gate electrode 5 is indicated in FIG. 24A with portion 10 in which the first local wiring and the gate electrode are overlapped.

With the structure of FIG. 24B, it is possible to achieve unique effects of the vertical transistor. In other words, in this exemplary embodiment, the connection of the lower conductive regions of two transistors constituting the inverter and the connection of the gate electrodes of the transistors are made at the same position when seen from the upper side. Thereby, it is possible to reduce an area of occupancy of the memory cell. In addition, under such state, the lower conductive regions of the two transistors serve as wiring means for connecting the lower conductive regions with each other, and the gate electrodes of the two transistors serve as wiring means for connecting the gate electrodes with each other. The lower conductive regions to be a wiring are vertically spaced and insulated from the gate electrodes to be a wiring, so that two wirings are arranged on a same position of the plane. Such a structure cannot be typically realized in a conventional planar-type transistor. The reason is as follows: when a semiconductor region (region except isolation region) and a gate electrode are arranged at a same position in a planar-type transistor, a transistor is automatically formed in the semiconductor region below the gate electrode. Due to this, it is not possible to constitute the semiconductor region and the gate electrode as independent wiring means.

In addition, the local wiring of this exemplary embodiment is electrically connected to the gate electrode of the vertical transistor just above the lower conductive region of the vertical transistor and is spaced and insulated from the lower conductive region of the vertical transistor. In other words, the local wiring of this exemplary embodiment provides wring cable means that is selectively connected to only the gate electrode with a small area, which is an upper wiring, at a portion in which the lower conductive region, which is a lower wiring, and the gate electrode, which is an upper wiring, occupy a substantially same position when seen from the upper side of the substrate. Thereby, it is possible to realize a high-density structure that is unique to the vertical transistor.

Furthermore, since it is possible to lower the heights of the first and third local wirings, it is possible to suppress an increase in height of the upper wiring due to the local wirings (the upper wiring needs to be spaced from the local wiring by a predetermined distance). Such effects are the same as the inverters shown in the third, fourth and sixth exemplary embodiments.

By providing the above structure, it is possible to prevent the first accumulation node and the second accumulation node from being short-circuited. Like this, portions at which the first and third local wirings are electrically connected to the gate electrodes but that should be insulated from the lower conductive regions just below the gate electrodes are indicated with arrows in the plan view of FIG. 24A.

Figure 25A:
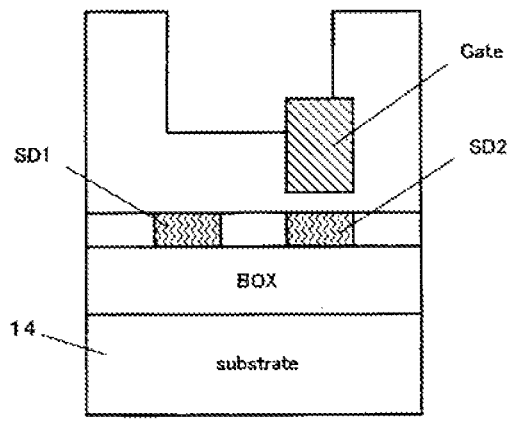
FIG. 25A shows a part of a process for manufacturing a semiconductor device according to a ninth exemplary embodiment.
Figure 25B:
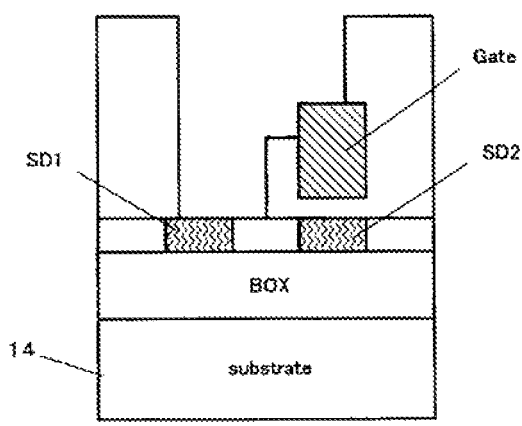
FIG. 25B shows a part of a process for manufacturing a semiconductor device according to a ninth exemplary embodiment.

In the meantime, in order to achieve the wiring structure of this exemplary embodiment, it is preferable to form the first and third local wirings in two steps. In other words, an exemplary embodiment of forming one local wiring will be described below. First, after forming each transistor, an insulating film is formed on the whole surface. Then, as illustrated in FIG. 25A, a wide recess that reaches a gate electrode but does not reach a lower conductive region is formed in the insulating film by a first lithography and etching process. Continuously, as illustrated in FIG. 25B, a narrow recess that reaches only a lower conductive region that will be electrically connected is formed by a second lithography and etching process. Continuously, the wide recess and the narrow recess shown in FIGS. 25A and 25B are filled up with conductor, so that a local wiring is formed.

Figure 25C:
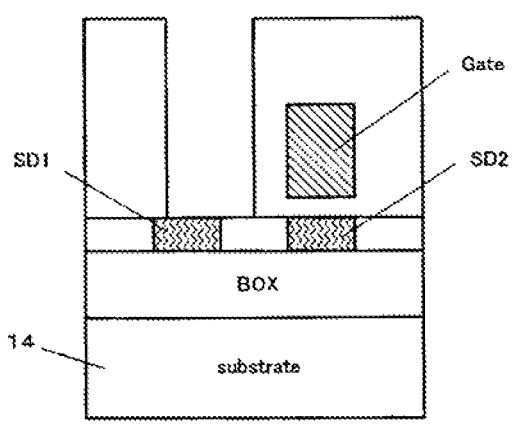
FIG. 25C shows a part of a process for manufacturing a semiconductor device according to a ninth exemplary embodiment.

In the meantime, inversely to the above process, it may be possible that a narrow recess is first formed and then a wide recess is then formed. In other words, as illustrated in FIG. 25C, a narrow recess that reaches only a lower conductive region that will be electrically connected is provided by a first lithography and etching process. Continuously, the narrow recess is filled up with an organic film using a mask. Then, a wide recess that reaches a gate electrode but does not reach a lower conductive region is formed in the insulating film and the organic film by a second lithography and etching process. Continuously, the organic film is removed by an oxygen plasma treatment and the like, so that a structure of FIG. 25B is obtained. Finally, the wide recess and the narrow recess shown in FIGS. 25A and 25B are filled up with conductor, so that a local wiring is formed. Meanwhile, in the above process, a well-known damascene wiring formation method for LSI may be adopted.

In this exemplary embodiment, the local wiring is formed by a separate process from the upper wiring. Due to this, it is possible to make the local wiring be close to the typical contact hole (which is provided at a position of the upper conductive region of each transistor in the exemplary embodiment of SRAM) to the maximum, which is the same advantage as the other exemplary embodiments. To be specific, it is possible to make the local wiring be close to the contact hole by an extra distance Δ (which is typically a one-severalth of F) in which a short circuit due to misalignment of positions is not caused.

In this exemplary embodiment, like a related wiring structure, the contact hole and the local wiring are formed by the separate lithography processes, the contact hole and the local wiring are formed by two lithography processes. However, this exemplary embodiment is different from the related wiring structure, in that a patterning for the contact hole, which corresponds to the gate electrode, is omitted. Thereby, compared to a case where each of contact holes is arranged at each of two points to be connected, it is possible to miniaturize the local wiring. In order to omit the pattering for the contact hole, which corresponds to the gate electrode, and to secure a contact with the gate electrode, the lower surface of the protrusion of the local wiring is arranged at a height equal to or lower than the upper surface of the gate electrode. In addition, it is preferable that the local wiring is in contact with at least a part of the side surface of the gate electrode, with regard to the decrease in contact resistance. In addition, in order to obtain such advantages, the local wiring is not applied to a wiring that intersects above the gate electrode without contacting the gate electrode.

The local wiring of FIG. 24B and the local wiring of FIG. 12B can be provided as mixed on a same substrate without complicating a manufacturing process. Since the structure of FIG. 12B can be obtained by applying only a process of forming a deep recess for obtaining the structure of FIG. 24B and omitting a process of forming a shallow recess, it is possible to form the structure of FIG. 12B without adding a special process to the process of forming the structure of FIG. 24B.

In FIG. 24A, the lower conductive regions of the load transistor and the driver transistor are connected by the bases and the gate electrodes of the load transistor and the driver transistor are also connected above the bases. The gate electrode and the base are arranged at approximately same positions when seen from the upper side. However, both the gate electrode and the base are vertically spaced and insulated from each other, so that they serve as independent wirings. Such a structure is unique to the vertical transistor. The reason is as follows: when a semiconductor region corresponding to a base and a gate electrode are arranged with being overlapped at a same position in a conventional planar-type transistor when seen from an upper side of a substrate, a channel portion is automatically formed in an element region of the overlapped region. As a result, it is not possible to enable the channel portion in the overlapped region to serve as a wiring. In this exemplary embodiment, it is possible to realize the high densification of SRAM cells by combining the above structure unique to the vertical transistor with the local wiring structure of FIG. 24B.

Figure 26A:
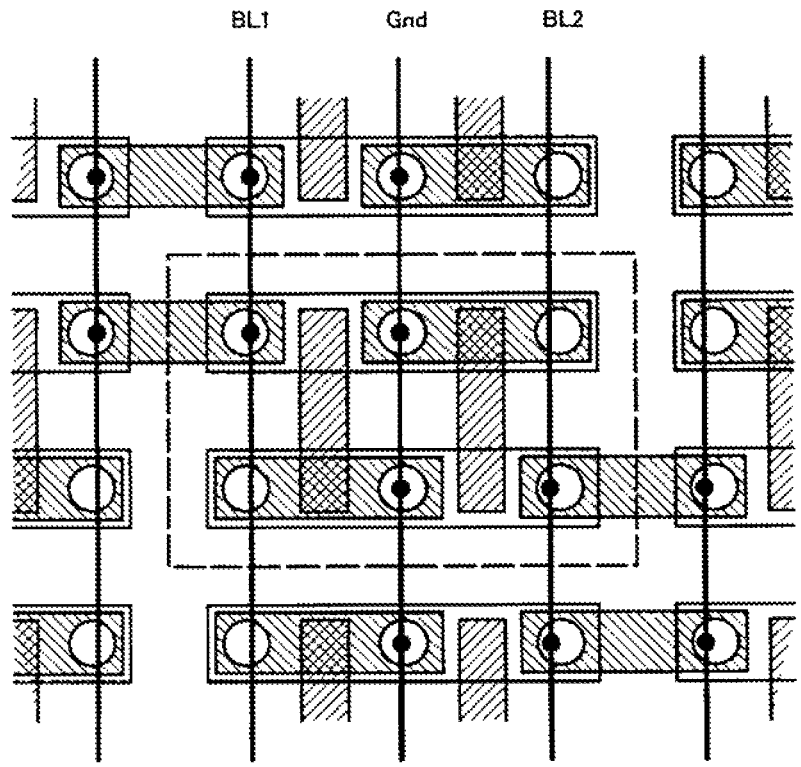
FIG. 26A shows a semiconductor device according to a ninth exemplary embodiment.
Figure 26B:
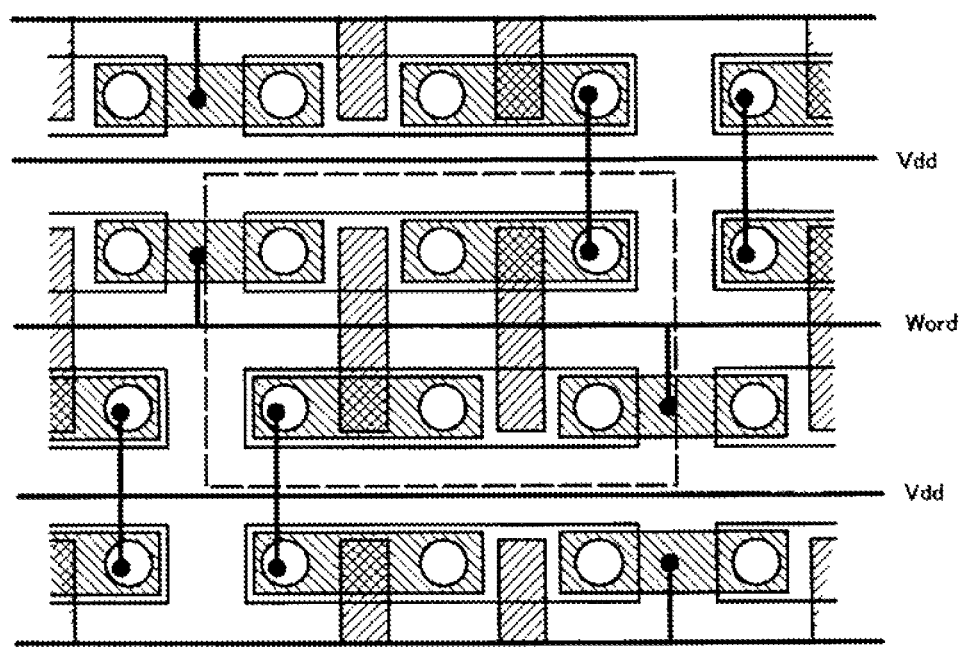
FIG. 26B shows a semiconductor device according to a ninth exemplary embodiment.

FIG. 26 shows a semiconductor device in which a plurality of the memory cells of FIG. 24 are arranged in an array shape and power line Vdd, ground line Gnd, first and second bit lines BL1, BL2 and word line Word are connected. FIG. 26A shows the bit lines and ground line Gnd, and FIG. 26B shows the word line and power line Vdd. In FIG. 26, the rectangular dashed line indicates a memory cell. In the meantime, the horizontal arrangement of memory cells is mirror-image symmetrical about a boundary of the memory cells, like FIG. 7. Thereby, the connection portion of the word line and the gate electrode of the access transistor is shared between the adjacent cells, so that it is possible to increase a degree of integration. In the meantime, although the vertical arrangement of memory cells is also mirror-image symmetrical in FIG. 26, it may be also possible that the unit cells are vertically arranged in a translational symmetry manner.

In this exemplary embodiment, it is possible to realize an ultra-fine memory cell in which a horizontal width of the cell is about 6F, a vertical width is about 4F and an area is about $24F^2$. Additionally, in this exemplary embodiment, it is possible to easily manufacture the memory cells of high density having high regularity of planar arrangement. In other words, as illustrated in FIG. 26, the vertical transistors can be arranged vertically and horizontally at a complete equal distance. Meanwhile, in the specification, a distance between transistors is defined as a distance between the centers of gravity of the semiconductor regions when seeing the vertical transistors in a direction toward the upper conductive region from the lower conductive region. In addition, the gate electrode and the wiring may be simply formed into a rectangular shape. In addition, the metal wirings may be also arranged vertically and horizontally at an equal distance.

Tenth Exemplary Embodiment

Figure 27:
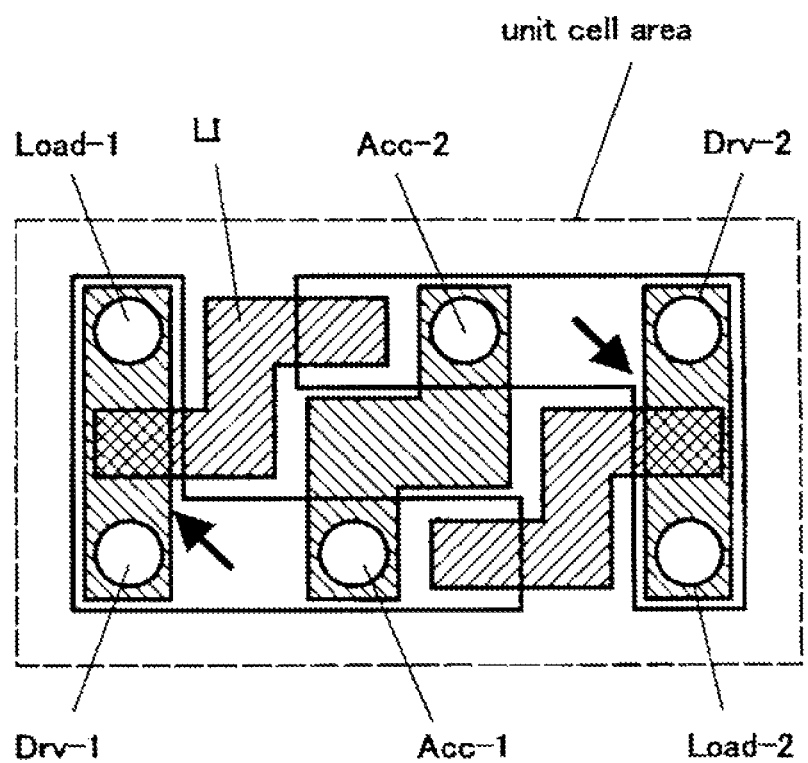
FIG. 27 shows a semiconductor device according to a tenth exemplary embodiment.

FIG. 27 shows another exemplary embodiment of a memory cell. This exemplary embodiment relates to a memory cell including a lower conductive region in a semiconductor thin film formed on an insulator. According to this exemplary embodiment, it is possible to realize a memory cell in which a horizontal width of the cell is about 7F, a vertical width is about 4F and an area is about $28F^2$.

Figure 28A:
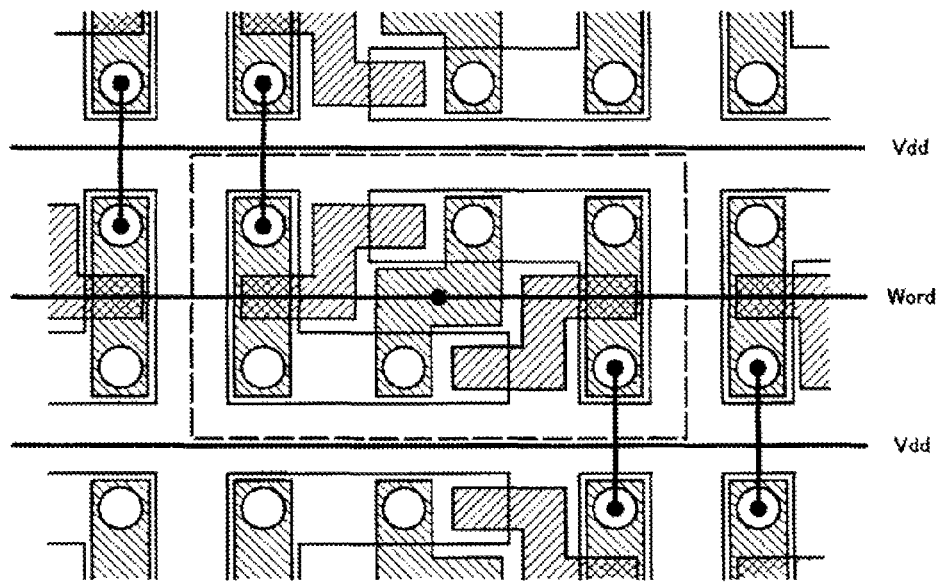
FIG. 28A shows a semiconductor device according to a tenth exemplary embodiment.
Figure 28B:
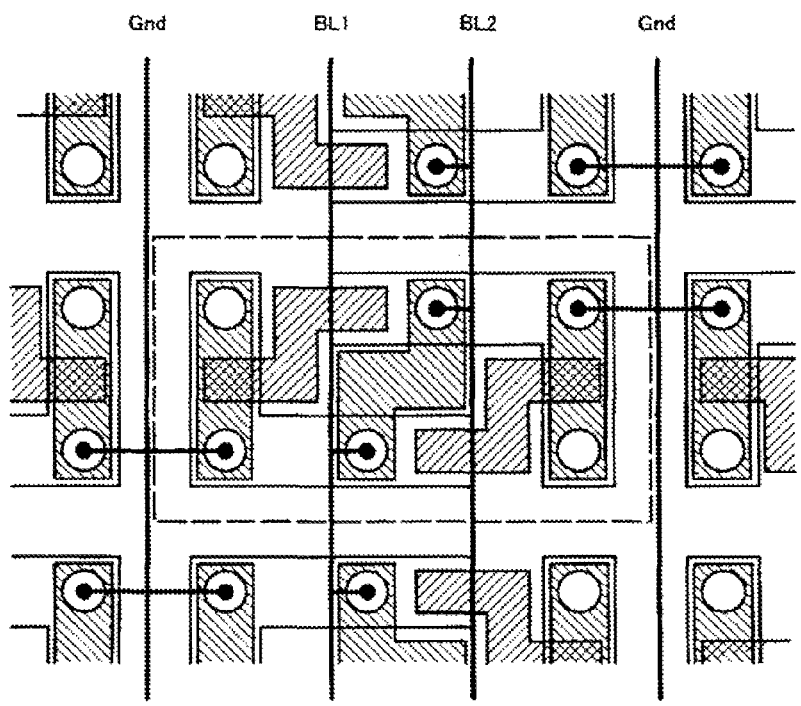
FIG. 28B shows a semiconductor device according to a tenth exemplary embodiment.
Figure 29A:
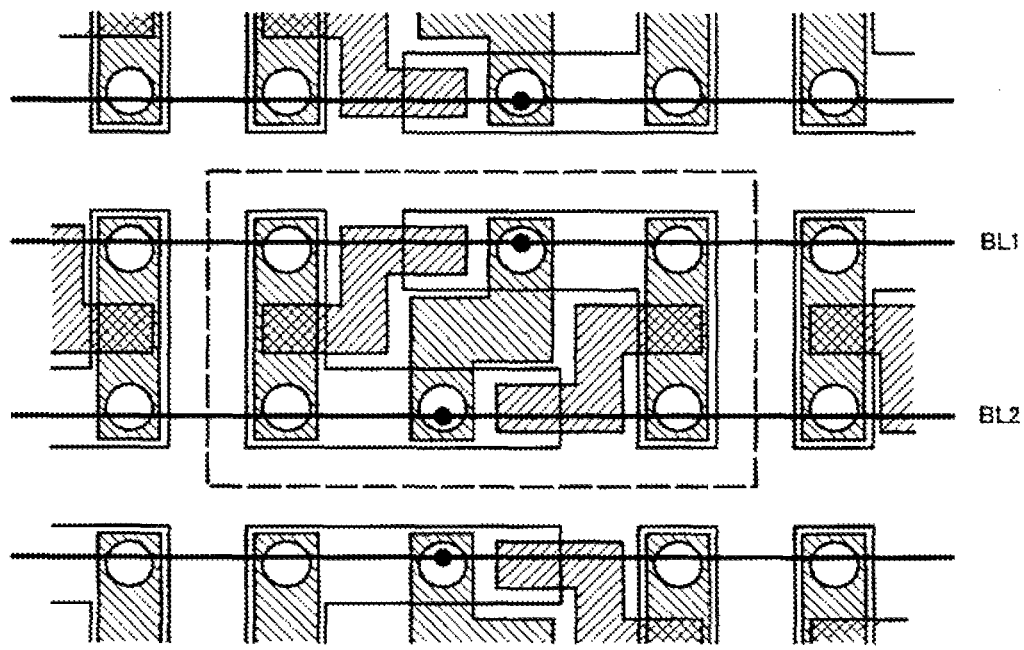
FIG. 29A shows a semiconductor device according to a tenth exemplary embodiment.
Figure 29B:
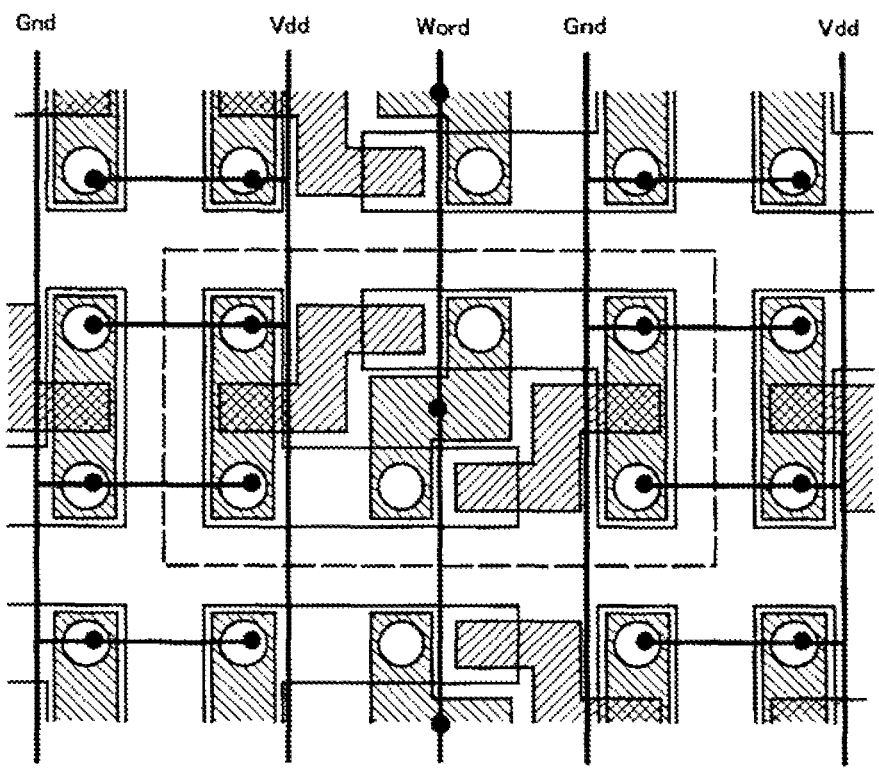
FIG. 29B shows a semiconductor device according to a tenth exemplary embodiment.

FIGS. 28 and 29 show a semiconductor device in which a plurality of the memory cells of FIG. 27 are arranged in an array shape and power line Vdd, ground line Gnd, first and second bit lines BL1, BL2 and word line Word are connected. FIG. 28A shows the word line and power lines Vdd, and FIG. 28B shows the bit lines and ground lines Gnd. In addition, FIG. 29A shows the bit lines, and FIG. 29B shows the word line and wirings (Vdd, Gnd). In the semiconductor device of FIG. 28, the word line is formed in a horizontal direction and the bit lines are formed in a vertical direction. On the contrary, in the semiconductor device of FIG. 29, the bit lines are formed in a horizontal direction and the word line is formed in a vertical direction. Like this, in this exemplary embodiment, there is an advantage that it is possible to appropriately select the extension directions of the word and bit lines. Meanwhile, although it is not impossible to change the extension directions of the word and bit lines in another exemplary embodiment, the formation of wirings may be unnatural due to the restriction on arrangement if the extension directions of the word and bit lines are changed.

Figure 30A:
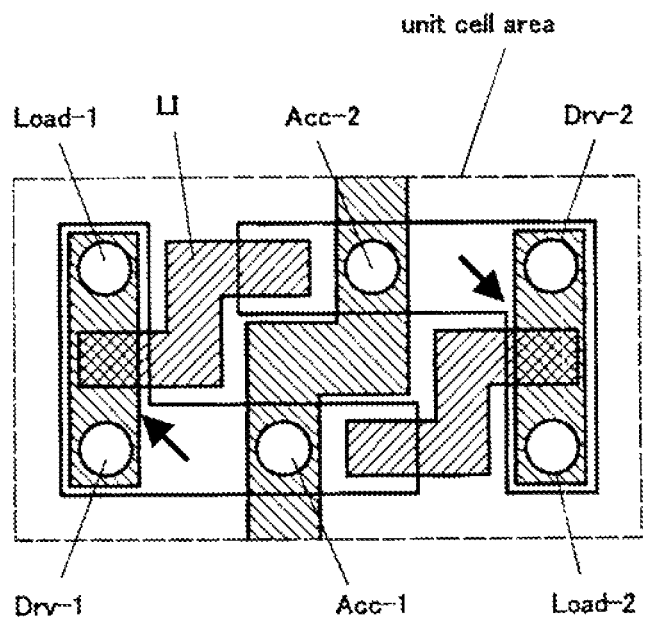
FIG. 30A shows a modified exemplary embodiment of a semiconductor device according to a tenth exemplary embodiment.
Figure 30B:
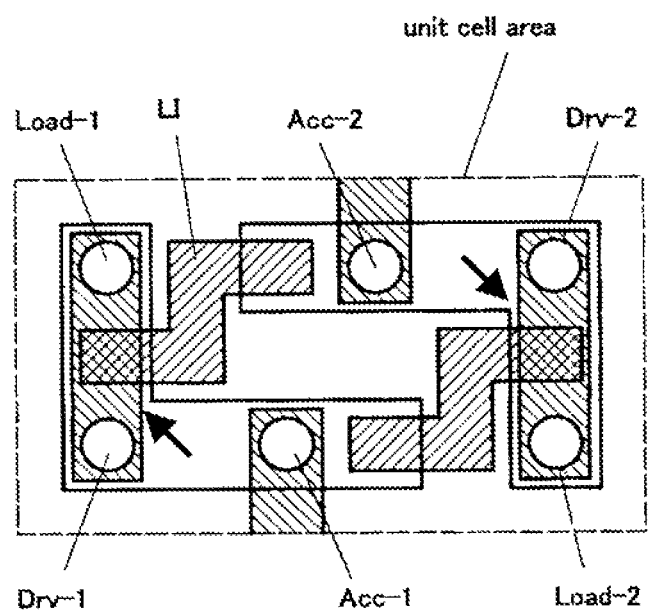
FIG. 30B shows a modified exemplary embodiment of a semiconductor device according to a tenth exemplary embodiment.

In the meantime, when the word line is formed in a vertical direction in this exemplary embodiment, it may be possible that the gate electrode structure is formed into a vertically continuing pattern as illustrated in. FIG. 30A, instead of FIG. 27. However, in this case, the vertical arrangement of the memory cells should be mirror-image symmetrical so that the gate electrode is formed into a continuous pattern, as illustrated in FIG. 29. In addition, as illustrated in FIG. 30B, it may be possible that the gate electrode is divided in a memory cell and the divided gate electrodes are connected by the upper word line.

Eleventh Exemplary Embodiment

Figure 31:
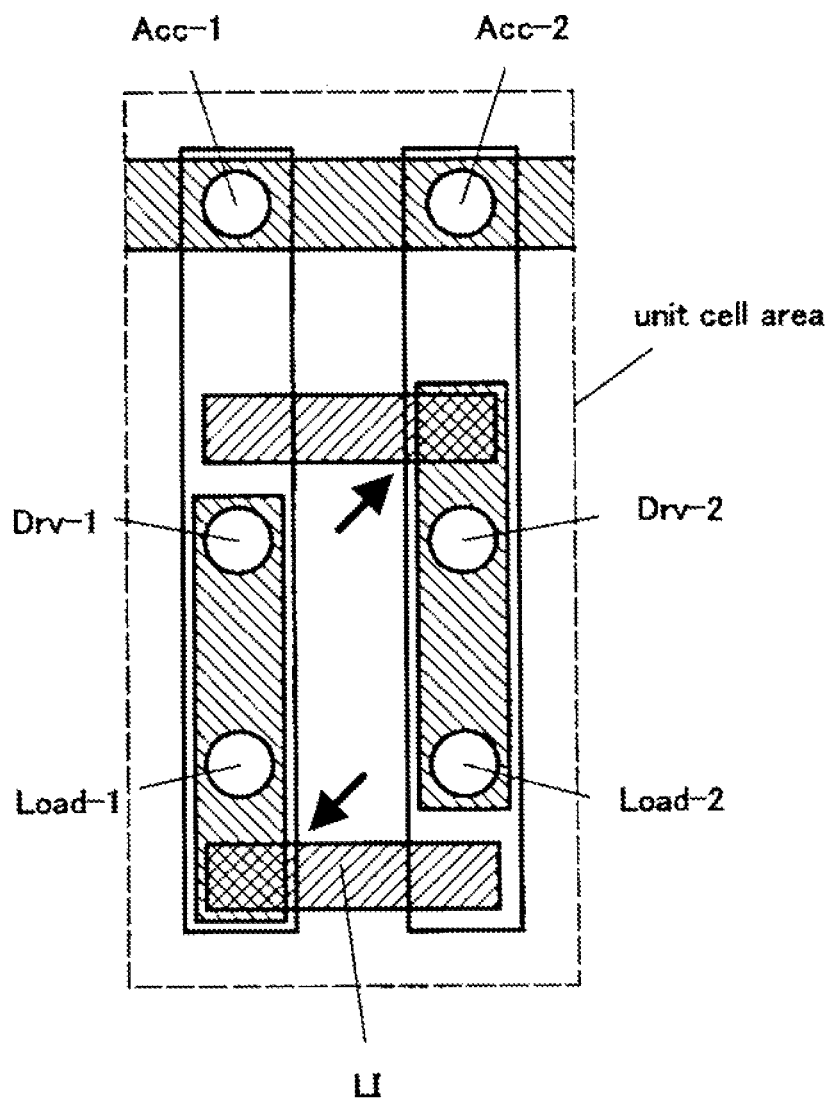
FIG. 31 shows a semiconductor device according to an eleventh exemplary embodiment.

FIG. 31 shows another exemplary embodiment of a memory cell. This exemplary embodiment relates to a memory cell including a lower conductive region in a semiconductor thin film formed on an insulator. According to this exemplary embodiment, it is possible to realize a memory cell in which a horizontal width of the cell is about 4F, a vertical width is about 8F and an area is about $32F^2$.

Figure 32A:
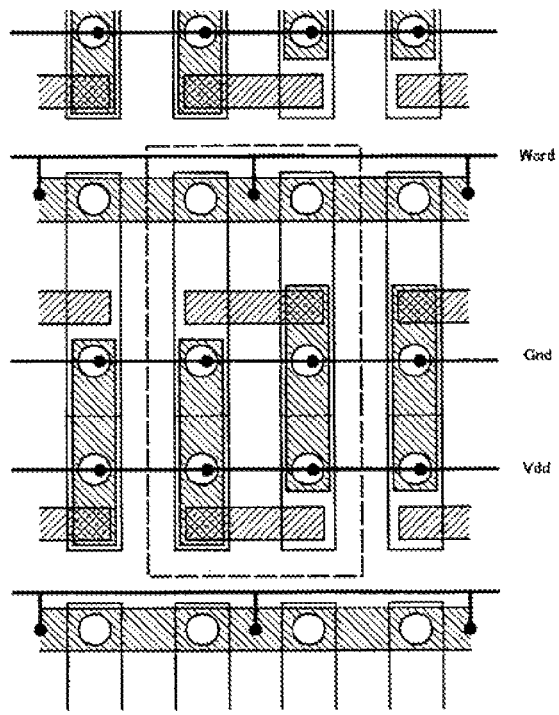
FIG. 32A shows a semiconductor device according to an eleventh exemplary embodiment.
Figure 32B:
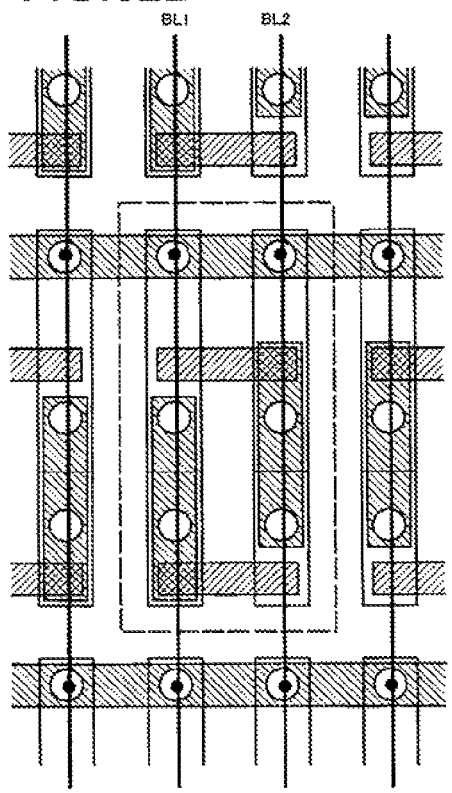
FIG. 32B shows a semiconductor device according to an eleventh exemplary embodiment.

FIG. 32 show an exemplary embodiment of semiconductor device in which a plurality of the cells of FIG. 31 are arranged in an array shape and power line Vdd, ground line Gnd, first and second bit lines BL1, BL2 and word line Word are electrically connected. FIG. 32A shows the word line and wirings (Vdd, Gnd), and FIG. 32B shows the bit lines. Meanwhile, in FIG. 32, the cells are horizontally arranged in a mirror-image symmetry manner about a boundary of the unit cells and the cells are vertically arranged in a translational symmetry manner. However, it may be also possible that the cells are horizontally and vertically arranged in any one of the mirror-image and translational symmetry manners.

Twelfth Exemplary Embodiment

Figure 33:
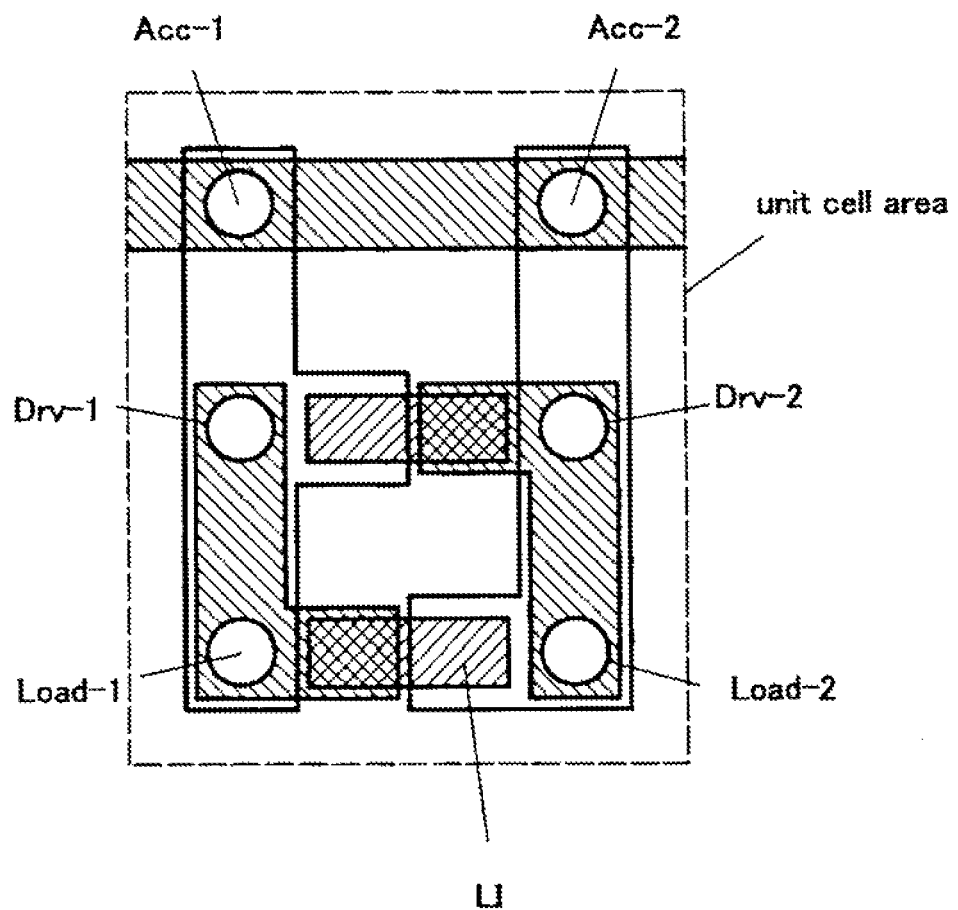
FIG. 33 shows a semiconductor device according to a twelfth exemplary embodiment.

FIG. 33 shows another exemplary embodiment of a memory cell. This exemplary embodiment relates to a memory cell including a lower conductive region in a semiconductor thin film formed on an insulator. In this exemplary embodiment, the gate electrode of one inverter and the base of the lower conductive region of the other inverter are protruded to be opposed to each other in a horizontal direction and are apt to be electrically connected.

According to this exemplary embodiment, it is possible to realize a memory cell in which a horizontal width of the cell is about 5F, a vertical width is about 6F and an area is about $30F^2$. Meanwhile, in the semiconductor device in which a plurality of the cells are arranged in an array shape, the connection method of power line Vdd, ground line Gnd, first and second bit lines BL1, BL2 and word line Word may be same as that of the eleventh exemplary embodiment.

As described above, in the tenth to twelfth exemplary embodiments, it is possible to continuously form the gate electrode of the access transistor stepping over the adjacent cells. Thereby, it is possible to omit a structure for providing a separate word line wiring above the gate electrode by using the gate electrode itself of the access transistor as a wiring of word line. Alternatively, it is possible to provide a contact of the word line wiring and the gate electrode of the access transistor for a plurality of cells, not each cell, without omitting the word line wiring above the gate electrode, thereby reducing the number of contacts.

Figure 34:
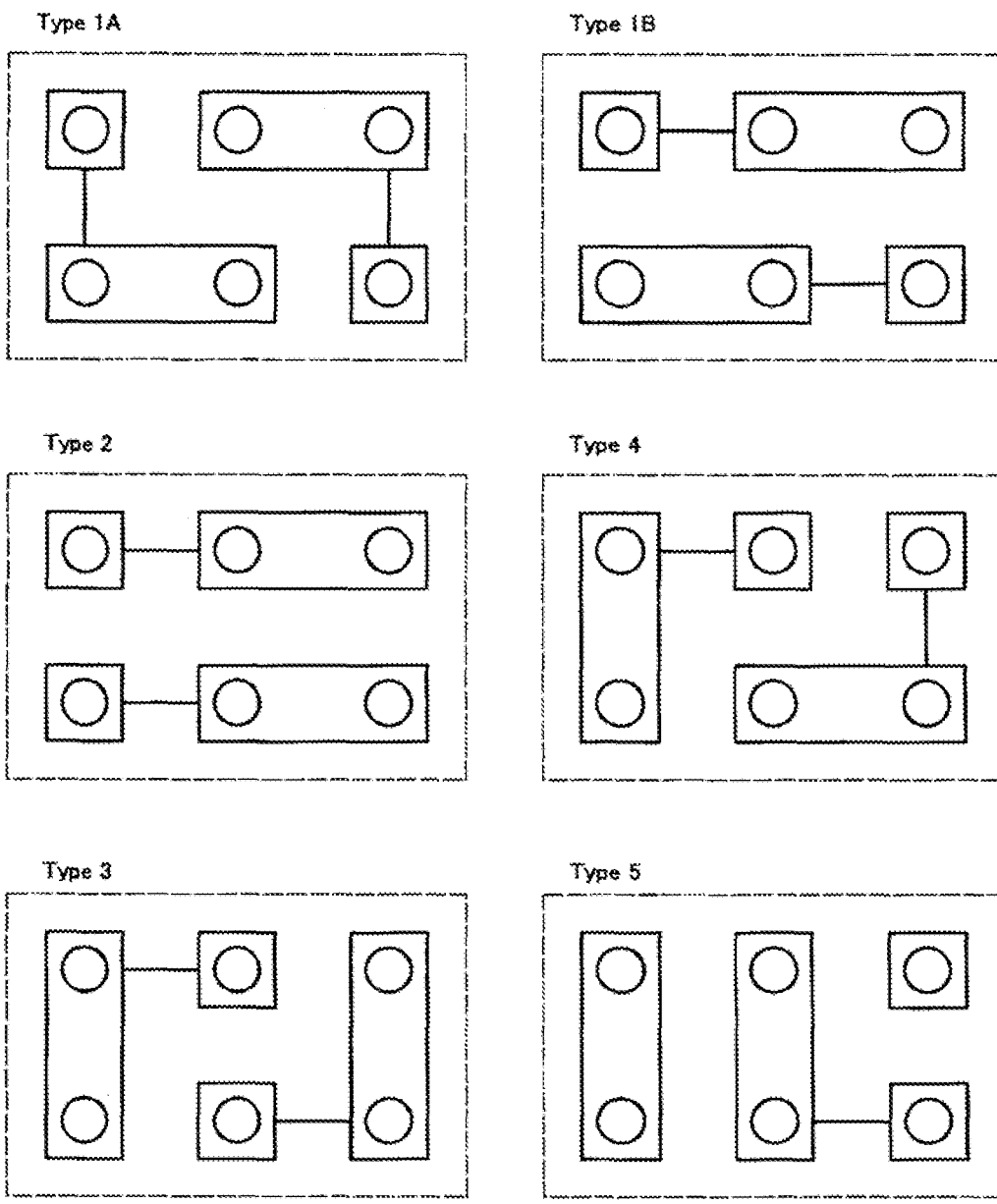
FIG. 34 illustrates an arrangement of transistors according to the seventh to twelfth exemplary embodiments.

FIG. 34 shows a view for summarizing the memory cells of the seventh to twelfth exemplary embodiments. In FIG. 34, a circle indicates a position of a vertical transistor. A rectangular shape including the two circles indicates an inverter including a driver transistor and a load transistor. In addition, a square including one circle indicates an access transistor.

Furthermore, in FIG. 34, the solid line connecting the quadrangles (connection line) symbolically indicates that the connected quadrangles belong to a same accumulation node (first or second accumulation node).

A method for densely arranging the vertical transistors in a rectangular region includes five types of type 1 to type 5, as illustrated in FIG. 34, except for an equivalent arrangement due to the symmetry. Herein, Type 1 includes two arrangements (Type 1A, Type 1B) according to connection methods of the connection lines. In the specification, the specific exemplary embodiments have been described with regard to the four arrangements of Type 1A, Type 1B, Type 2 and Type 3 having relatively high practicality, among these two arrangements. In other words, the seventh and eighth exemplary embodiments relate to Type 1A, the ninth exemplary embodiment relates to Type 1B, the tenth exemplary embodiment relates to Type 3 and the eleventh and twelfth exemplary embodiments relate to Type 2.

Additionally, in the drawings following FIG. 24, a boundary of the lower conductive region of the n-type transistor and the lower conductive region of the p-type transistor is not explicitly shown. However, even in the drawings following FIG. 24, it is assumed that a p/n boundary exists between the lower conductive regions of the transistors of different types.

For a case where a base is formed on a bulk semiconductor substrate, there is a restraint on a positional relation between the n-type transistor and the p-type transistor. The reason is as follows: although the bases of the n-type transistors and the p-type transistors are insulated through the wells, the wells should be formed into a continuous pattern in arranging the memory cells so that a constant potential is applied to the wells from the outside. For example, in the seventh exemplary embodiment shown in FIG. 14, the n-wells and p-wells occupy a vertically continuous band-shape region and the well potential can be applied at the peripheral portions of the arranged cells. In order to achieve the same arrangement when the access transistor is comprised of the p-type transistor, it is preferable to mutually change the positions of the driver transistor and the load transistor. When a base is formed on an insulator, a degree of freedom for the positional relationship of the n-type transistor and the p-type transistor is increased. In other words, it is possible to appropriately change the positions of the driver transistor and the load transistor. In addition, when the first and second access transistors are comprised of p-type transistors, it is not always necessary to correspondingly change the positions of the driver transistor and the load transistor. However, in some arrangement methods, it is difficult to form the local wiring stepping over the lower conductive region of the n-type transistor and the lower conductive region of the p-type transistor. In this case, it is preferable to constitute the lower conductive regions with metals or with salicide structures.

Additionally, in the exemplary embodiments after the eighth exemplary embodiment using the substrate including the lower conductive regions in the semiconductor thin film on the insulator, the lower conductive regions of the n-type and p-type transistors, which are adjacent to each other, can be electrically connected automatically by using the salicide structure or constituting the lower conductive regions with metal materials. In this case, it is possible to appropriately change the positions of the first driver transistor and the first load transistor or the positions of the second driver transistor and the second load transistor without causing a trouble to the arrangement of the upper layer wirings. However, in this case, upper layer wirings Vdd, Gnd should be changed. For example, in FIG. 24A, it may be possible to mutually change the positions of the first driver transistor and the first load transistor and the positions of the second driver transistor and the second load transistor. Furthermore, in FIG. 26, it may be possible to mutually change the positions of the Vdd and Gnd wirings.

In the above descriptions, the driver transistor has been comprised of the n-type transistor and the load transistor has been comprised of the p-type transistor. However, the types of the driver transistor and the load transistor are not limited thereto. For example, it may be also possible that the driver transistor is comprised of the p-type transistor and the load transistor is comprised of the n-type transistor. The mutual change of the n-type and the p-type is totally equivalent to the mutual change of the positions of the driver transistor and the load transistor in the above descriptions. Therefore, the generality of the descriptions is not lost even when the driver transistor and the load transistor are limited to the n-type and the p-type, respectively.

Additionally, in the seventh to twelfth exemplary embodiments; for convenience' sake, the first n-type transistor has been regarded as the first transistor and the first p-type transistor has been regarded as the third transistor. However, the first and third transistors are not limited to the n-type and p-type transistors, respectively. For example, the first n-type transistor may be the third transistor and the first p-type transistor may be the first transistor.

Likewise, the second and fourth transistors are not limited to the n-type and p-type transistors, respectively. For example, the second n-type transistor may be the fourth transistor and the second p-type transistor may be the second transistor.

Meanwhile, in FIGS. 14, 26, 28, 29 and 32, at least the wiring extending in the horizontal direction and the wiring extending in the vertical direction should be formed in separate layers by separate processes so that they are not short-circuited. In addition, it may be possible to appropriately form the wirings among themselves extending in the horizontal direction and the wirings among themselves extending in the vertical direction by separate processes. For example, in FIG. 14A, it may be possible to form ground line Gnd and word line Word by separate processes. Thereby, it is possible to make the wirings formed by separate processes close to each other, compared to the minimum pitch limited by the resolution of the lithography technique, so that it is possible to increase the density of the wirings.

In the first to twelfth exemplary embodiments, the sectional structure of the vertical transistor is circular when seen from the upper side. However, the sectional structure is not limited to the circle shape. For example, the sectional structure may be changed to elliptical shape, rectangular shape and the like.

In the first to twelfth exemplary embodiments, the least size of each part is determined with following limitations. In other words, the least size of each element of the base, the gate electrode, the wiring, the transistor and the like is about F or greater when seen from the upper side. In addition, the least interval of the bases, the gate electrodes, the wirings and the transistors among themselves is about F or greater when seen from the upper side. In order to secure the electrical connection of the elements, an overlapping of about F or greater is provided. By the cell structure satisfying the limitations, it is possible to actually manufacture a cell using a manufacturing apparatus having an ability of the minimum line width F.

In addition, the semiconductor device of the invention can be mounted on a variety of integrated circuits, and can be particularly used as a SRAM.

This application is the National Phase of PCT/JP2009/056331, filed Mar. 27, 2009, which is based upon and claims the benefit of priority from Japanese Patent Application No. 2008-107011 filed on Apr. 16, 2008, the disclosures of which is incorporated herein in its entirety by reference.

The invention claimed is:

1. A semiconductor device comprising at least a first transistor, a second transistor and a first local wiring,
wherein each of the first and second transistors comprises:
a pillar made of semiconductor protruding from a surface of a base;
a lower conductive region being one of a source and a drain provided in the base;
an upper conductive region being the other of the source and the drain provided in an upper portion of the pillar;
a gate electrode provided on a side surface of the pillar; and
a gate insulating film interposed between the gate electrode and the pillar,
wherein the first local wiring comprises:
a convex portion protruding from the surface of the base; and
a protrusion protruding from a side surface of the convex portion,
wherein the convex portion of the first local wiring is connected to the lower conductive region of the first transistor,
the protrusion of the first local wiring is connected to the gate electrode of the second transistor, and
a lower surface of the protrusion of the first local wiring is arranged at a height equal to or lower than an upper surface of the gate electrode of the second transistor.

2. The semiconductor device according to claim 1,
wherein the first local wiring is connected to the gate electrode of the second transistor above the base of the second transistor, and
the first local wiring is spaced and insulated from the base of the second transistor.

3. The semiconductor device according to claim 1,
wherein the semiconductor device further comprises at least a third transistor and a fourth transistor,
each of the third and fourth transistors comprises:
a pillar made of semiconductor protruding from the surface of the base;
a lower conductive region being one of a source and a drain provided in the base;
an upper conductive region being the other of the source and the drain provided in an upper portion of the pillar;
a gate electrode provided on a side surface of the pillar; and
a gate insulating film interposed between the gate electrode and the pillar,
wherein the semiconductor device comprises:
a first connection gate electrode in which the gate electrode of the first transistor and the gate electrode of the third transistor are connected, and
a second connection gate electrode in which the gate electrode of the second transistor and the gate electrode of the fourth transistor are connected,
wherein the lower surface of the protrusion of the first local wiring is arranged at a height equal to or lower than an upper surface of the second connection gate electrode,
the convex portion of the first local wiring is connected to the lower conductive region of the first transistor and the lower conductive region of the third transistor,
the lower conductive region of the second transistor and the lower conductive region of the fourth transistor are electrically connected, the first transistor is one of a first n-type transistor and a first p-type transistor, and the third transistor is the other of the first n-type transistor and the first p-type transistor, and the second transistor is one of a second n-type transistor and a second p-type transistor, and the fourth transistor is the other of the second n-type transistor and the second p-type transistor.

4. The semiconductor device according to claim 3, wherein the first n-type transistor, the first p-type transistor, the second n-type transistor and the second p-type transistor are arranged so that a direction toward the first p-type transistor from the first n-type transistor is parallel with a direction toward the second p-type transistor from the second n-type transistor.

5. The semiconductor device according to claim 3, wherein the semiconductor device comprises:
a first connection base in which the base of the first n-type transistor and the base of the first p-type transistor are integrally formed, and
a second connection base in which the base of the second n-type transistor and the base of the second p-type transistor are integrally formed,
wherein the first connection gate electrode is provided above the first connection base, and
the second connection gate electrode is provided above the second connection base.

6. The semiconductor device according to claim 5, wherein the first connection base comprises a first base extension portion that extends in a direction from one of the first n-type transistor and the first p-type transistor toward the other of the first n-type transistor and the first p-type transistor, and
the convex portion of the first local wiring is connected to the first base extension portion.

7. The semiconductor device according to claim 6, wherein the protrusion of the first local wiring is connected to the second connection gate electrode between the pillar of the second n-type transistor and the pillar of the second p-type transistor, and
the first local wiring is spaced and insulated from the second connection base.

8. The semiconductor device according to claim 7, wherein the semiconductor device further comprises at least a fifth transistor, a sixth transistor and a second local wiring,
each of the fifth and sixth transistors comprises:
a pillar made of semiconductor protruding from the surface of the base;
a lower conductive region being one of a source and a drain provided in the base;
an upper conductive region being the other of the source and the drain provided in an upper portion of the pillar,
a gate electrode provided on a side surface of the pillar; and
a gate insulating film interposed between the gate electrode and the pillar,
wherein the second local wiring comprises:
a convex portion protruding from the surface of the base; and
a protrusion protruding from a side surface of the convex portion,
wherein the semiconductor device comprises:
a third connection gate electrode in which the gate electrode of the fifth transistor and the gate electrode of the sixth transistor are connected, and a third connection base in which the base of the fifth transistor and the base of the sixth transistor are integrally formed,
wherein the protrusion of the second local wiring is connected to the third connection gate electrode between the pillar of the fifth transistor and the pillar of the sixth transistor,
a lower surface of the protrusion of the second local wiring is arranged at a height equal to or lower than an upper surface of the third connection gate electrode,
the second local wiring is spaced and insulated from the third connection base,
the second connection base comprises a second base extension portion that extends in a direction opposite to an extension direction of the first connection base,
the convex portion of the second local wiring is connected to the lower conductive region of the second n-type transistor and the lower conductive region of the second p-type transistor,
the convex portion of the second local wiring is connected to the second base extension portion,
the lower conductive region of the fifth transistor and the lower conductive region of the sixth transistor are electrically connected, and
the fifth transistor is one of a third n-type transistor and a third p-type transistor, and the sixth transistor is the other of the third n-type transistor and the third p-type transistor.

9. The semiconductor device according to claim 5, wherein the second connection gate electrode includes a first gate extension portion that extends in a connection direction thereof, and
the protrusion of the first local wiring is connected to the first gate extension portion.

10. The semiconductor device according to claim 9, wherein the protrusion of the first local wiring is connected to the first gate extension portion above the second connection base, and
the first local wiring is spaced and insulated from the second connection base.

11. The semiconductor device according to claim 5, wherein the first connection base comprises a first conductive type semiconductor region and a second conductive type semiconductor region that makes a junction with the first conductive type semiconductor region,
the pillar of the first n-type transistor is formed on the first conductive type semiconductor region of the first connection base,
the pillar of the first p-type transistor is formed on the second conductive type semiconductor region of the first connection base,
a metal containing conductive layer is provided on a region including a boundary between the first conductive type semiconductor region and the second conductive type semiconductor region of the first connection base,
wherein the second connection base comprises a first conductive type semiconductor region and a second conductive type semiconductor region that makes a junction with the first conductive type semiconductor region,
the pillar of the second n-type transistor is formed on the first conductive type semiconductor region of the second connection base,
the pillar of the second p-type transistor is formed on the second conductive type semiconductor region of the second connection base, and
a metal containing conductive layer is provided on a region including a boundary between the first conductive type semiconductor region and the second conductive type semiconductor region of the second connection base.

12. The semiconductor device according to claim 3, wherein the semiconductor device comprises a static random access memory cell,
the static random access memory cell comprises at least:
the first n-type transistor and the first p-type transistor;
the second n-type transistor and the second p-type transistor;
a first access transistor and a second access transistor; and
a third local wiring,
wherein each of the first and second access transistors comprises:
a pillar made of semiconductor protruding from the surface of the base;
a lower conductive region being one of a source and a drain provided in the base;
an upper conductive region being the other of the source and the drain provided in an upper portion of the pillar;
a gate electrode provided on a side surface of the pillar; and
a gate insulating film interposed between the gate electrode and the pillar,
wherein the third local wiring comprises:
a convex portion protruding from the surface of the base; and
a protrusion protruding from a side surface of the convex portion,
wherein the convex portion of the first local wiring is connected to the lower conductive region of the first n-type transistor, the lower conductive region of the first p-type transistor and the lower conductive region of the first access transistor,
the protrusion of the first local wiring is connected to the second connection gate electrode,
the lower surface of the protrusion of the first local wiring is arranged at a height equal to or lower than the upper surface of the second connection gate electrode,
the convex portion of the third local wiring is connected to the lower conductive region of the second n-type transistor, the lower conductive region of the second p-type transistor and the lower conductive region of the second access transistor,
the protrusion of the third local wiring is connected to the first connection gate electrode, and
a lower surface of the protrusion of the third local wiring is arranged at a height equal to or lower than an upper surface of the first connection gate electrode.

13. The semiconductor device according to claim 12, wherein the semiconductor device comprises:
a first connection base in which the base of the first n-type transistor and the base of the first p-type transistor are integrally formed; and
a second connection base in which the base of the second n-type transistor and the base of the second p-type transistor are integrally formed,
wherein the first connection gate electrode is provided above the first connection base,
the protrusion of the third local wiring is connected to the first connection gate electrode between the pillar of the first n-type transistor and the pillar of the first p-type transistor,
the third local wiring is spaced and insulated from the first connection base,
the second connection gate electrode is provided above the second connection base,
the protrusion of the first local wiring is connected to the second connection gate electrode between the pillar of the second n-type transistor and the pillar of the second p-type transistor, and
the first local wiring is spaced and insulated from the second connection base.

14. The semiconductor device according to claim 12, wherein the first connection base comprises a first conductive type semiconductor region and a second conductive type semiconductor region that makes a junction with the first conductive type semiconductor region,
the pillar of the first access transistor and the pillar of one transistor of the first n-type transistor and the first p-type transistor are provided on the first conductive type semiconductor region of the first connection base,
the pillar of the other transistor of the first n-type transistor and the first p-type transistor is provided on the second conductive type semiconductor region of the first connection base,
a metal containing conductive layer is provided on a region including a boundary between the first conductive type semiconductor region and the second conductive type semiconductor region of the first connection base,
wherein the second connection base comprises a first conductive type semiconductor region and a second conductive type semiconductor region that makes a junction with the first conductive type semiconductor region,
the pillar of the second access transistor and the pillar of one transistor of the second n-type transistor and the second p-type transistor are provided on the first conductive type semiconductor region of the second connection base,
the pillar of the other transistor of the second n-type transistor and the second p-type transistor is provided on the second conductive type semiconductor region of the second connection base, and
a metal containing conductive layer is provided on a region including a boundary between the first conductive type semiconductor region and the second conductive type semiconductor region of the second connection base.

15. A method for manufacturing a semiconductor device including at least a first transistor, a second transistor and a first local wiring, the method comprising:
(1) forming the first and second transistors, each of the first and second transistors comprising:
a pillar made of semiconductor protruding from a surface of a base;
a lower conductive region being one of a source and a drain provided in the base;
an upper conductive region being the other of the source and the drain provided in an upper portion of the pillar;
a gate electrode provided on a side surface of the pillar; and
a gate insulating film interposed between the gate electrode and the pillar; and
(2) forming a first local wiring comprising:
a convex portion protruding from the surface of the base; and
a protrusion protruding from a side surface of the convex portion,
wherein the convex portion is connected to the lower conductive region of the first transistor, the protrusion is connected to the gate electrode of the second transistor, and a lower surface of the protrusion is arranged at a height equal to or lower than an upper surface of the gate electrode of the second transistor.

16. The method for manufacturing a semiconductor device, according to claim 15,
wherein in the step (2),
the first local wiring is connected to the gate electrode of the second transistor above the base of the second transistor, and
the first local wiring is formed so that the first local wiring is spaced and insulated from the base of the second transistor.

17. The method for manufacturing a semiconductor device, according to claim 16, wherein the step (2) comprises:
forming an insulating film on a whole surface;
removing the insulating film on the first and second transistors until the gate electrode of the second transistor is exposed;
removing the insulating film on the lower conductive region of the first transistor until the lower conductive region of the first transistor is exposed, and
depositing metal material so that the lower conductive region of the first transistor and the gate electrode of the second transistor are electrically connected, to form the first local wiring.

18. The method for manufacturing a semiconductor device, according to claim 16,
wherein the step (2) comprises:
forming an insulating film on a whole surface;
removing the insulating film on the lower conductive region of the first transistor until the lower conductive region of the first transistor is exposed;
providing a mask on the exposed lower conductive region of the first transistor;
removing the insulating film on the first and second transistors and the mask until the gate electrode of the second transistor is exposed;
removing the remaining mask on the lower conductive region of the first transistor, to expose the lower conductive region of the first transistor; and
depositing metal material so that the lower conductive region of the first transistor and the gate electrode of the second transistor are electrically connected, to form the first local wiring.

* * * * *